United States Patent [19]
Takashima et al.

[11] Patent Number: 5,838,038
[45] Date of Patent: *Nov. 17, 1998

[54] DYNAMIC RANDOM ACCESS MEMORY DEVICE WITH THE COMBINED OPEN/ FOLDED BIT-LINE PAIR ARRANGEMENT

[75] Inventors: Daisaburo Takashima, Kawasaki; Shigeyoshi Watanabe, Yokohama; Tohru Ozaki, Tokyo; Takeshi Hamamoto, Kanagawa-ken; Yukihito Oowaki, Yokohama, all of Japan

[73] Assignee: Kabushiki Kaisha Toshiba, Kawasaki, Japan

[*] Notice: This patent issued on a continued prosecution application filed under 37 CFR 1.53(d), and is subject to the twenty year patent term provisions of 35 U.S.C. 154(a)(2).

The term of this patent shall not extend beyond the expiration date of Pat. No. 5,396,450.

[21] Appl. No.: 478,620

[22] Filed: Jun. 7, 1995

Related U.S. Application Data

[63] Continuation-in-part of Ser. No. 348,068, Nov. 23, 1994, Pat. No. 5,555,519, which is a continuation of Ser. No. 123,466, Sep. 20, 1993, Pat. No. 5,396,450.

[30] Foreign Application Priority Data

Sep. 22, 1992 [JP] Japan .................................. 4-253270
Sep. 14, 1993 [JP] Japan .................................. 5-229215
Jun. 28, 1994 [JP] Japan .................................. 6-146645

[51] Int. Cl.$^6$ ................................................ H01L 27/108
[52] U.S. Cl. ........................ 257/301; 257/296; 257/300; 365/149; 365/174
[58] Field of Search .................................. 257/302, 296, 257/299, 300, 301, 303, 306, 311; 365/149, 174

[56] References Cited

U.S. PATENT DOCUMENTS

| 4,864,375 | 9/1989 | Teng et al. | 357/23.6 |
| 5,025,294 | 6/1991 | Ema | 357/23.6 |
| 5,386,131 | 1/1995 | Sato | 257/301 |
| 5,396,450 | 3/1995 | Takashima et al. | 365/51 |

OTHER PUBLICATIONS

1993 Symposium on VLSI Circuits, Digest of Technical Papers, pp. 89–90, May 19–21, 1993, Daisaburo Takashima, et al., "Open/Folded Bit–line Arrangement for Ultra High–Density DRAMS".

*Primary Examiner*—Olik Chaudhuri
*Assistant Examiner*—Douglas A. Wille
*Attorney, Agent, or Firm*—Oblon, Spivak, McClelland, Maier & Neustadt, P.C.

[57] ABSTRACT

A semiconductor memory device includes active regions arranged on a semiconductor substrate such that those of the active regions which are adjacent in the word line direction deviate in the bit line direction, MOS transistors respectively formed in the active regions and each having a source and a drain one of which is connected to the bit line, a plurality of trenches each arranged to another set of source an drain regions and arranged to deviate in the word line direction in the respective active regions, those of the trenches which are adjacent with a through word line disposed therebetween being arranged to deviate in the bit line direction so as to be set closer to each other, a plurality of storage electrodes respectively formed in the trenches with capacitor insulative films disposed therebetween, and connection electrodes arranged between the word lines and each connecting the other of the source and drain to the storage electrode.

14 Claims, 31 Drawing Sheets

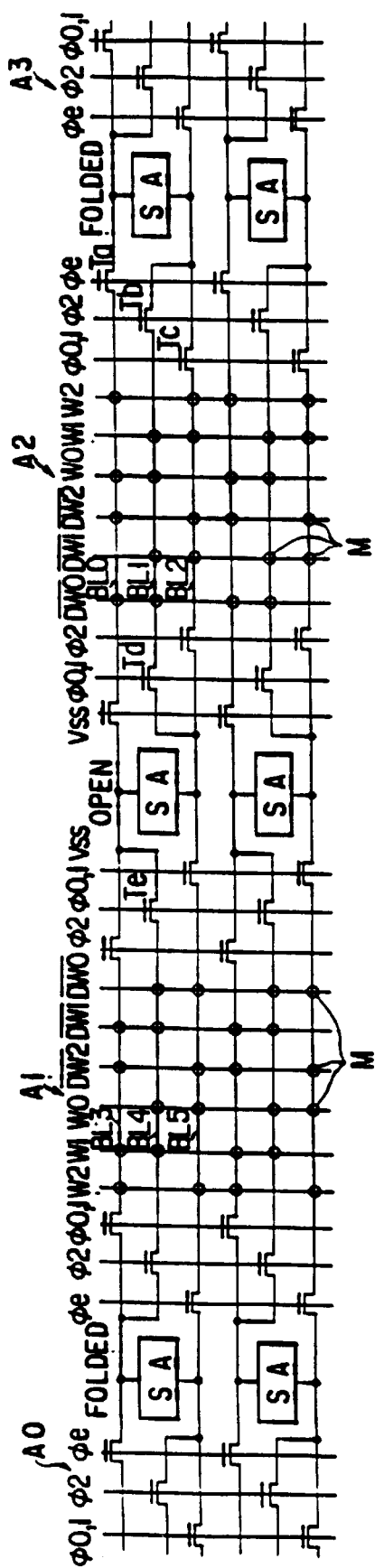
F I G. 1
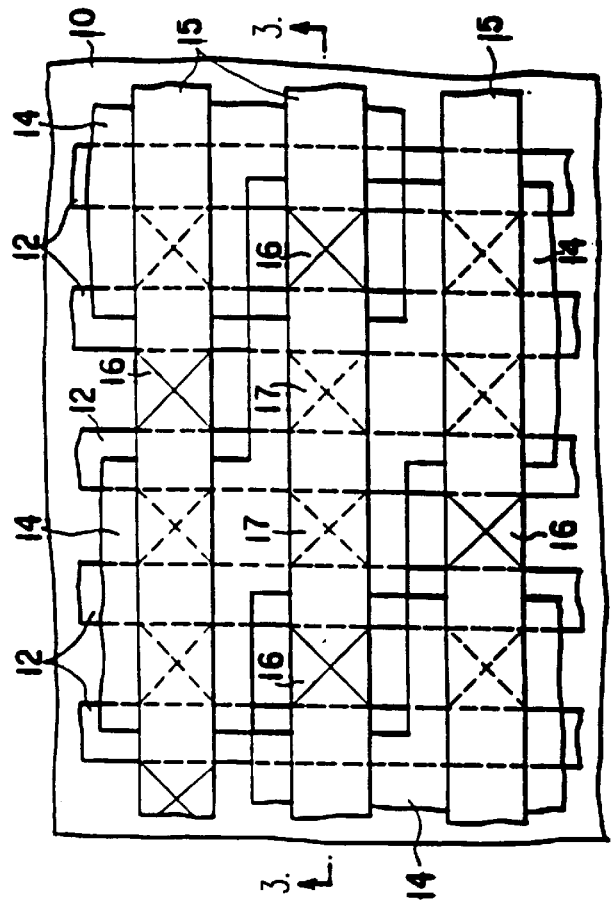
F I G. 2

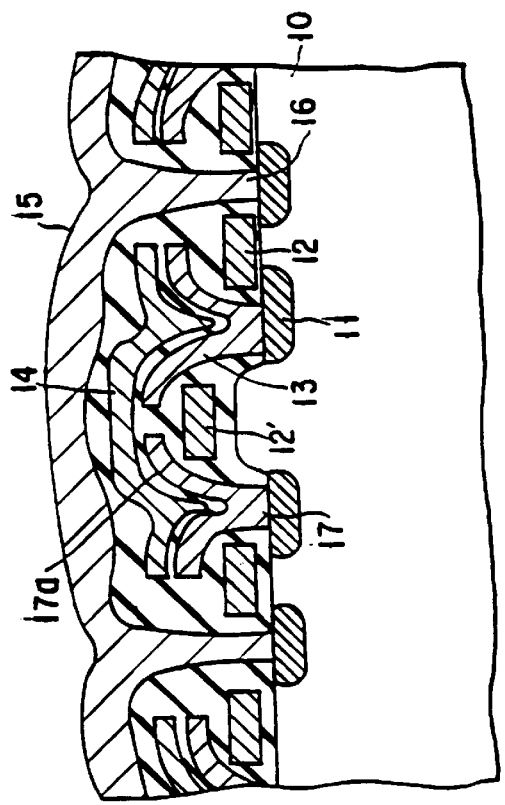
F I G. 3
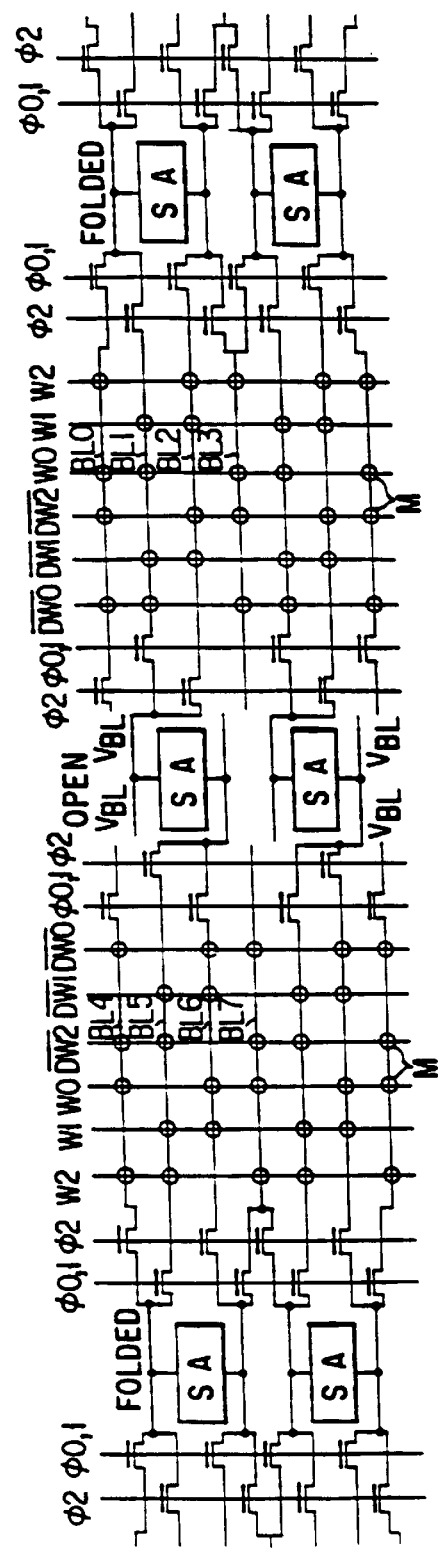
F I G. 4

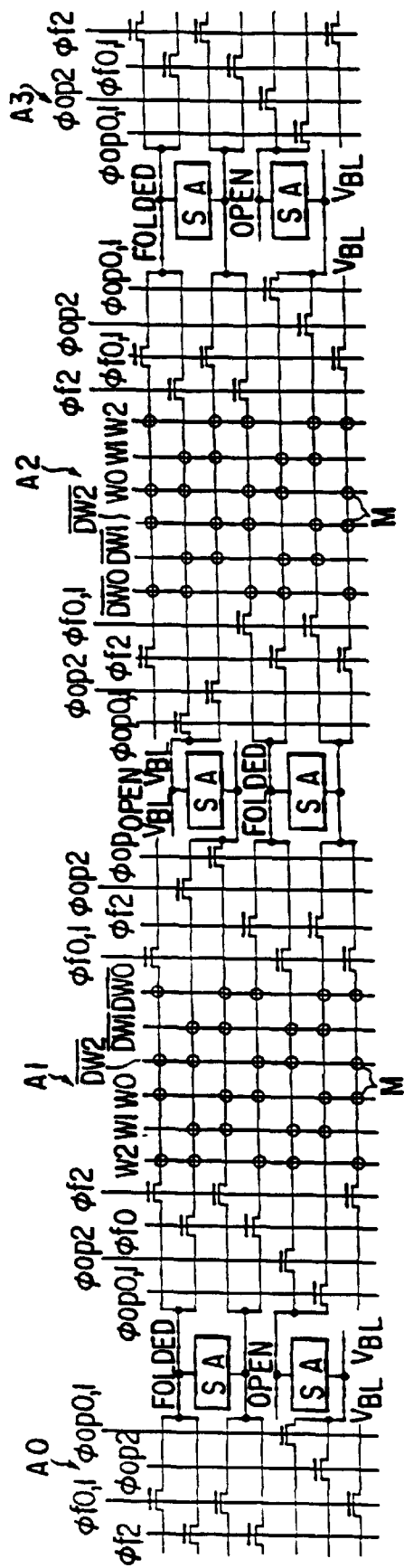
F I G. 5
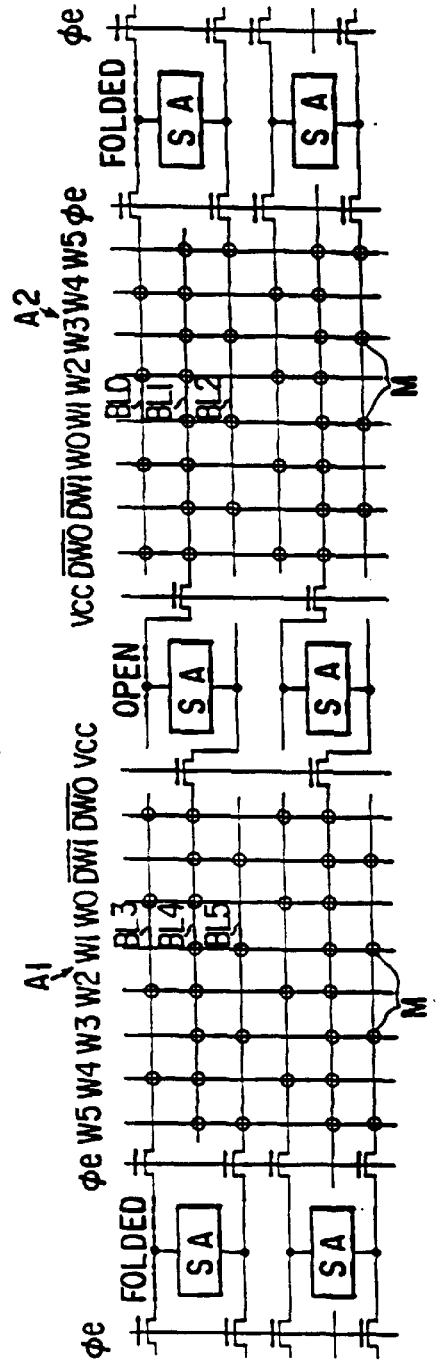
F I G. 6

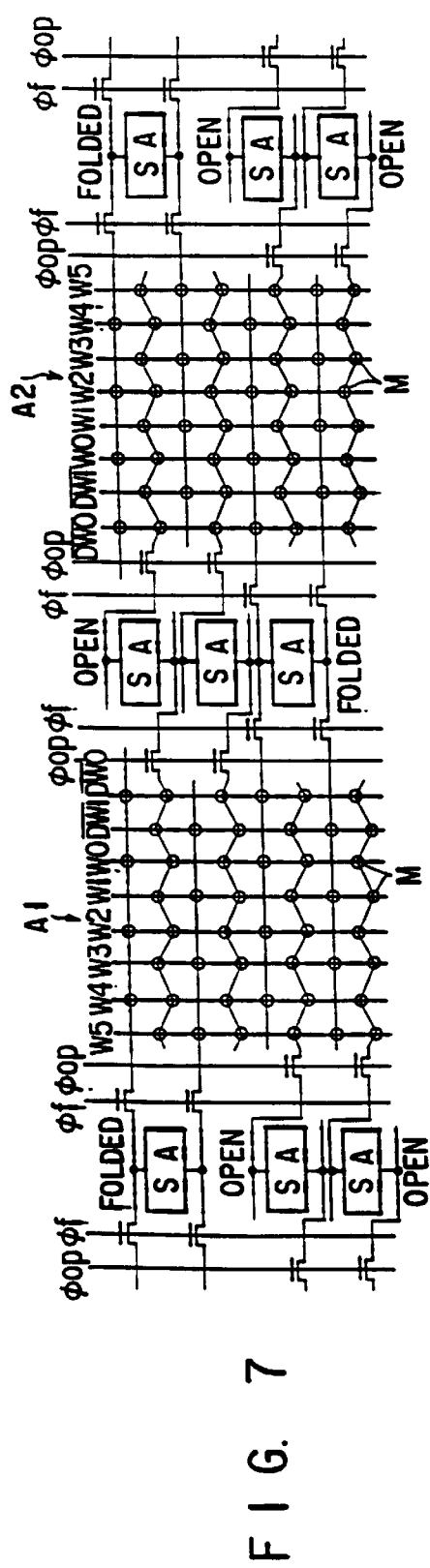
FIG. 7
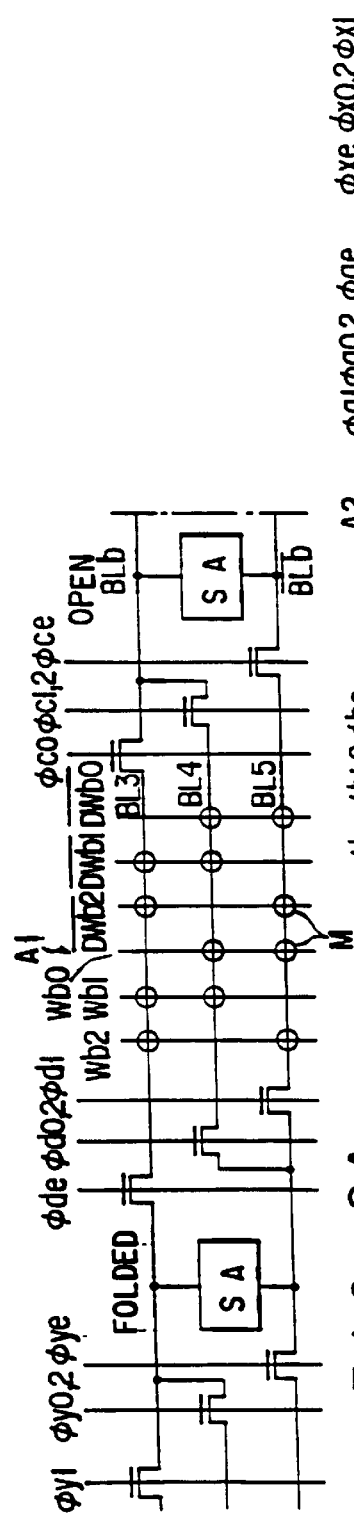
FIG. 8A
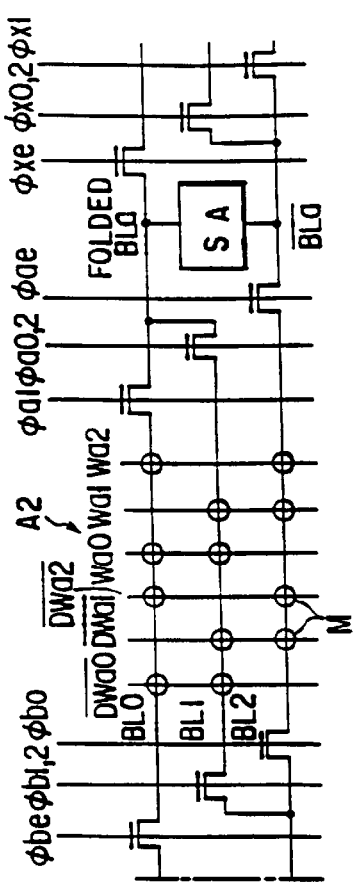
FIG. 8B
| FIG. 8A | FIG. 8B |
FIG. 8

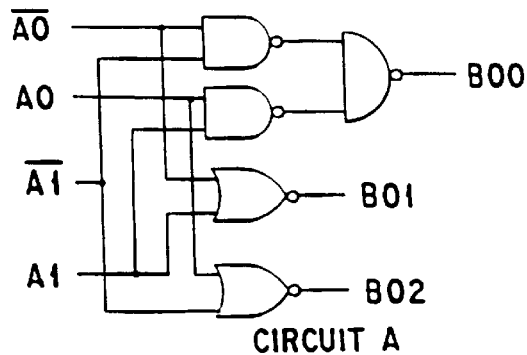
F I G. 11
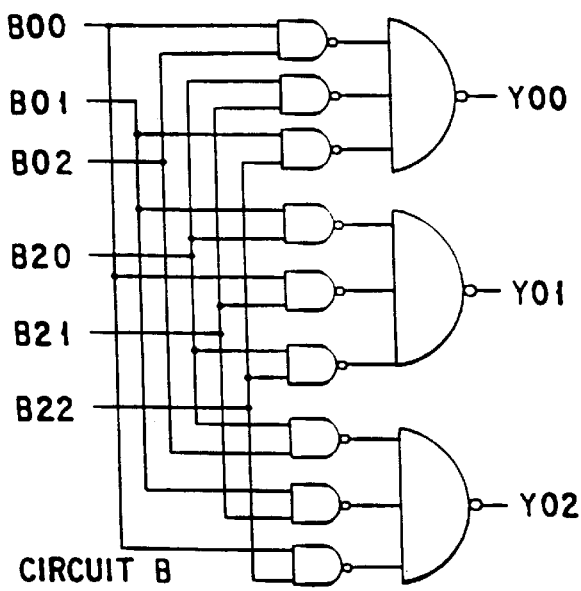
F I G. 12
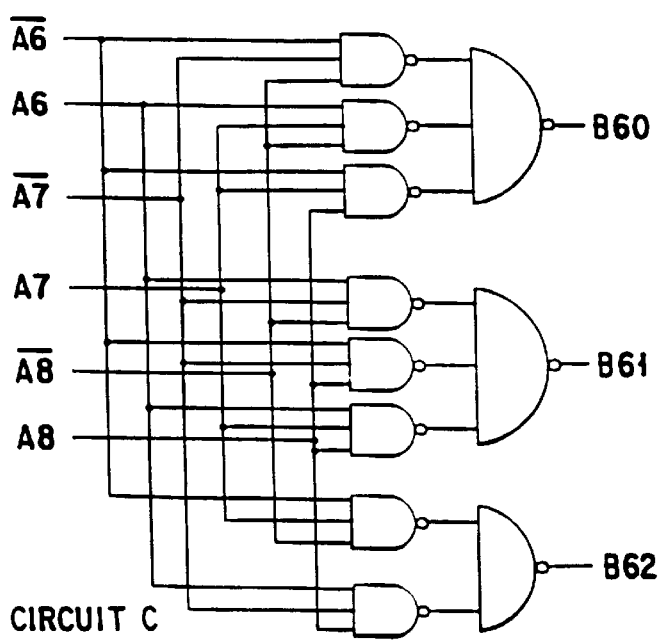
F I G. 13

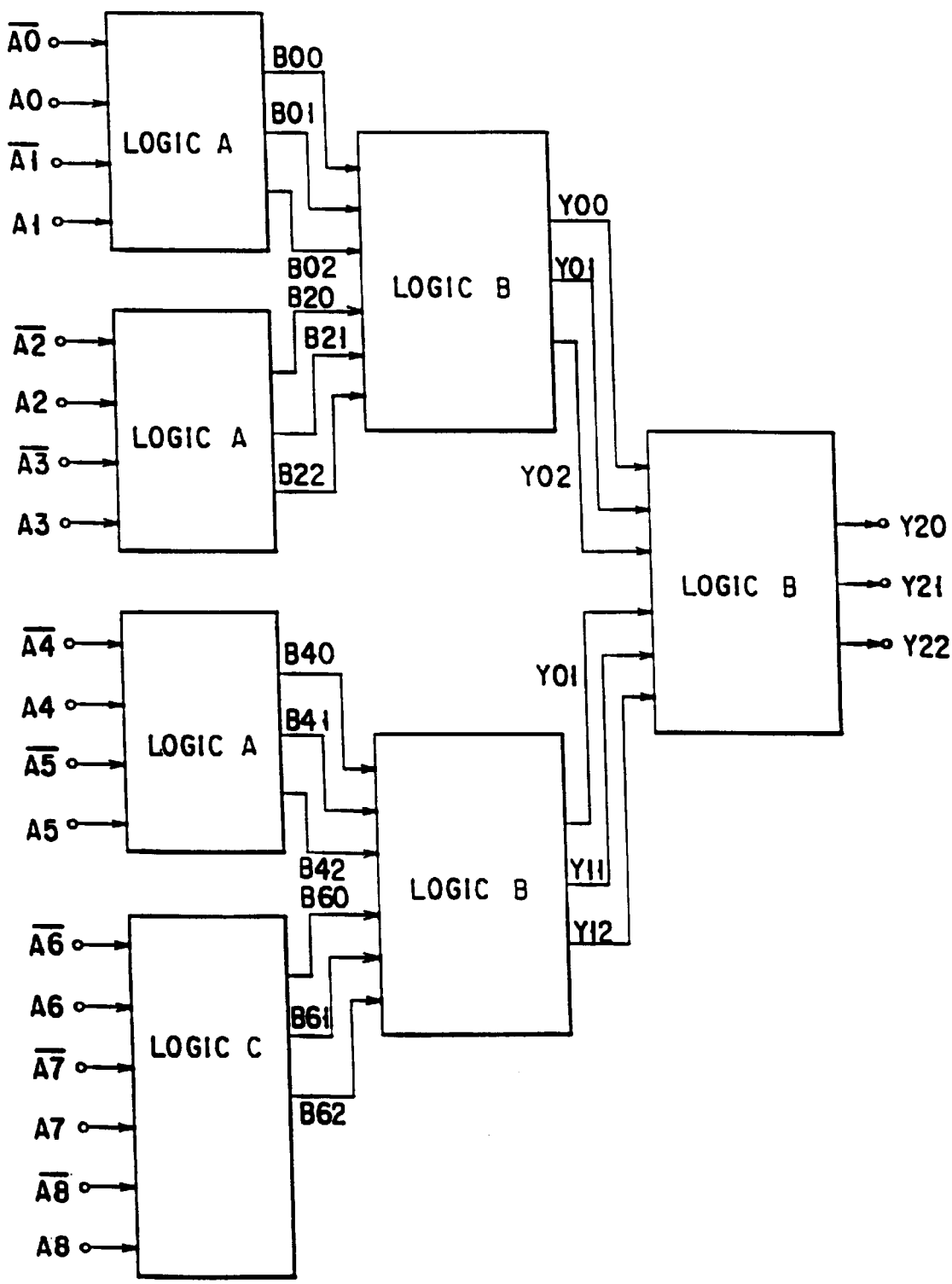
F I G. 14

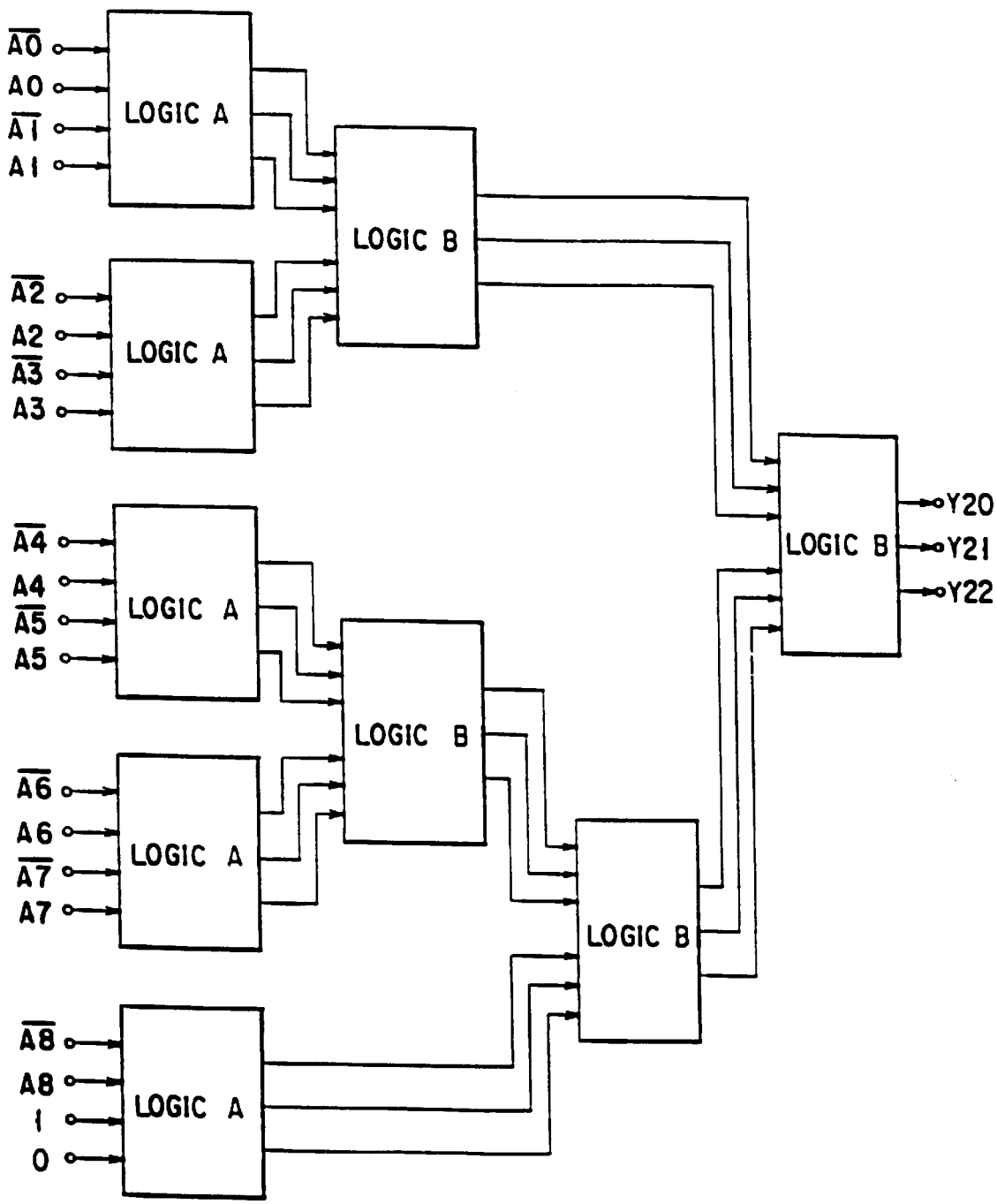
F I G. 15

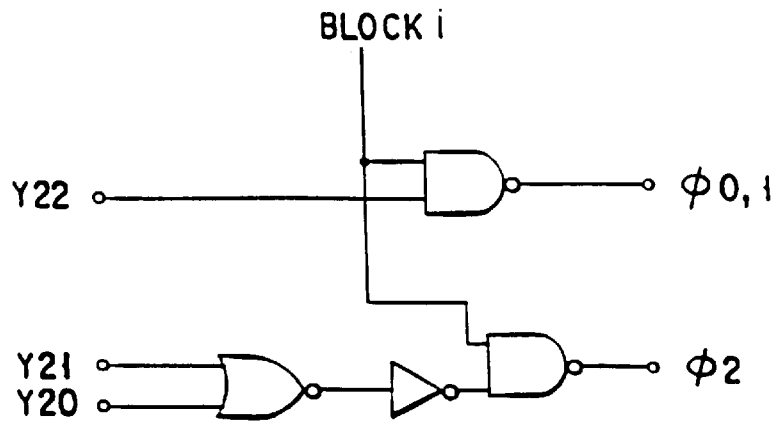
F I G. 16
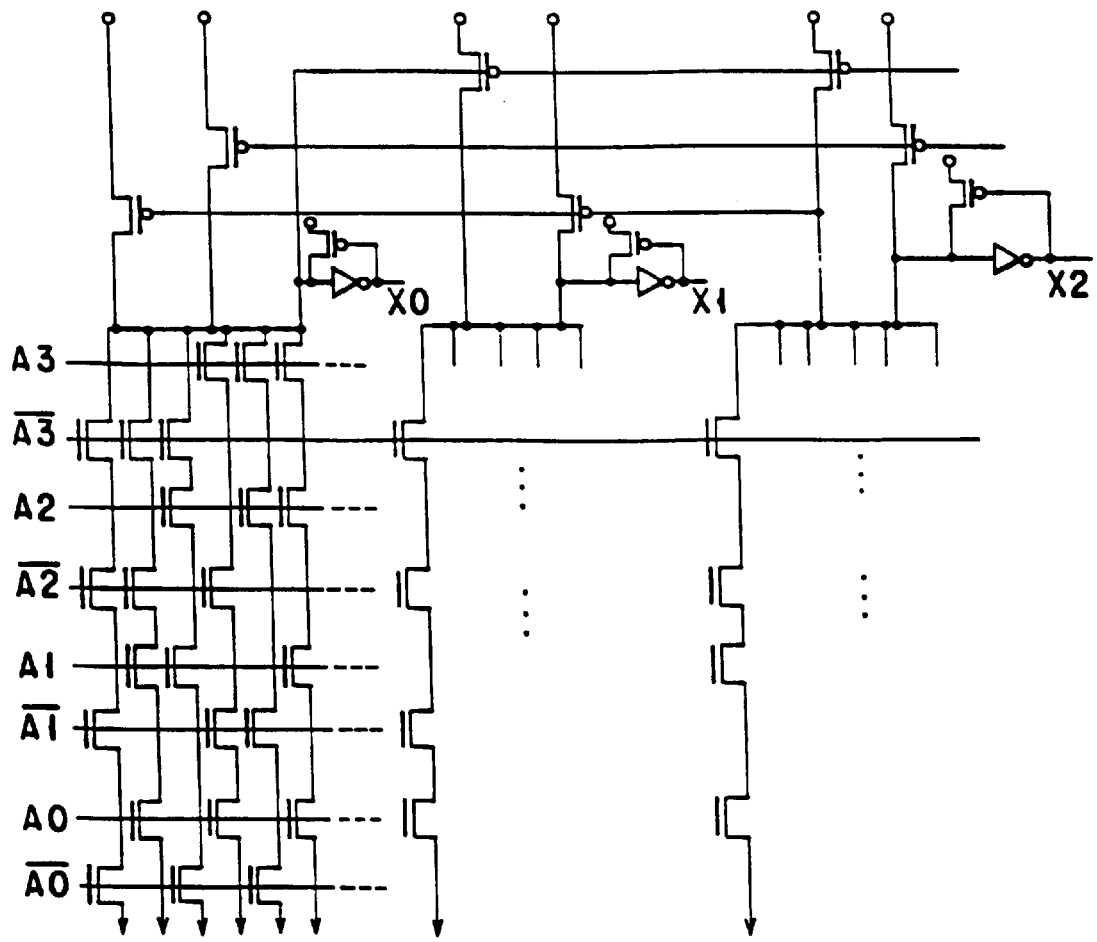
F I G. 17

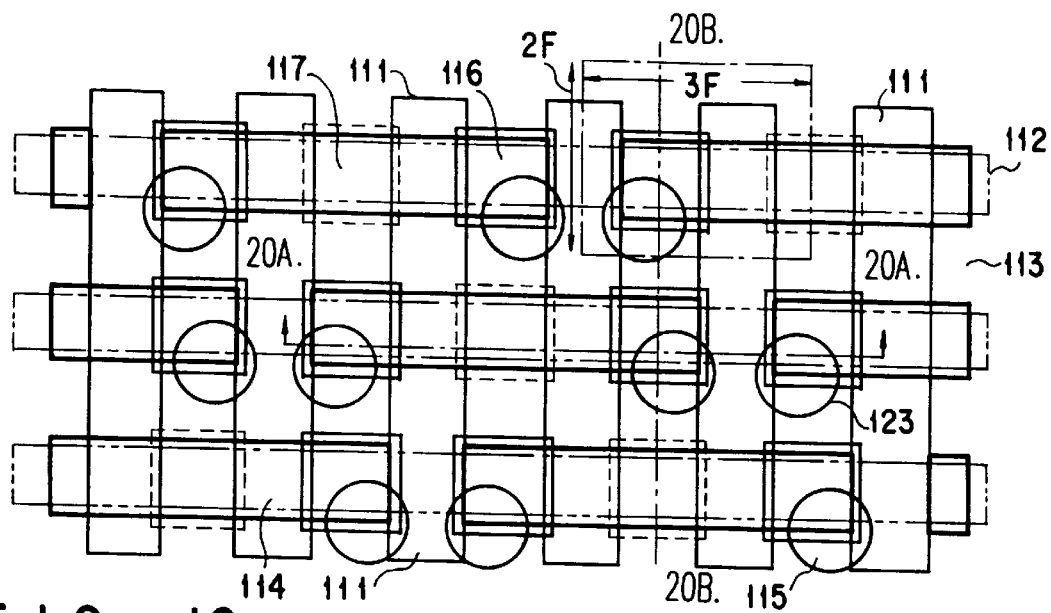
F I G. 19
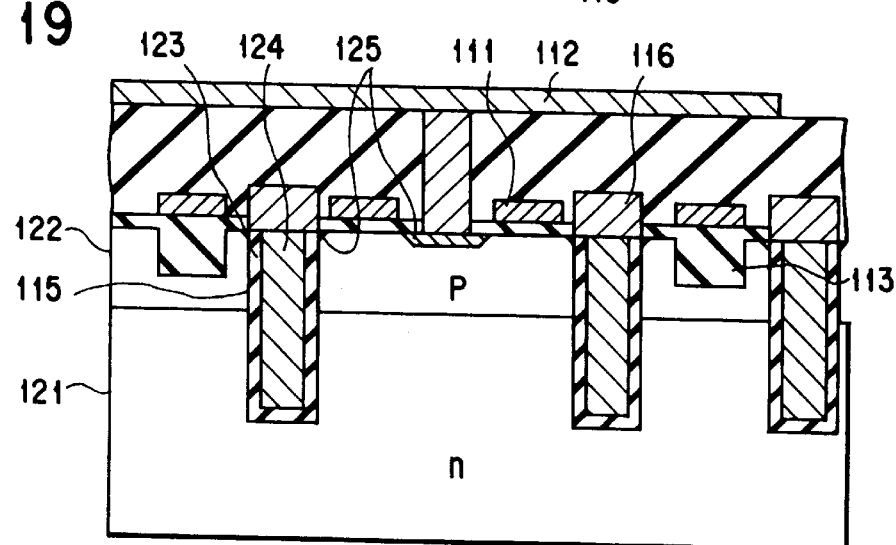
F I G. 20A
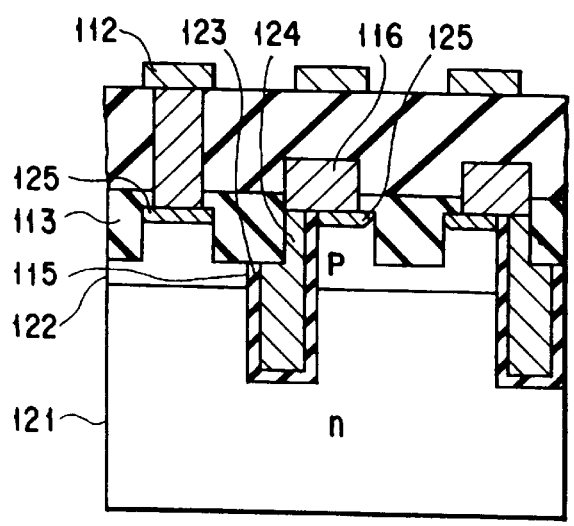
F I G. 20B

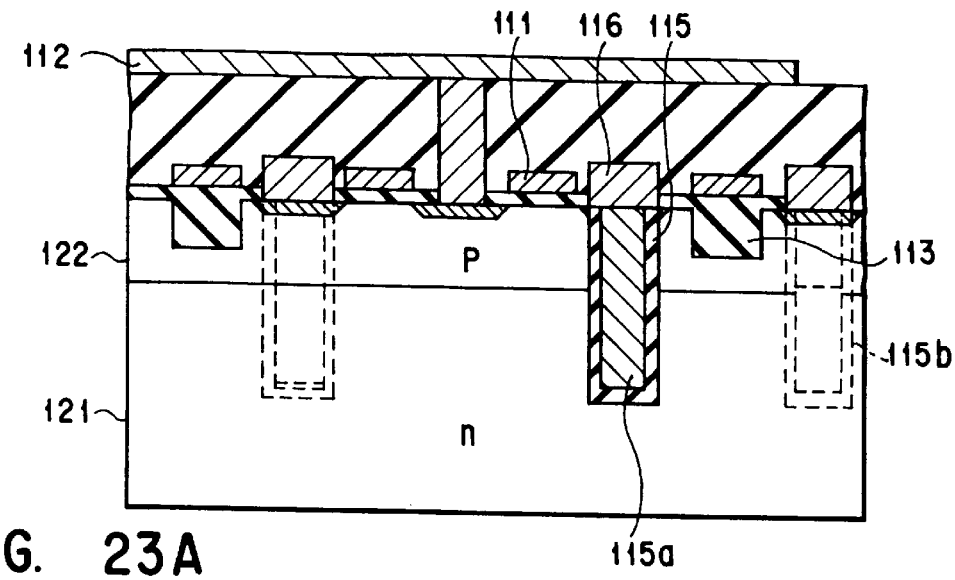
F I G. 23A
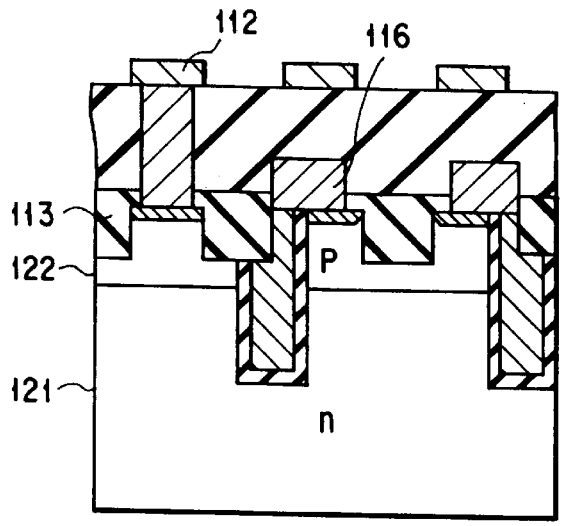
F I G. 23B
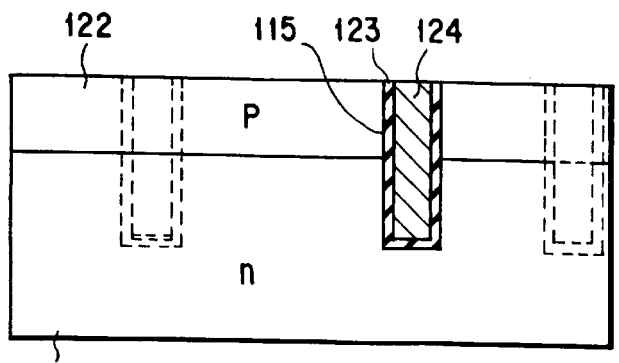
F I G. 24A
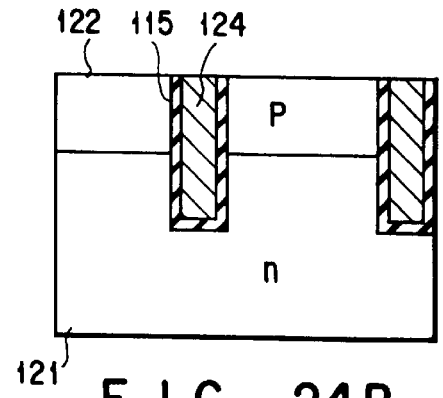
F I G. 24B

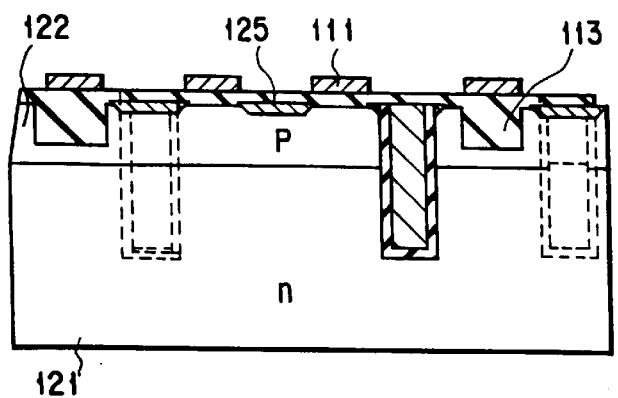 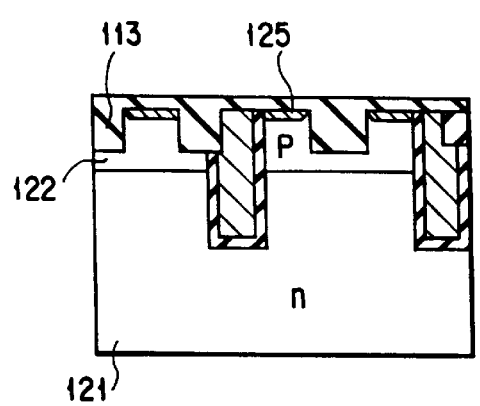
F I G. 25A    F I G. 25B
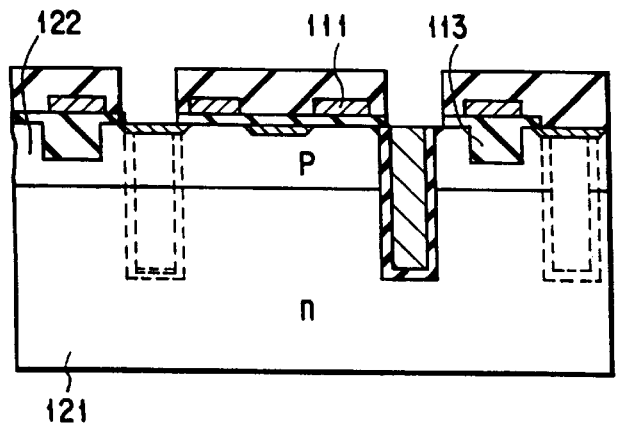 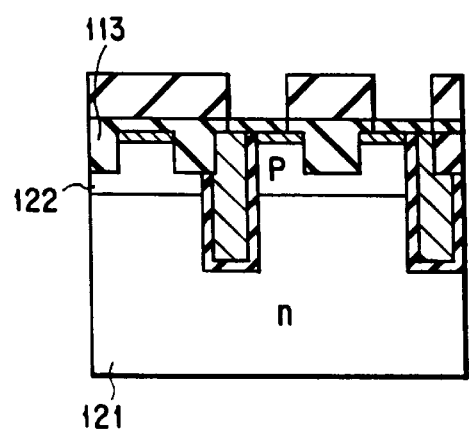
F I G. 26A    F I G. 26B
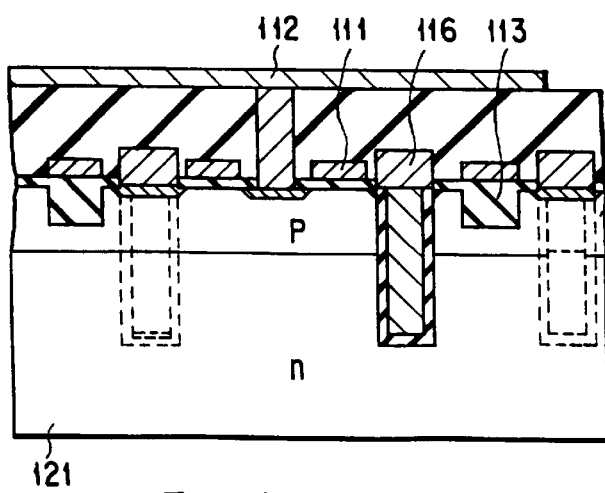 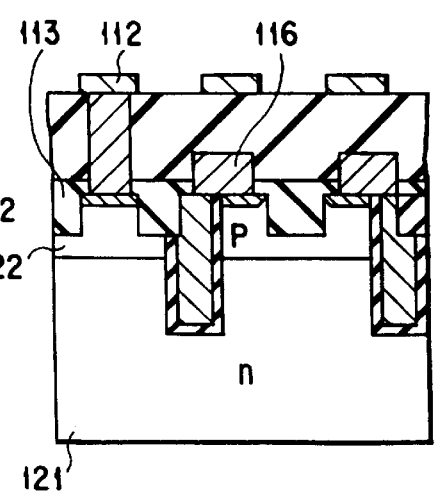
F I G. 27A    F I G. 27B

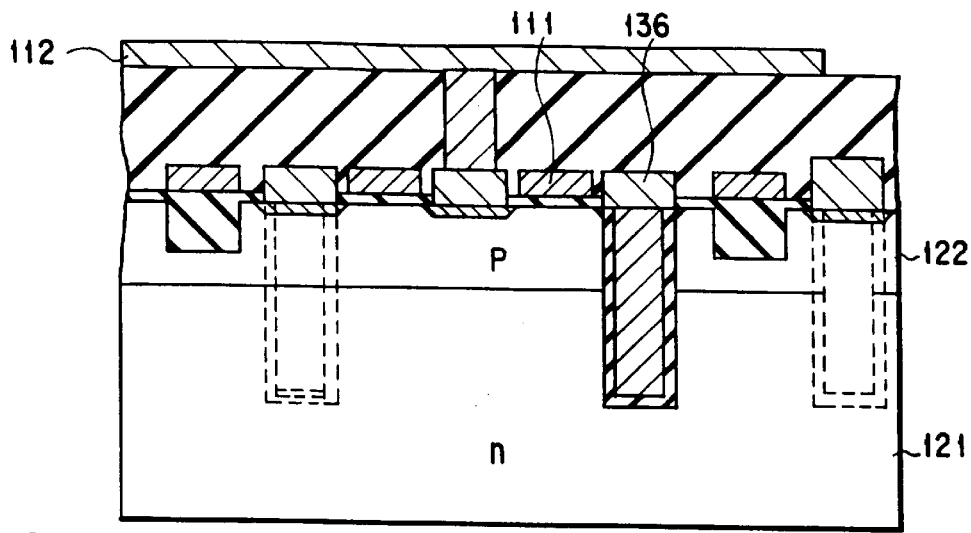
F I G. 31
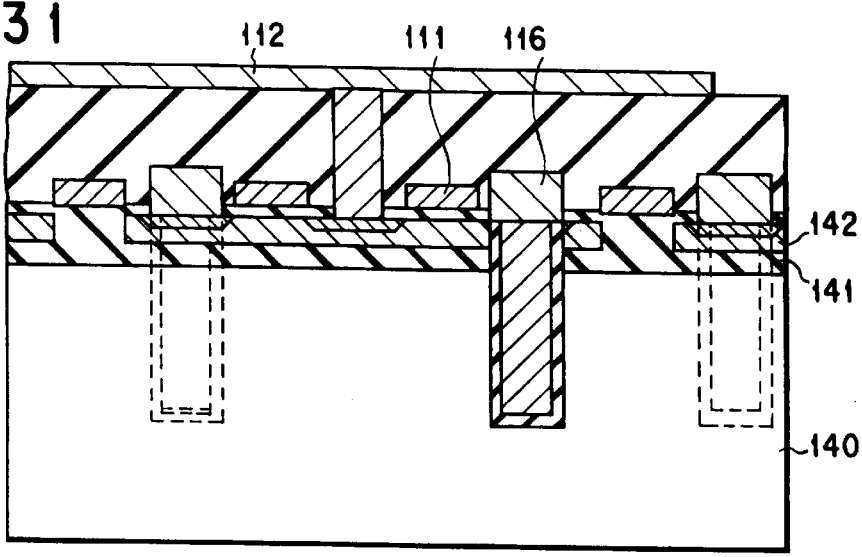
F I G. 32
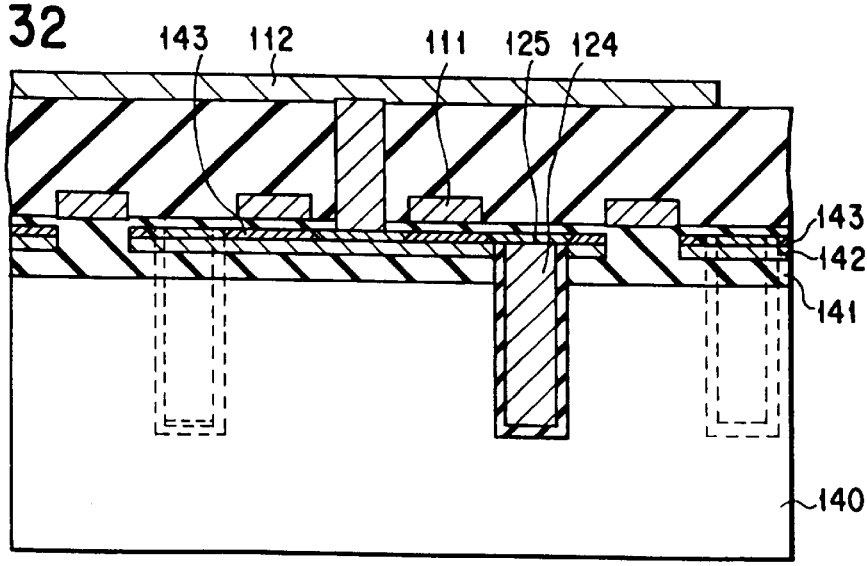
F I G. 33

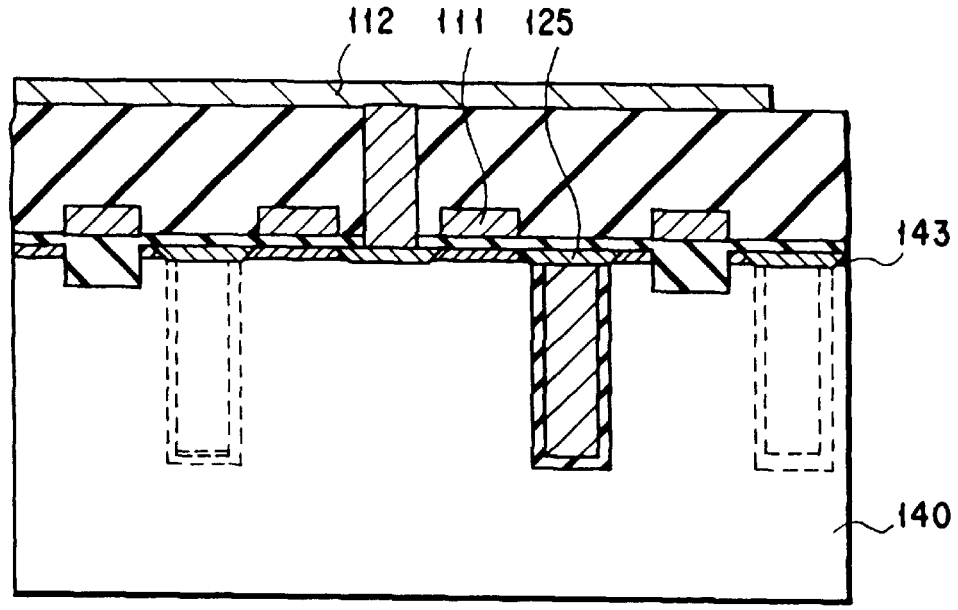
F I G. 34
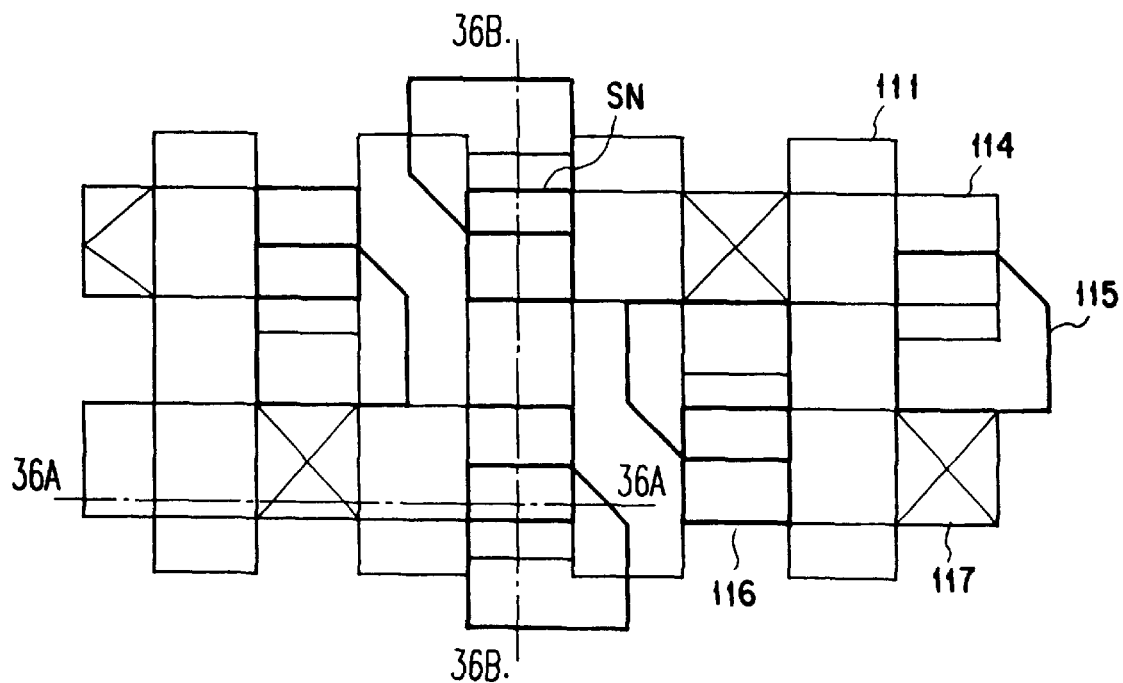
F I G. 35

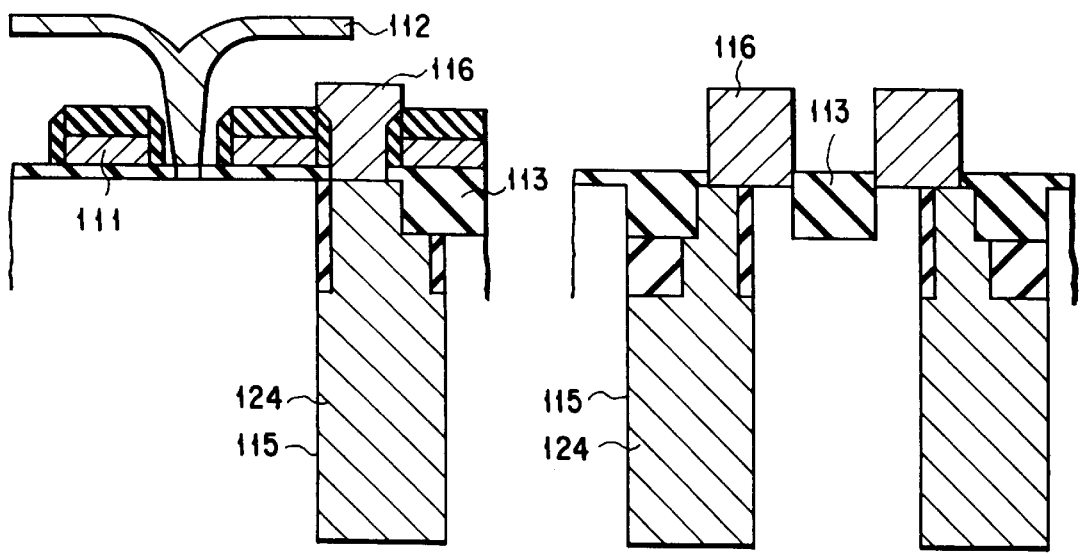
F I G. 36A    F I G. 36B
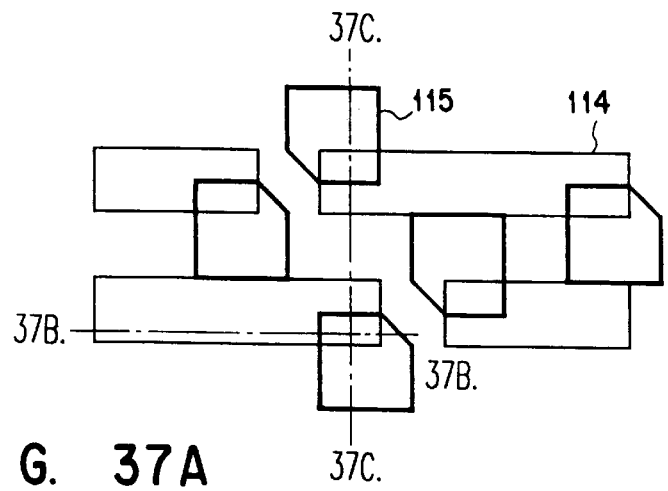
F I G. 37A
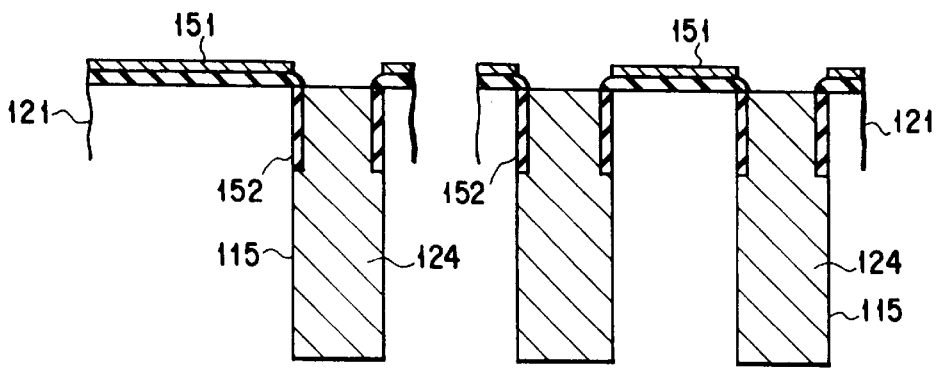
F I G. 37B    F I G. 37C

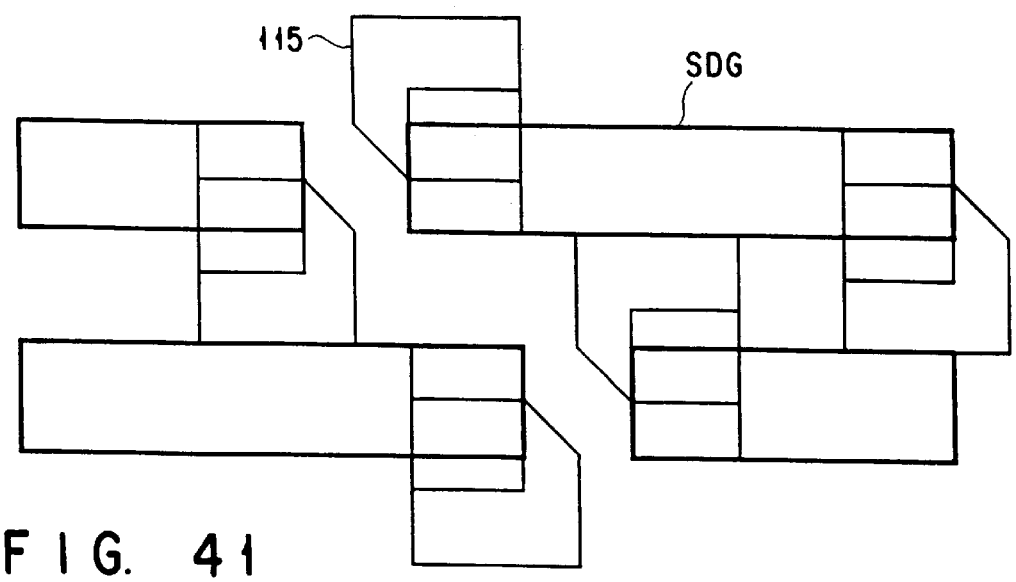
F I G. 41
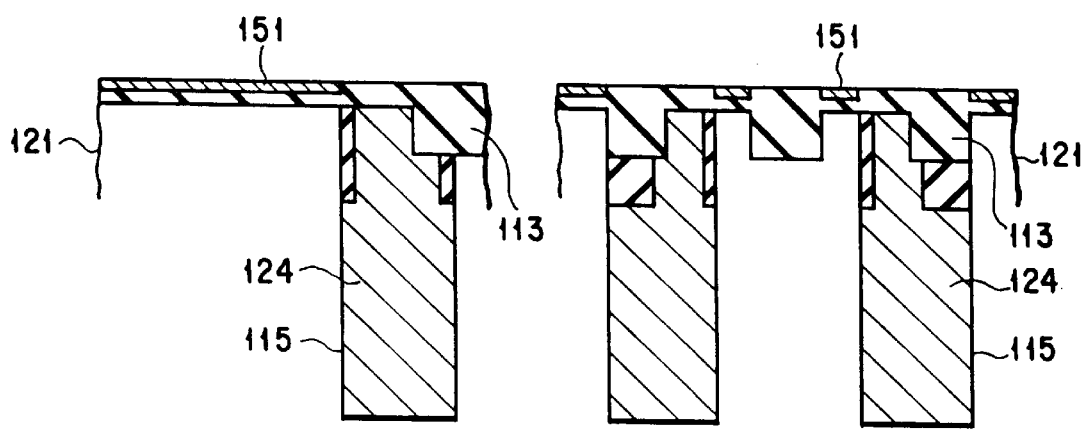
F I G. 42A    F I G. 42B
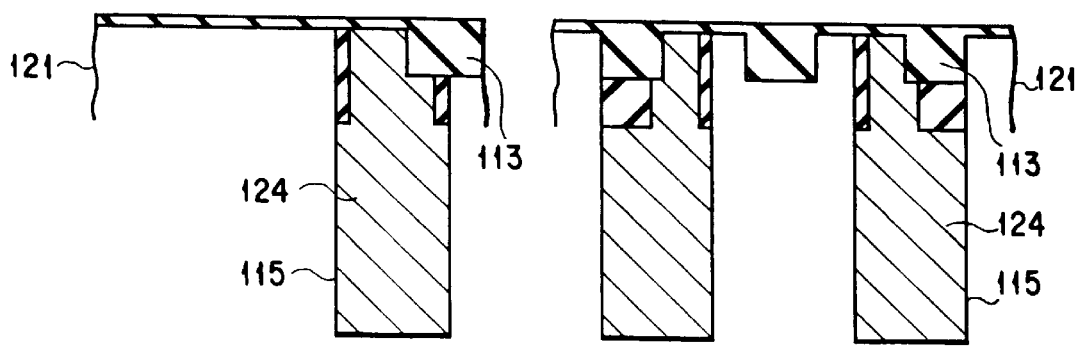
F I G. 43A    F I G. 43B

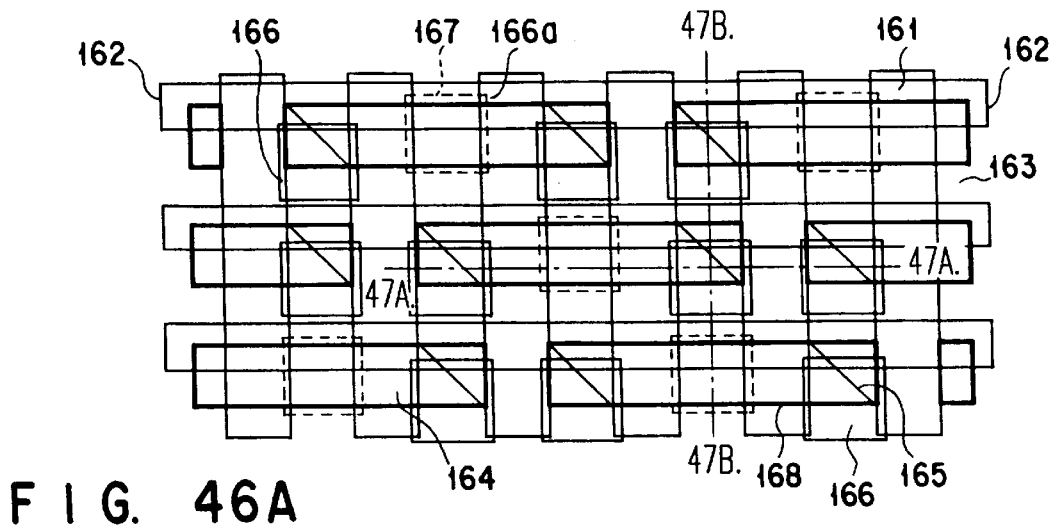
F I G. 46A
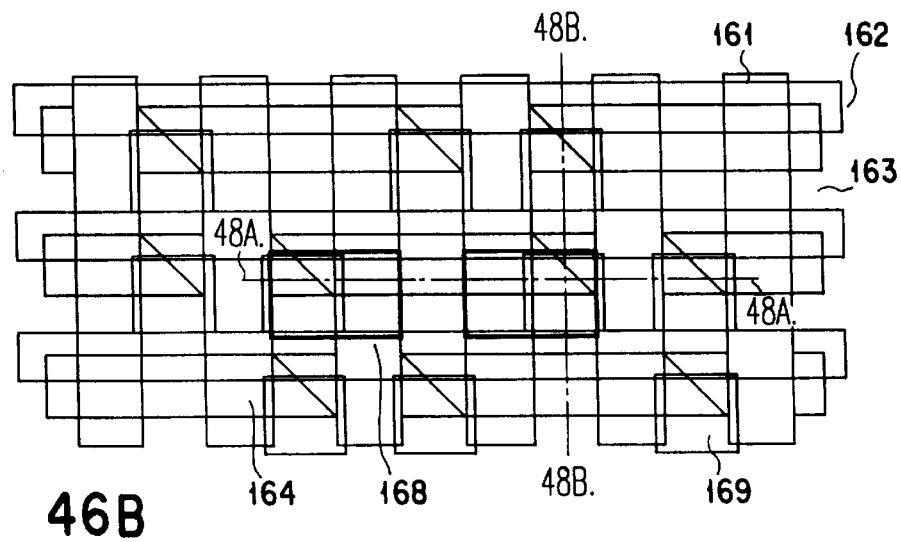
F I G. 46B
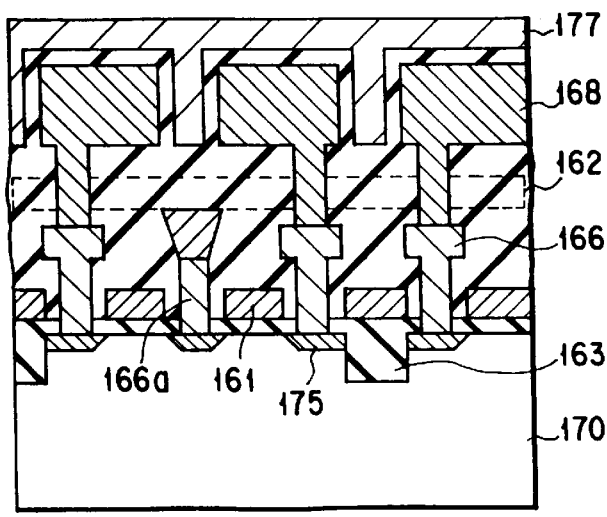
F I G. 47A
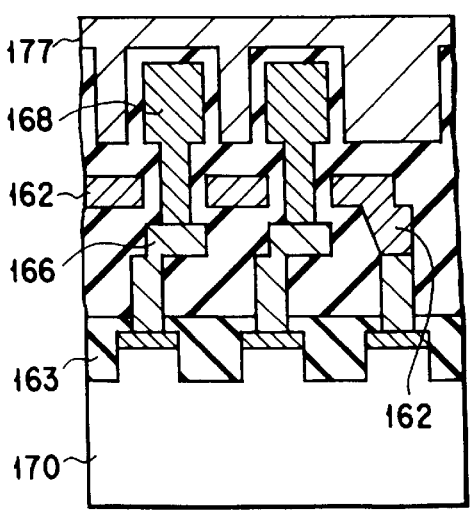
F I G. 47B

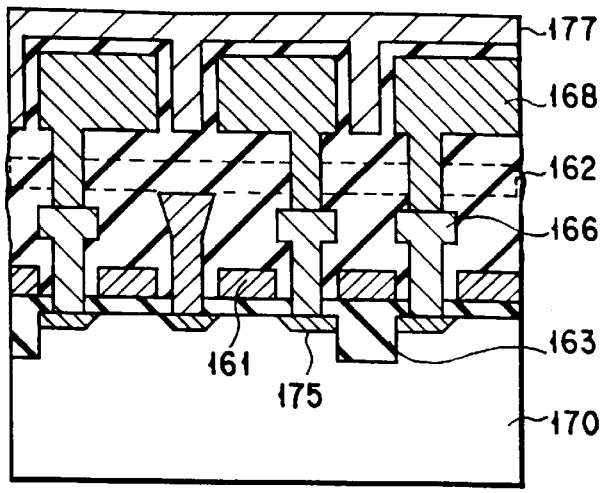
F I G. 56A
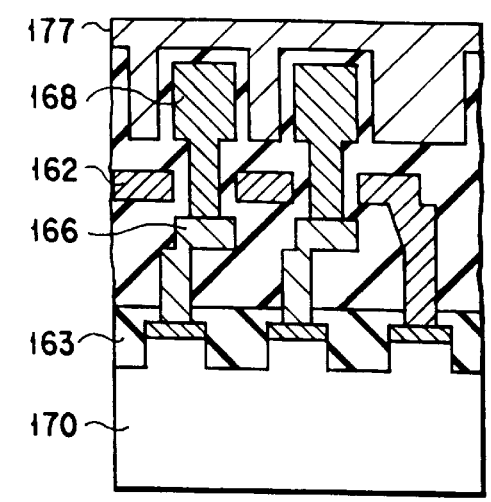
F I G. 56B
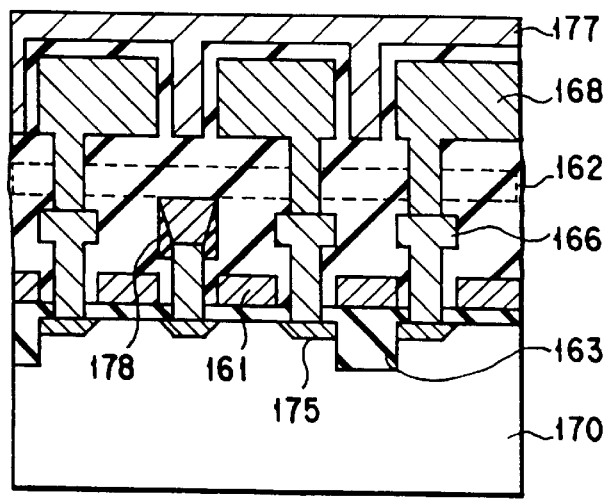
F I G. 57A
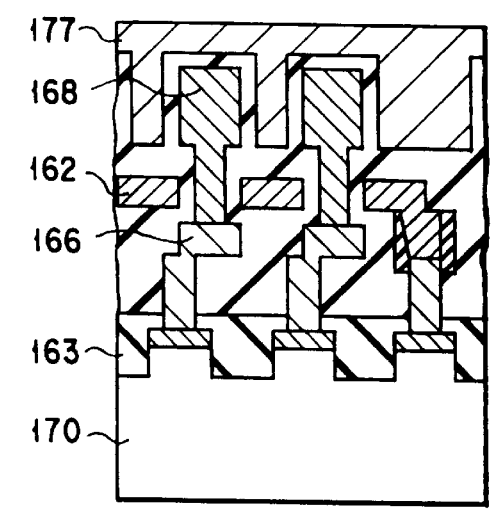
F I G. 57B
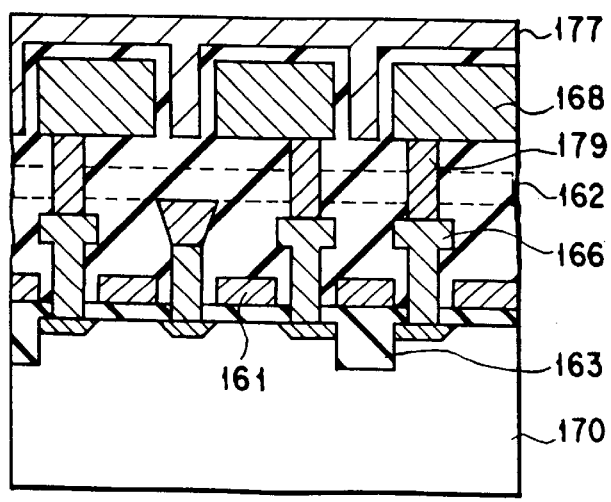
F I G. 58A
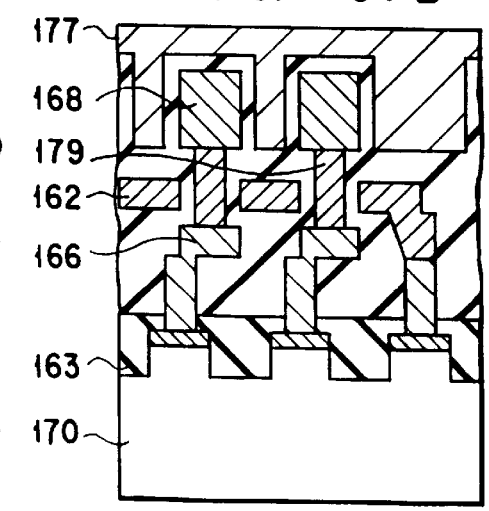
F I G. 58B

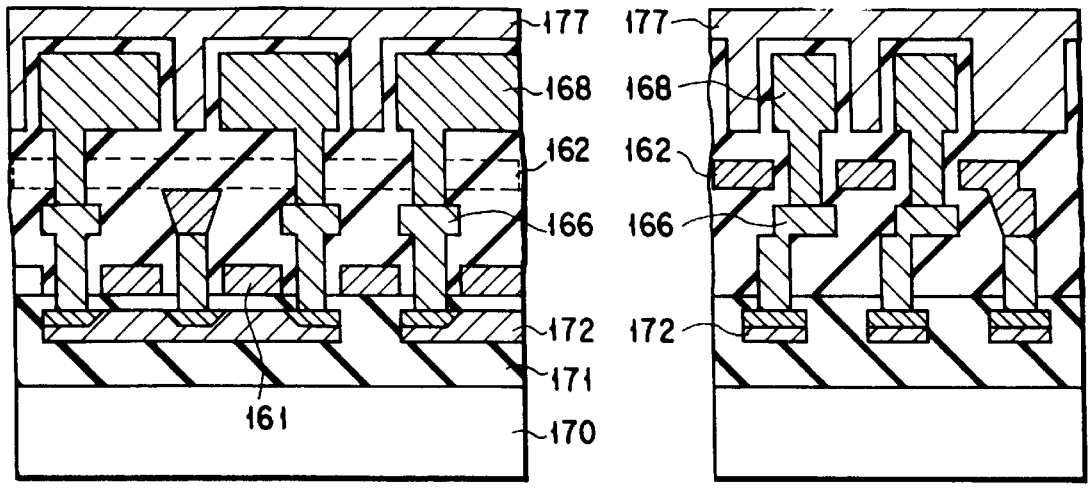
F I G. 59A    F I G. 59B
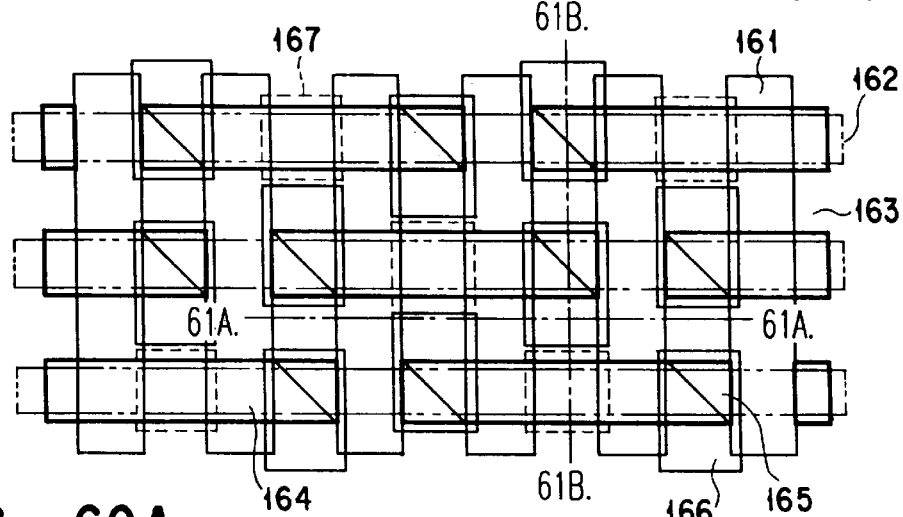
F I G. 60A
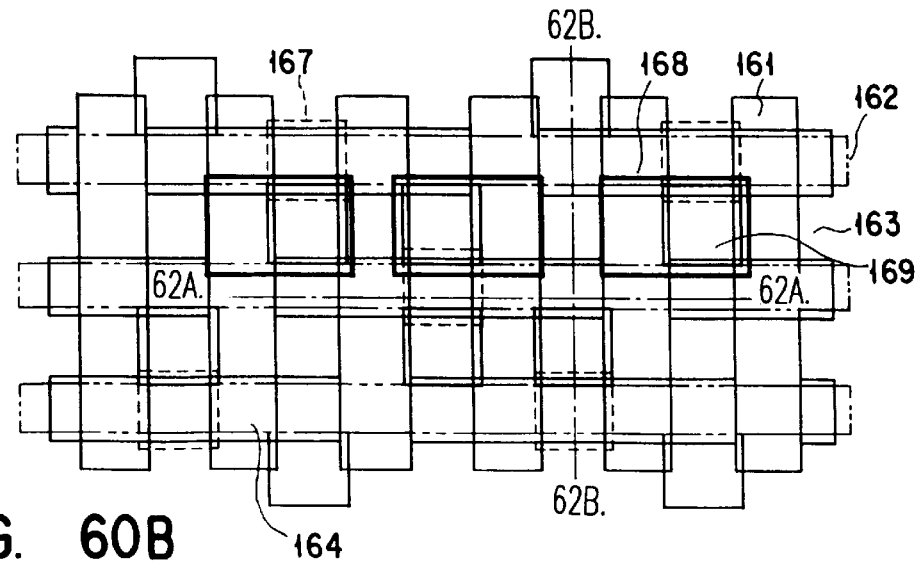
F I G. 60B

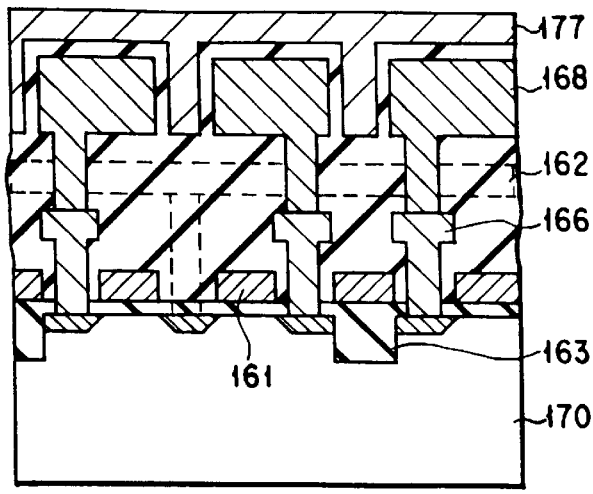
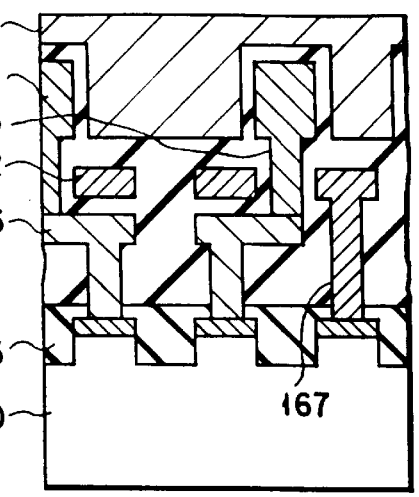
F I G. 61A   F I G. 61B
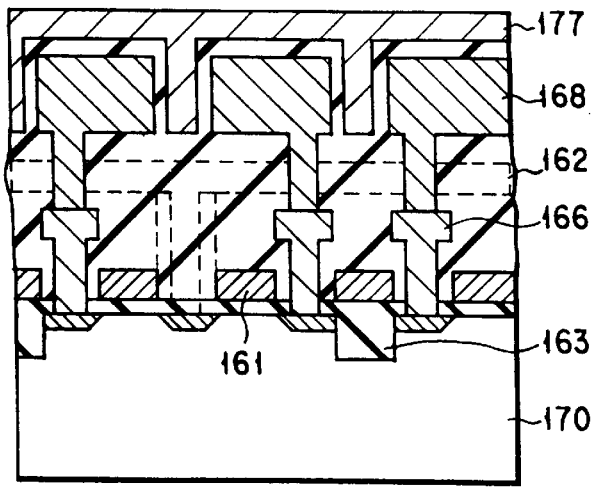
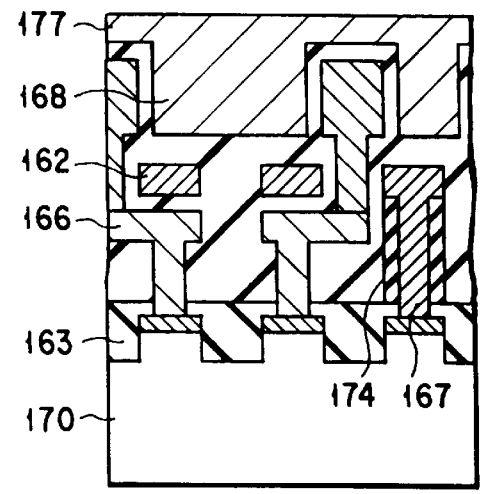
F I G. 62A   F I G. 62B
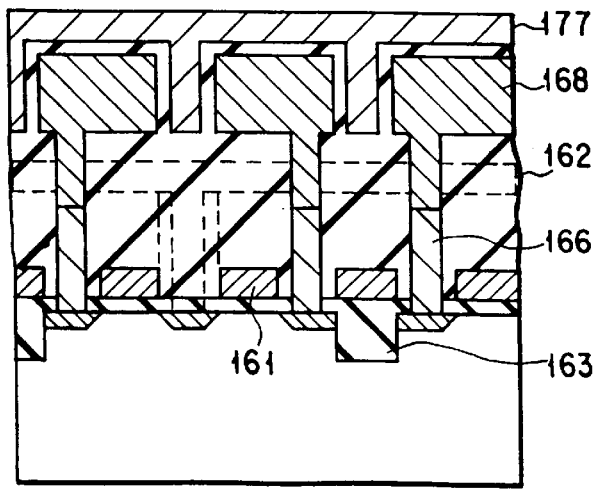
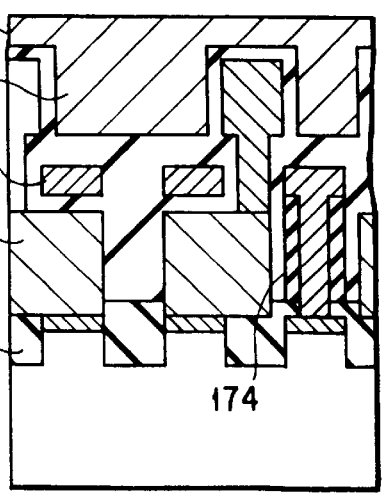
F I G. 63A   F I G. 63B

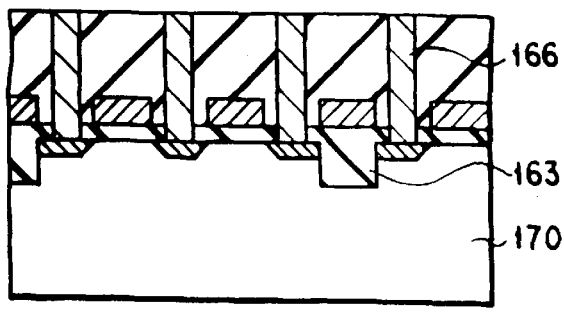
F I G. 66A
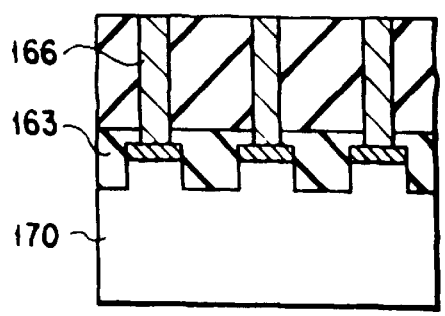
F I G. 66B
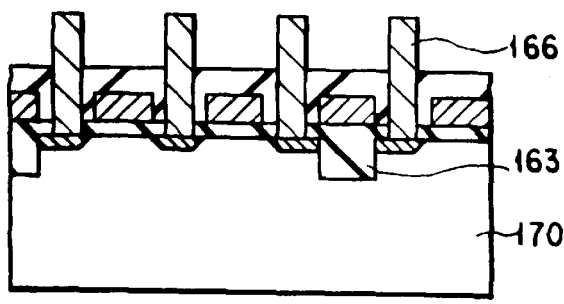
F I G. 67A
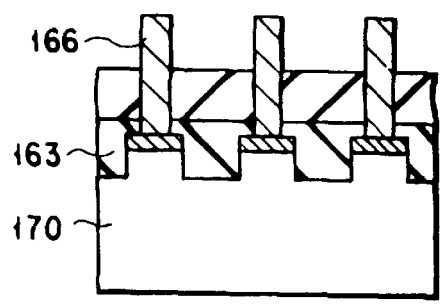
F I G. 67B
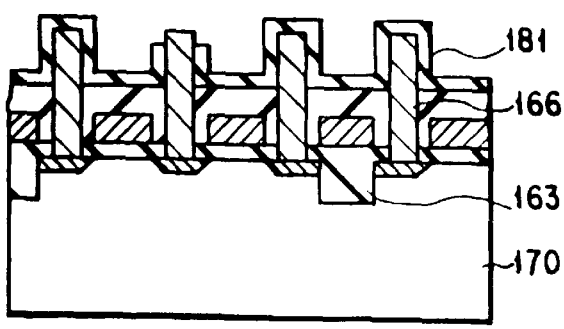
F I G. 68A
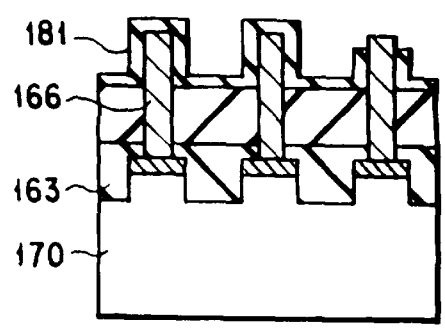
F I G. 68B
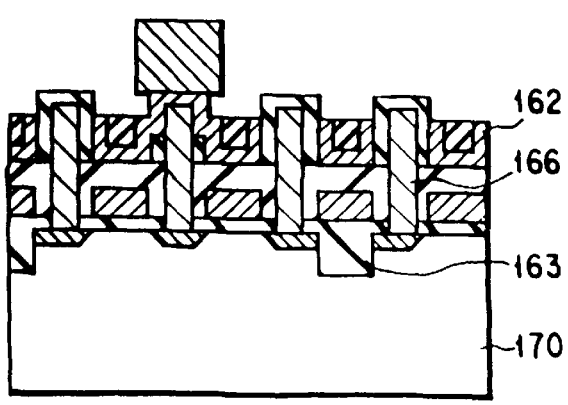
F I G. 69A
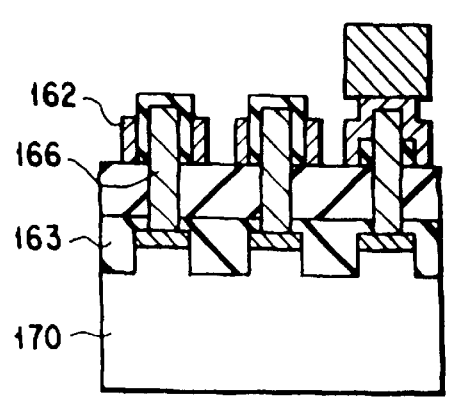
F I G. 69B

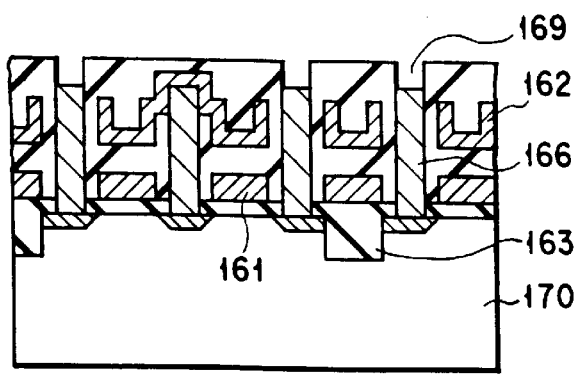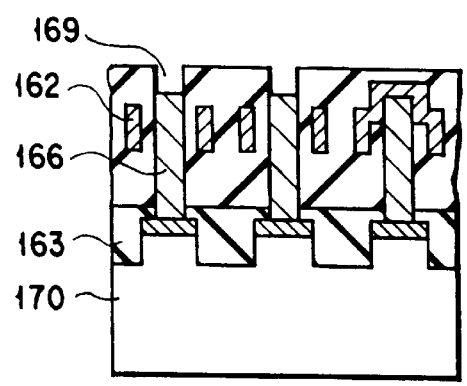
F I G. 70A
F I G. 70B
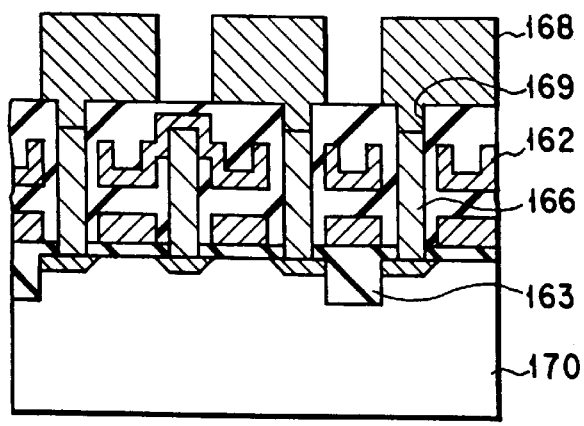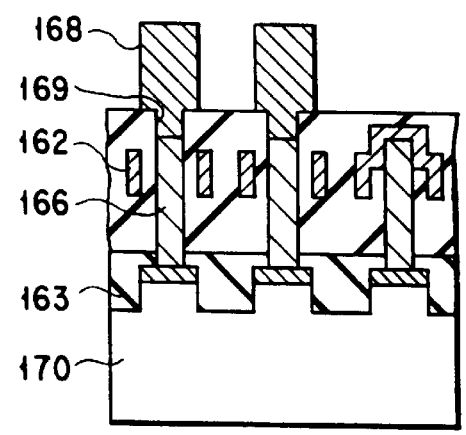
F I G. 71A
F I G. 71B
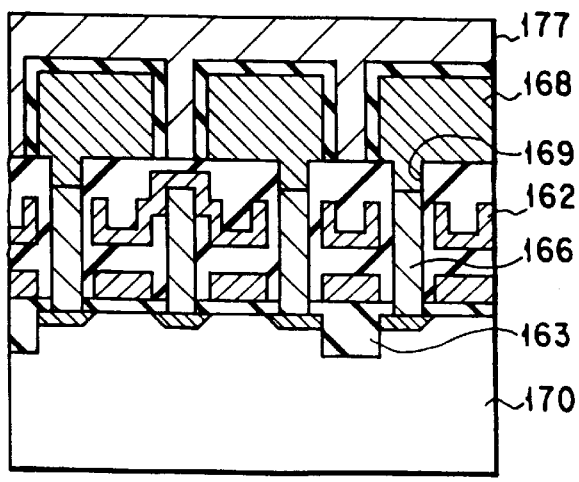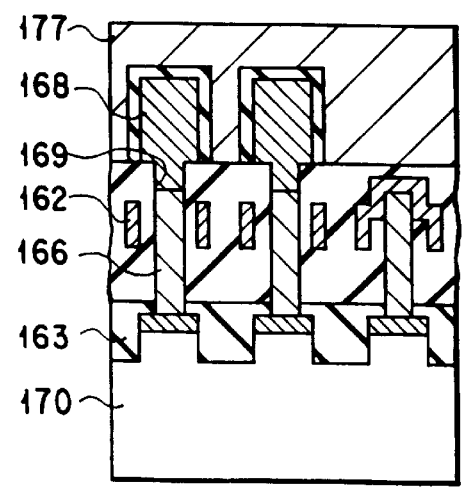
F I G. 72A
F I G. 72B

DYNAMIC RANDOM ACCESS MEMORY DEVICE WITH THE COMBINED OPEN/ FOLDED BIT-LINE PAIR ARRANGEMENT

CROSS-REFERENCES TO THE RELATED APPLICATIONS

This application is a continuation-in-part of U.S. patent application Ser. No. 08/348,068, filed Nov. 23, 1994, now U.S. Pat. No. 5,555,519, which is a continuation of U.S. patent application Ser. No. 08/123,466, filed Sep. 20, 1993, now U.S. Pat. No. 5,392,856.

BACKGROUND OF THE INVENTION

1. Field of the Invention

The present invention relates in general to semiconductor memory devices and in more particular to dynamic random-access memory (DRAM) devices of the type employing an array of one-transistor memory cells. The invention also relates to an improved sense amplifier circuitry for a MOS memory device.

2. Description of the Related Art

Recently, MOS dynamic random access memory (DRAM) devices are becoming more widely used in the manufacture of digital equipment, particularly small-size computers, as the speed and cost advantages of these devices increase. As semiconductor technology is advanced, the devices are increasing in integration density due to remarkable improvements in the memory cell structure and in the micro-fabrication techniques. As memory devices require higher packing density (integration density), higher speed, and lower dissipation, the sense amplifiers become critical.

Some prior DRAM devices employ what is called the "open bit-line" system that exhibits high integration density by allowing the area of memory cells to decrease on a chip substrate of limited size, while the others use the "folded bit-line" system which accomplishes an reduced sense-amplifier area and an enhanced noise-withstanding characteristics. A conflicting problem may exist in the two types of bit-line systems: While the open bit-line system is advantageous in the achievement of higher integration density of the memory cells, it suffers from the difficulty in designing sense-amplifier circuits to meet a strict circuit-design rule, which may results in that the positioning or distributing the sense amplifiers is difficult in a limited surface area of the substrate. In contrast, with the folded bit-line system, while the circuit design rule may become moderate to make it easier to design the sense amplifiers associated therewith, the integration density of memory cells decreases due to an increase in the required area of memory cells on the substrate.

Conventionally, with the open bit-line system, memory cells are allowed to be arranged at all the cross points as defined between the bit lines and the word lines; therefore, the resultant integration density of memory cells may be maximized, causing the memory-cell array section to decrease in occupation area on a chip substrate. On the other hand, in the open bit-line system, since two bit lines constituting each bit-line pair extend to run into two neighboring memory-cell subarrays, it is strictly required that a sense amplifier circuit associated therewith is packed within a reduced substrate-surface area, which may correspond in length to the bit-line width. Such a sense-amplifier layout requirement makes it difficult to arrange a number of sense amplifier circuits on the chip substrate as a whole.

Recently, to soften the layout difficulty, what is called the "relaxed open bit-line" system has been proposed, wherein sense amplifier circuits are alternately positioned on the both sides of a memory-cell subarray. However, even such a bit-line system will not able to meet sufficiently the demands for an further improvement in the integration density of DRAMs in the near future. Since a sense amplifier circuit should be required with respect to every group of two bit lines, the design rule for the sense amplifiers still remains strict as a whole.

In contrast, the folded bit-line system, which has been the major system for long in the DRAM technology since the past 64 K-bit DRAM generation until today, uses bit-line pairs each consisting of two bit lines "folded" at their certain nodes on an one side thereof, whereat a corresponding sense amplifier circuit is electrically connected to the bit-line pair. Parallel word lines extend in a direction transverse to the two folded bit lines. Memory cells are arranged only at specifically selected ones of the cross points between the word lines and the bit lines, wherein the specific cross points are half the overall cross points in number. More specifically, looking at a single word line, only one of the two cross points as defined between this word line and the two folded bit lines is provided with a memory cell; any memory cell is prevented from bring arranged at the other of the two cross points. Looking at two neighboring word lines, the layout of memory cells may exhibit a "zig-zag" pattern. To attain such an arrangement, two sense amplifier circuits for two adjacent folded bit-line pairs are alternately located on the two opposite sides of a corresponding memory-cell subarray. This results is in that, in a viewpoint of sense-amplifier circuit design, one sense amplifier may be provided with respect to four adjacent bit lines on one side of the subarray. This means that the positioning distance between sense amplifier circuits along the word-line direction can be allowed to increase substantially up to the width of four bit lines. It is thus possible to make easier the layout of a number of sense amplifier circuits on the chip substrate.

Unfortunately, with the presently available folded bit-line system, it cannot be permitted in principle that memory cells are arranged or distributed among all the cross points defined between the word lines and the bit lines, as has been described previously. This may cause the memory-cell array section to increase in area on the substrate surface as a whole. Such an increase in the area of the memory-call array section will become a serious bar to the achievement of a further improved integration density in DRAMs. In particular, when the semiconductor technology is rushed into the age of extra-highly integrated DRAMs of the next generation (such as 256 M-bit DRAMs or more), which will strictly require a further reduction in the cell-array area, it may be obvious that the folded bit-line system can no longer go with the trend of further improvements in the integration density. This can also be said due to the fact that the reduction in the area is of each memory cell has approached almost the limit of inherence in the presently available DRAM devices.

In the DRAM having memory cells connected in series, a method of providing a sufficiently large connection area and attaining the cell size of as small as 4F2 (P indicating the minimum processing size) by deviating trench capacitors with respect to the active regions is disclosed (NAND-Structured Cell Technologies for Low Cost 256 Mb DRAMs, T. Hamamoto to et. al, IEDM93, P643). However, the DRAM-using this type of memory cells is small in the chip b but has defects that random access cannot be made and the access speed is low. Further, there occurs a problem that the channel width of the memory cell transistor will be reduced when the trench is deviated in either direction since the transfer gates of the memory cell transistor are formed on both sides of the trench.

In a memory cell in which random access can be made and a plane transistor is used as the gate of the cell, the cell area of 6F2 is minimum. As a memory cell included in the memory cells of the above type and having small noise, a new system in which bit lines are formed in a two-layered form and which utilizes an access system of folded bit line configuration having small noise was published (A Split-Level Diagonal Bit-Line (SLDB) Stacked Capacitor Cell for 256 Mb DRAMs, T. Hamamoto et. al, IEDM 92, P799). This is a stack type memory cell in which bit lines are arranged in an oblique direction so that the bit lines will not be arranged above the active regions of the storage node contact portions so as to prevent interference between the storage node contacts and the bit lines and capacitors are formed above the bit lines. However, in this type of memory cell, the number of steps increases since the bit lines are formed in a two-layered form and the cost will rise.

Further, as an access system in which the bit lines are formed in a single-layered form and noise is small, a new system using one through word line for every two cells was published (OPEN/FOLDED Bit Line Arrangement for Ultra High-Density DRAMs, D. Takashima et. al, VLSI CIRCUIT, 93, P89). However, in this system, it is necessary to set the trench and the transfer gate closer to each other an in the first embodiment and there occurs a problem that the channel width of the transistor will be reduced by misalignment. Further, the active region to be connected to the storage node contact is concealed by the bit line and it becomes difficult to form a stack type memory cell of so-called bit line pre-forming type in which capacitors are formed above the bit lines.

Thus, conventionally, in the system in which the bit lines are formed in a two-layered form to reduce the cell size so as to attain the cell size of 6P2 by use of the memory cells each having a plane transistor as the gate of the cell, there occurs a problem that the manufacturing process is complicated and the manufacturing cost rises. Further, in the system in which one through word line is provided for every two cells, a problem that the bit lines of single layer cannot be applied to the stack cell of bit line preforming type. Further, in the trench type cell, a memory cell of 6F2 in which random access can be made is not proposed.

SUMMARY OF THE INVENTION

An object of this invention is to provide a semiconductor memory device of a system having one through word line for every two cells in which the influence of trenches on transfer gates can be suppressed and which has memory cells of 6F2 in which the transistor width can be made sufficiently large and random access can be made.

Another object of this invention is to provide a semiconductor memory device having stack type memory cells of bit line pre-forming type of 6F2 in which the bit lines are formed in a single-layered form but noise is small.

This invention provides a semiconductor memory device including memory cells having one through word line for every two cells, comprising a plurality of word lines and a plurality of bit lines arranged to intersect each other on a semiconductor substrate; a plurality of active regions arranged on the semiconductor substrate such that those of the active regions which are adjacent to each other in the word line direction are deviated in the bit line direction; MOS transistors respectively formed in the active regions and each having a gate formed of the word line and a source and drain one of which is connected to the bit line; a plurality of trenches each arranged to another set of source and drain regions and arranged to deviate in the word line direction with respect to the center of the source and drain regions, those of the trenches which are adjacent to each other with the through word line disposed therebetween being deviated in the bit line direction to be set closer to each other; storage electrodes respectively formed in the respective trenches with insulative films disposed therebetween; and connection electrodes arranged between the word lines, each for connecting the other of the source and drain of the MOS transistor to the storage electrode in the trench.

Further, this invention provides a semiconductor memory device including memory cells having one through word line for every two cells, comprising a plurality of active regions arranged on a semiconductor substrate such that those of the active regions which are adjacent to each other in the word line direction are deviated in the bit line direction; lead electrodes each formed in contact with one of the source and drain of one of MOS transistors respectively formed in the active regions and arranged to deviate in one direction of the word line direction with respect to the active regions; bit lines arranged above the lead electrodes to deviate in a direction opposite to the deviating direction of the lead electrodes; storage node contacts arranged between the bit lines and formed in contact with the lead electrodes; storage electrodes respectively formed on the storage node contacts; and plate electrodes formed on the storage electrodes with capacitor insulative films disposed therebetween.

Further, this invention provides a semiconductor memory device including memory cells having one through word line for every two cells, comprising a plurality of active regions arranged on a semiconductor substrate such that those of the active regions which are adjacent to each other in the word line direction are deviated in the bit line direction; lead electrodes each formed in contact with one of the source and drain of MOS transistors respectively formed in the active regions and formed to extend towards the bit line contact which is nearest to the memory cells adjacent to each other in the word line direction; bit lines each formed in contact with the other of the source and drain of the MOS transistor and arranged above the lead electrodes; storage node contacts arranged between the bit lines and respectively formed in contact with the lead electrodes; storage electrodes respectively formed on the storage node contacts; and plate electrodes formed on the storage electrodes with capacitor insulative films disposed therebetween.

Further, this invention provides a semiconductor memory device including memory cells having one through word line for every two cells, comprising a plurality of active regions arranged on a semiconductor substrate such that those of the active regions which are adjacent to each other in the word line direction are deviated in the bit line direction; lead electrodes selectively formed in contact with the sources and drains of MOS transistors respectively formed in the active regions and formed to extend to a position higher than the gate electrodes of the MOS transistors; bit lines selectively formed in contact with those of the lead electrodes which are each formed in contact with one of the source and drain of the MOS transistor and selectively formed around those of the lead electrodes which are each formed in contact with the other of the source and drain of the MOS transistor to act as side walls thereof; storage electrodes respectively formed in contact with those of the lead electrodes which are surrounded by the bit lines and formed to protrude to a position higher than the bit line; and plate electrodes formed on the storage electrodes with capacitor insulative films disposed therebetween.

According to this invention, by using substrate plate type trench cells having a plate formed on the substrate side, a DRAM having memory cells in which random access can be made and noise is small can be realized with a cell size of 6F2 by deviating the trenches in the word line direction with respect to the active regions, providing an area for selectively connecting the storage electrodes to the sources and drains, and setting the trenches of the cells adjacent to each other with the through word line disposed therebetween closer to each other. Further, the bad influence of the trenches on the transfer gates can be prevented without increasing the cell size by deviating the trenches as described above.

Further, according to this invention, since the short circuit between the bit line and the storage electrode can be prevented by digging the storage electrode formed in the trench in portion adjacent to the bit line contact of the adjacent cell, the trench size can be increased without increasing the cell size.

Further, according to this invention, a stack type DRAM memory cell of bit line pre-forming type in which bit lines are formed in a single-layered form, random access can be made and noise is small can be realized is with a cell size of 6F2 by forming the lead electrodes above the gates (word lines) and below the bit lines, deviating the lead electrodes in one direction of the word line direction with respect to the active regions, deviating the bit lines in a direction opposite to the deviating direction of the lead electrodes, and connecting the storage node contacts to the lead electrodes through between the bit lines.

Further, according to this invention, the above stack type DRAM memory cell can be realized by extending the lead electrodes formed above the gates and below the bit lines in the bit line direction of the cells adjacent in the word line direction and connecting the lead electrode to the storage node contact through between the bit lines.

Further, according to this invention, the above stack type DRAM memory cell can be realized by forming the lead electrodes on all of the source and drain portions of the transistors above the gates, connecting the bit lines to the upper portions of the lead electrodes in portions to be connected to the bit lines, forming the bit lines as side walls around the respective lead electrodes with insulative films disposed therebetween in portions used as storage node contacts such that the upper portion of the lead electrode is arranged to protrude above the bit line, and connecting the portion to the storage node contact.

BRIEF DESCRIPTION OF THE DRAWINGS

FIG. 1 is a diagram showing the overall arrangement of a memory-cell array of a dynamic random access memory (DRAM) device in accordance with one preferred embodiment of the invention;

FIG. 2 is a partial plan view of the main part of the DRAM of FIG. 1;

FIG. 3 is a cross sectional view of the DRAM along line III—III of FIG. 2;

FIGS. 4 to 8 (FIG. 8 is comprised of FIGS. 8A and 8B) illustrate the memory-cell array sections of DRAM devices in accordance with other embodiments of the invention;

FIG. 11 shows one of a plurality of first internal logic units employed in the circuit of FIG. 10;

FIG. 12 shows a second internal logic unit used in the circuit of FIG. 10;

FIG. 13 is a diagram showing a third internal logic circuit unit which is arranged to process the upper three digits of an input binary number, when the binary number has an even number of digits;

FIG. 14 is a diagram showing a binary to ternary conversion logic circuit also embodying the invention, which circuit is arranged by combining the combination of the logic circuitry of FIG. 10 with the third logic unit of FIG. 13;

FIG. 15 is a diagram showing a modification of the circuit of the binary to ternary conversion logic circuit shown in FIG. 14;

FIG. 16 is a diagram showing a clock signal generator circuitry to be preferably applied to the memory system of FIG. 1, which circuitry has two outputs coupled to clock signal lines $\phi 0,1$ and $\phi 2$, respectively;

FIG. 17 is a diagram showing a logic circuit in accordance with another embodiment of the invention, which circuit provides a reminder to be generated when an input binary number is divided by the number three, by the input of a four-digit binary number;

FIG. 19 is a plan view showing the pattern arrangement of a DRAM according to an embodiment of this invention;

FIGS. 20A and 20B are cross sectional views taken along the A–A' and B–B' lines of FIG. 19;

FIGS. 23A and 23B are cross sectional views of the DRAM taken along the A–A' and B–B' lines of FIG. 19;

FIGS. 24A, 24B and FIGS. 25A, 25B are cross sectional views of semiconductor structures obtained in different steps of the first half of the process for manufacturing the DRAM;

FIGS. 26A, 26B and FIGS. 27A, 27B are cross sectional views of semiconductor structures obtained in different steps of the latter half of the process for manufacturing the DRAM;

FIG. 31 is a cross sectional view showing the element structure of a DRAM according to another embodiment;

FIG. 32 is a cross sectional view showing the element structure of a DRAM according to another embodiment;

FIG. 33 is a cross sectional view showing the element structure of a DRAM according to another embodiment;

FIG. 34 is a cross sectional view showing the element structure of a DRAM according to another embodiment;

FIG. 35 is a plan view showing the pattern arrangement of a DRAM according to another embodiment;

FIGS. 36A, 36B are cross sectional views of the DRAM taken along the A–A' and B–B' lines of FIG. 35;

FIGS. 37A, 37B and 37C are a plan view, lateral cross sectional view and longitudinal cross sectional view of a semiconductor structure obtained in the DRAM manufacturing step in the embodiment of FIG. 35;

FIG. 41 is a plan view of the DRAM structure obtained in another DRAM manufacturing step in the embodiment of FIG. 35;

FIGS. 42A, 42B, 43A and 43B are cross sectional views of the semiconductor structure taken along the bit line direction and word line direction of FIG. 41;

FIGS. 46A and 46B are plan views showing the pattern arrangement of a DRAM according to another embodiment;

FIGS. 47A and 47B are cross sectional views of the DRAM of FIGS. 46A and 46B taken along the A–A' and B–B' lines;

FIGS. 56A and 56B are cross sectional views showing the element structure of a DRAM according to another embodiment;

FIGS. 57A and 57B are cross sectional views showing the element structure of a DRAM according to another embodiment;

FIGS. 58A and 58B are cross sectional views showing the element structure of a DRAM according to another embodiment;

FIGS. 59A and 59B are cross sectional views showing the element structure of a DRAM according to another embodiment;

FIGS. 60A and 60B are cross sectional views showing the element structure of a DRAM according to another embodiment;

FIGS. 61A and 61B are cross sectional views of the DRAM of FIGS. 60A, 60B taken along the A–A' and B–B' lines;

FIGS. 62A and 62B are cross sectional views showing the element structure of a DRAM according to another embodiment;

FIGS. 63A and 63B are cross sectional views showing the element structure of a DRAM according to another embodiment;

FIGS. 66A to 69B are cross sectional views of semiconductor structures obtained in different steps of the first half of the process for manufacturing the DRAM in the embodiment of FIGS. 64A and 64B; and FIGS. 70A to 72B are cross sectional views of semiconductor structures obtained in different steps of the latter half of the process for manufacturing the DRAM in the embodiment of FIGS. 64A and 64B.

DETAILED DESCRIPTION OF THE PREFERRED EMBODIMENTS

Figure 9:
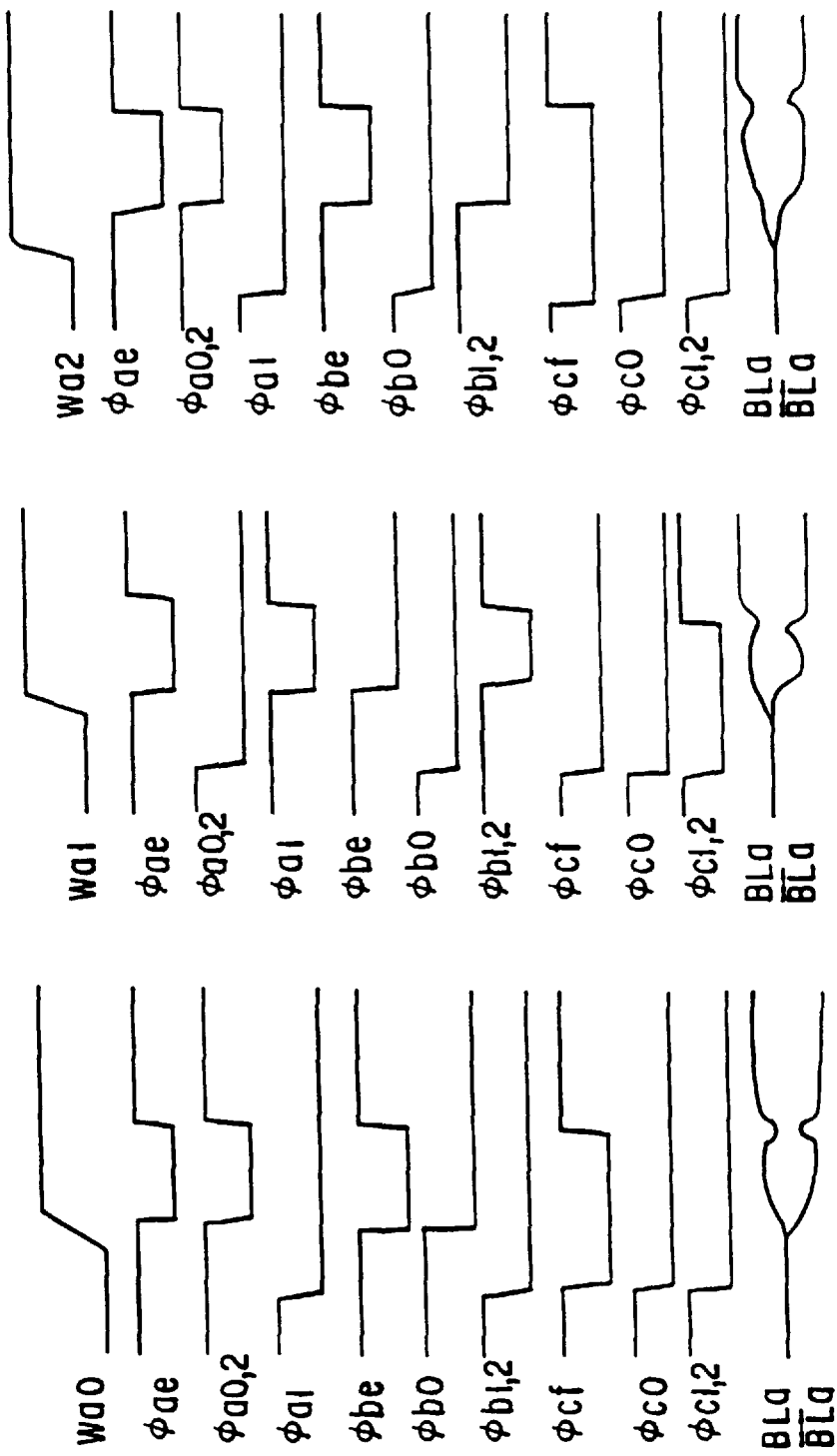
FIGS. 9A–9C are graphic representations of voltages appearing at various points in the memory systems of FIG. 8, plotted as a function of time, wherein FIGS. 9A–9C correspond to the selection of three word lines in a memory-cell subarray, respectively.

A dynamic random access memory (DRAM) device in accordance with one preferred embodiment of the invention is shown in FIG. 1, which illustrates a memory cell array section of it. As shown in FIG. 1, the cell array section is subdivided into a plurality of sections called "memory-cell subarrays" A0, A1, A2, A3, . . . ; two adjacent ones of which are mainly illustrated as subarrays of memory cells A1, A2 for purposes of explanation only. Each of these subarrays A1 and A2 include a plurality of parallel word lines W0, W1 and W2, and a plurality of dummy word lines $\overline{DW0}$, $\overline{DW1}$, $\overline{DW2}$. The word lines extend in a first direction on a chip substrate 10 (shown in is FIG. 2), which is made from semiconductor material such as silicon of a selected conductivity type.

The cell subarrays A1, A2 include a number of parallel bit lines BL0, BL1, BL2, BL3, BL4, BL5, . . . , each of which is provided at its both ends with MOS transistors including transistors Ta, Tb, Tc, Td, Te arranged as shown in FIG. 1. The transistors Ta–Te have gates to which control clock signals φ0,1, φ2 and φE are supplied to control the switching operations of them The bit lines BL extend in a second direction transverse to the first direction on the substrate 10, so that the word lines W, $\overline{DW}$ and bit lines BL define cross-points therebetween. Bit lines BL are specifically arranged to provide a plurality of bit-line pairs as will be described in detail later. In each subarrays A1, A2, a selected number of so-called one-transistor memory cells M are selectively arranged at certain ones of the cross points between word lines W, $\overline{DW}$ and bit line BL.

In each subarray A1, A2, a "unit" bit-line pair structure is defined with every group of three adjacent bit lines being as a unit. In subarray A1, first three bit lines BL3–BL5 are arranged so that the first and third bit lines BL3, BL5 constitute a pair of the "folded" bit-line arrangement, known as a "folded bit-line pair." The second bit line BL4 is connected in parallel with first bit line BL3 at its opposite is nodes. Regarding the first three bit lines BL0–BL2 in subarray A2, the first and third bit lines BL0, BL2 form a pair of the folded bit-line structure, while the second bit line BL1 is coupled to third bit line BL2 at the opposite nodes thereof, as shown in FIG. 1. The following bit-line group each consisting of three neighboring bit lines in each subarray A1, A2 may be similar in configuration to the above-described bit-line arrangement.

As shown in FIG. 1, a sense amplifier circuit SA is provided in an area as defined between the subarrays A1, A2 in such a manner that the sense amplifier has two nodes, one of which is connected to a common node of bit lines BL0, BL3 which extend straight in the second direction, and the other of which is coupled to a common node of bit lines BL2, BL5 also extending in the second direction. A next sense amplifier circuit arranged in the area between subarrays A1, A2 is associated with corresponding two of the following three bit lines in each of subarrays A1, A2 in a similar manner as described above. The above sense-amplifier arrangement may be called a "shared" sense-amplifier system for the "open" bit-line pairs: The sense amplifier senses and amplifies the difference of a potential appearing between a pair of open bit lines extending between subarrays A1, A2.

In the right-end area of the subarray A2, a sense amplifier circuit SA is provided so that it is connected to the bit lines BL0, BL2 forming a folded bit-line pair. This sense amplifier is also connected to two corresponding bit lines included in another memory-cell subarray (A3), which neighbors subarray A2 and is partially illustrated for purposes of illustration only. Such a shared sense amplifier at the right side of subarray A2 may function as a folded bit-line sense amplifier. Similarly, at the left end of the subarray A1, a sense amplifier circuit is arranged so as to be coupled to the bit lines BL3, BL5 constituting a folded bit-line pair. The same sense amplifier is also connected to two corresponding bit lines in a memory-cell subarray (A0), which lies near to subarray A1. The sense amplifier on the left side of subarray A1 has a shared sense amplifier configuration for the folded bit-line system. The sense amplifiers SA and the switching MOS transistors constitute a sense amplifier section of the DRAM.

The positioning of the memory cells M among selected cross-points between the word lines W, $\overline{DW}$ and bit lines BL is as follows. Memory cells M are arranged at $\frac{2}{3}$ of all the word/bit cross points in each subarrays A1, A2. More specifically, with respect to subarray A1, the three bit lines BL3–BL5 and three word lines W0–W2 define nine cross-points therebetween, only six cross-points of which are provided with memory cells M as shown in FIG. 1. Similarly, while the same bit lines BL3–BL5 and three dummy word lines $\overline{DW0}$–$\overline{DW2}$ define nine cross points, only six points of them are provided with memory cells. The same goes with the subarray A2.

The ratio of the number of memory cells versus the total number of word/bit cross-points (say, the "cell distribution" ratio) is $\frac{2}{3}$, which is greater than "$\frac{1}{2}$" which is to be obtained in the case of the conventional DRAMs of the full-folded bit-line type, while it is obviously less than "1" (to be obtained in the case of the prior-art DRAMs of full-open bit-line type). This indicates that each of the memory-cell subarray sections A1, A2 can be decreased in occupation area on the substrate surface as compared with the full-folded bit-line type DRAMs, while causing the sense-amplifier layout design rule to be softened or moderated by allowing a sense-amplifier mount area on substrate 10 (that is, a substrate-surface area used to mount the sense amplifiers associated with subarrays A1, A2) to increase. It is thus possible to overcome successfully the major conflicting problems that have been raised in the full-folded bit-line type DRAMs and in the full-open bit-line type DRAMs.

An explanation will now be given of the distance (or pitch) between adjacent sense amplifiers SA arranged on each side of memory-cell subarray A1, A2. With the embodiment, as shown in FIG. 1, only one sense amplifier SA is provided for the three adjacent bit lines BL0–BL2 (or BL3–BL5). Another saying of this is that each sense amplifier is allowed to occupy, on the substrate surface, an increased surface area that may correspond in length to the width of these three bit lines BL. While such a sense-amplifier area is narrower than that of a full-folded bit-line type DRAMs (which allows a sense amplifier to occupy the area corresponding to the width of four adjacent bit lines), it can be greater than that of the presently available relaxed-open bit-line type DRAMs, which requires that each sense amplifier should be packed within a narrow substrate-surface area corresponding to the width of two adjacent bit lines.

The operation of the embodiment is as follows. Assume that a word line W0 is selected from among the word lines associated with the memory-cell subarray A2. In this case, only the memory cells which are arranged at the cross points between the selected word line W0 and two bit lines BL0 and BL1 of the bit lines BL0–BL2 are subjected to a read operation, permitting cell-data bits to be read out of the memory cells onto the bit: lines BL0, BL1. At this time, only the clock signals $\phi 0,1$ and $\phi E$ of several control clock signals $\phi 0,1$, $\phi 2$ and $\phi E$ being applied to the cell subarray A2 are at a high or "H" level potential; the clock signal $\phi 2$ is forced to remain at a low at "L" level potential. The same is true with respect to the cell subarray A1. The clock signals $\phi 0,1$ and $\phi E$ are at the "H" level, while the clock signal $\phi 2$ is at the "L" level.

Under such a condition, the first and third bit lines BL0, BL2 of the three "unit" bit lines BL0–BL2 constitute or exhibit a folded bit-line pair configuration. The clock signals $\phi E$, $\phi 0,1$ are supplied to the gates of switching transistors (MOSFETs) Ta, Tc, causing these transistors to turn on. This enables the sense amplifier SA connected with the folded bit-line pair BL0, BL2 to sense and amplify the difference between data potentials appearing on these bit lines BL0, BL2. At this time, the bit line BL2 serves as a reference bit line for defining a reference data potential.

The cell-data bit read onto the bit line BL1 is sensed and amplified by a corresponding one of the "open bit-line" sense amplifiers being arranged between the memory-call subarrays A1, A2 in such a manner as follows: when the control clock signal $\phi 0,1$ being supplied to the subarray A2 on the left side thereof and the clock signal $\phi 0,1$ supplied to the subarray A1 on the right side thereof go high at "H" level, causing the switching transistors (MOSFETs) Td, Te to turn on. This enables the bit line BL1 in subarray A2 to be electrically connected to the bit line BL4 included in the neighboring subarray A1 through the sense amplifier SA between subarrays A1, A2, thereby to form an open bit-line pair with the bit line BL4 being as a reference bit line.

In a case where another word line W1 is selected alternatively in the cell subarray A2, a similar read operation is carried out under a condition that the clock signals $\phi e$ and $\phi 0,1$ are at "H" level while the clock signal 02 is at "L" level. When a still another word line W2 is selected, cell-data bits are read onto the bit lines SL0, BL2. When the clock signals $\phi 2$, $\phi E$ are at "H" level, the clock signal $\phi 0,1$ goes down at the "L" level. This permits the bit lines BL0, BL1 to constitute a folded bit-line pair arrangement. The sense amplifier arranged an the right side or subarray A2 (between subarrays A2, A3) senses and amplifies the difference between data potentials appearing on these bit lines BL0, BL1. The bit line BL2 forms an open bit-line pair together with the bit line BL3 of subarray A1; the potential difference therebetween is sensed and amplified by a "open bit-line" sense amplifier arranged between subarrays A1, A2.

As is apparent from the above explanation, the forming position of the folded bit-line pair and that of the open bit-line pair are changed in accordance with the position of a presently selected word line. In other words, the three "unit" bit lines BL0–BL2 (BL3–BL5) in each memory-cell subarray A1, A2 change their bit-line connecting configuration to selectively exhibit either the folded bit-line pair or the open bit-line pair in response to the selection of a word line among the word lines. This enables the DRAM device to overcome the technical problems that take place in the conventional full-folded bit-line type DRAMs and the problems the conventional full-open bit-line type DRAMs and the relaxed-open bit-line type DRAMs, simultaneously.

According to the embodiment as described above, by the combination of an open bit-line system (wherein the memory cells are same in number as the cross points as defined between the bit lines and the word lines) and a folded bit-line system (wherein the number of memory cells is as small as half the number of the cross points between the bit lines and the word lines), it becomes possible to increase the number of memory cells which may be arranged among the cross points between the word lines and bit lines so that the cell number is greater than that of the folded bit-line system, although the number remains less than that of the open bit-line system. Therefore, the cell area can be reduced as compared with the conventional folded bit-line type DRAMs. Furthermore, the layout pitch of the sense amplifier circuits SA along the direction of bit lines (that is, the distance between adjacent sense amplifiers) can be decreased in length as compared with the open bit-line system, which limits the number of allocable sense amplifiers to "1" for two adjacent bit lines in maximum. The decrease in sense-amplifier pitch may cause the sense-amplifier layout design rule to become relaxed or softened as compared with the open bit-line system, although the resulting design rule remains still more severe than that in the folded bit-line system (which allows each sense amplifier to be mounted in an increased substrate-surface area corresponding to the width of four adjacent bit lines).

Conventionally, the relaxed-open bit-line system, which require one sense amplifier to be mounted in the substrate-surface area corresponding to the width of two adjacent bit lines, suffers from an increase in the number of memory-cell subarrays on the substrate, as compared with the full-open bit-line system (which forces one sense amplifier to be arranged in a narrow surface area corresponding the width of a single bit line so that the sense-amplifier layout pitch is extremely small and strict with the on-chip circuit designers). With the DRAM device embodying the invention, by contrast, the sense-amplifier layout pitch can become greater than that of the relaxed-open bit-line system, without causing the number of cell subarrays to increase undesirably. As a result, with the embodiment, it becomes possible to overcome the major technical problems raised in the conventional open bit-line system and those of the folded bit-line system, while allowing the major advantages that come from each of the open bit-line system and the folded bit-line system to maintain in the embodiment.

Note in the embodiment that what is called the "reverse-phase" control scheme may be applied to the H/L-level controlling of the dummy word lines $\overline{DW0}$–$\overline{DW2}$, $\overline{DW3}$–$\overline{DW5}$. More specifically, concerning the dummy word lines $\overline{DW0}$–$\overline{DW2}$ in the memory-cell subarray A2, when W0 is selected and is at the "H" level, the dummy word line $\overline{DW0}$ is potentially changed at "L" level; when the word line W1 is at "H" level, the dummy word line $\overline{DW1}$ is dropped down at "L" level; when the word line W2 is at the "H" level, the dummy word line $\overline{DW2}$ is at "L" level. When the invention is reduced to practice, these dummy word lines may alternatively be modified to operate under a "forward-phase" control scheme; if required, the dummy word lines may be omitted if required.

FIG. 2 illustrates the plan view of a part of the memory cells for use in the DRAM device embodying the invention. The cross sectional view of it along line III—III is shown in FIG. 3. In FIG. 3, the semiconductor substrate is designated by the numeral 10. A semiconductor impurity-diffusion layers 11 are formed in the surface of substrate 10 so that they are spaced apart at a predetermined distance. A plurality of parallel elongate conductive layers 12, 12' are arranged to extend above the substrate 10. These layers act as the word lines WL. The layer 12' is a pass-through word line. A layer 13 having a "Y"-shaped profile is a storage-node. This storage-node layer 13 has two opposite end portions, which partially overlie the word-line layers 12, 12' as shown in FIG. 3. A plate electrode 14 insulatively overlies the storage-node layer 13. An elongate conductive layer 15 is positioned at the top level in FIG. 3, and is arranged to extend in the direction transverse to the word lines 12, 12'. The bit-line layer 15 is electrically contacted with the substrate 10 by way of a contact section 16. Another contact section 17 is provided as a storage-node contact section. The storage-node contact layer 17 has one end portion which partially covers the underlying pass-through word line 12' thereby to function as a part of a data-storage capacitor.

In the memory cells associated with ordinary folded bit-line pairs, four word lines (12) run in a space between two adjacent bit-line contact sections, one of which may correspond to the bit-line contact section 16 of FIG. 3 and another bit-line contact section being connected to a neighboring bit line. In contrast, with the embodiment, the number of such word lines between adjacent bit-line contact sections 16 is decreased down to "three." This memory cell is the cell called the "stack type" memory cell, wherein the bit line 15 is formed after the formation of the plate electrode 14. Another memory-cell structure may be employed alternatively. In either case, the memory-cell area can be decreased as the number of word lines decreases as described above. The storage-node layer 13 may be modified in shape to have a different profile. A memory cell structure, wherein a plate electrode is formed after the formation of a bit line, may be applied to the memory cell. A "trench" type memory cell structure may also to applied which has a narrow, deep groove called a "trench" in the substrate.

A memory cell array of a DRAM shown in FIG. 4 is similar in structure and operation to that of FIG. 1 with the forming positions of the folded bit-line pair and the open bit-line pair is different as will be describe below.

In the embodiment of FIG. 4, assume that the word line W0, W1 is selected in the memory-cell subarray A2. In this case, the clock signal φ0,1 is at the "H" level while the clock signal φ2 is at "L" level. This enables the bit lines SL0, BL2 of subarray A2 to form a folded bit-line pair, and also enables the bit line BL1 of subarray A2 to form an open bit-line pair together with the bit line BL6 belonging to the neighboring subarray A1. When the word line W2 is selected, the clock signal φ2 goes high toward "H" level, while the clock signal φ0,1 is at the "L" level. This results in that the bit lines BL1, BL3 forms a folded bit-line pair in subarray A2; the bit line BL2 of subarray A2 forms an open bit-line pair together with the bit line BL5 in the neighboring subarray A1.

With the embodiment of FIG. 4, the bit-line position is shifted by one with respect to the word lines W0, W1 and word line W2, thus causing one of the bit lines constituting the open bit-line pair to be put between two bit lines presently forming a folded bit-line pair in any event. This means that the folded bit-line pair as presently formed "surrounds" one of the bit lines forming the open bit-line pair on the both sides of it; the folded bit lines may be electrically shielded from each other by the ,inserted, bit line. It is thus possible to suppress or eliminate the occurrence of an internal noise-interference in the folded bit-line pair.

Furthermore, the open bit-line pair can also be improved or enhanced in a noise-reduction effect: Looking at the open bit-line pair, this bit-line pair has each bit line being surrounded by two bit lines forming the folded bit-line pair on the both sides thereof. These folded bit lines are reverse to each other in the "H"/"L" level setting: When one of them is at "H" level, the other is at "L" level; if the one is at "L" level, the other is at "H" level. A noise of the positive polarity δ(+) may occur on a bit line being set at the "H" level due to the sense-amplifying operation of a corresponding sense amplifier circuit; a noise of the negative polarity δ(−) may take place on a bit line being set at the "L" level. These facts indicate that the noises, which are amplified by the sense amplifier to appear on the folded bit lines surrounding the open bit line, become different in polarity from each other. Such the noises δ(+), δ(−) can be easily canceled out when applied onto the open bit line. Therefore, the embodiment can attain a reduced noise-generation successfully, in addition to the above-described advantages of the first embodiment as explained previously.

A memory cell array in accordance with another embodiment of the invention is shown in FIG. 5. The main feature of this cell array is that the "open" sense-amplifier circuits and the "folded" sense-amplifier circuits are alternately positioned in any one of the substrate-surface areas as defined between adjacent ones of the memory-cell subarrays A0–A3. Another saying of this is that the embodiment of FIG. 5 differs from the FIG. 4 embodiment in the layout of open/folded sense amplifiers as follows: While the is FIG. 4 embodiment locates only the open sense amplifiers in the area between subarrays A1, A2 and position only the folded sense amplifiers on the right side of subarray A2 and the left side of subarray A1, the embodiment of FIG. 5 is similar to that of FIG. 4 with the layout positions of sense amplifiers SA being rearranged so that the sense amplifiers for different types of bit line pairs (that is, the open bit-line pairs and the folded bit-line pairs) are disposed alternately in each of the sense-amplifier layout areas as defined between adjacent ones of the subarrays A0–A3 on the substrate.

With such an arrangement, it becomes possible to decrease in number the switching transistors being arranged between the bit lines and the control clock signal transmission lines φ0,1 and φ2 to the extent that only one transistor is necessary for one bit line. Remember that, in the FIG. 4 embodiment, the series array of folded sense-amplifiers on the right side of subarray A2 (or on the left side of subarray A1) require that five transistors should be arranged in the section whereat bit lines BL0–BL3 intersect the clock signal transmission lines φ0,1 and φ2.

Additionally, with the embodiment of FIG. 5, the clock signals φ0,1 and φ2 as employed in FIG. 4 is subdivided into a first group of clock signals φf0,1 and φf2 (the letter "f" stands for "folded") and a second group of clock signals φo0,1 and φo2 (the letter "o" means "open") in order to cause the sense-amplifying operations of the alternately positioned folded/open sense amplifiers to be separated from each other. The technical advantages derived from the embodiment may be similar to those in the prior embodiments.

A memory cell array also embodying the invention is shown in FIG. 6. The main difference of this embodiment from the above embodiments is that the forming positions of the folded bit-line pair and the open bit-line pair are fixed irrespective of the position of a word line as presently selected. In the memory-cell subarray A2, the first and third bit lines BL0, BL2 of three "unit" bit lines BL0–BL2 are arranged to constantly form a folded bit-line pair, which is connected at its right-side nodes to a "folded" sense amplifier circuit. The second bit line BL1 of the three bit lines is arranged to always constitute an open bit-line pair together with a corresponding one of bit lines BL3–BL5 belonging to the neighboring subarray A1, which bit-line pair is connected to one of the sense amplifier circuits arranged between subarrays A1, A2.

Even such an arrangement can achieve the reduction of memory-call area and the increase or "relaxation" of sense-amplifier layout pitch. Simultaneously, the occurrence of a bit-line noise can be minimized due to the fact that any one of an open pair of bit lines is put between two bit lines constituting a corresponding folded bit-line pair associated therewith.

Another difference of the embodiment of FIG. 6 from the prior embodiments is as follows: memory cells are present at all the cross points defined between any one of the two bit lines (BL1, BL4) forming the open bit-line pair and the word lines W0–W5, $\overline{DW0-DW1}$ as shown. These memory cells are arranged linearly on each open bit line BL1, BL4 without having any ,empty word/bit cross points. Concerning the folded bit-line pair BL0, BL2 (or BL3, BL5), half-numbered memory cells are arranged alternately in the line of word/bit cross points along each folded bit line BL1, BL2: Four cells are arranged at eight cross points in each bit line of the folded bit-line pair. Even with such a cell layout, the memory-cell area can be decreased as compared with the conventional folded bit-line system.

Another memory cell system also embodying the invention is shown in FIG. 7. The significant feature of this embodiment is that the "cell distribution" ratio (i.e., the ratio of the number of memory cells versus the total number of word/bit cross-points) is increased as a whole as compared with the embodiments described previously. To do this, an increased number (three) of sense amplifier circuits SA should be required with respect to eight bit lines as provided in each cell-subarray A1, A2. Any one of the bit lines which belong to an open bit-line pair is arranged to extend in a zig-zag manner between adjacent folded bit-line pairs. It is apparent from viewing the illustration of FIG. 7 that the zig-zag line-shape is reversed between adjacent open bit lines so that a hexangular pattern appears at the cross-point area defined between the adjacent open bit lines and three adjacent word lines W0–W2 in subarray A2, for example). The arrangement can remain more excellent than the presently available relaxed-open bit-line pairs in the relaxation of sense-amplifier layout pitch on the substrate.

FIG. 8, comprised of FIGS. 8A and 8B, shows a memory cell array section of a DRAM device in accordance with another embodiment of the inventions which is assumed to include two subarrays A1, A2, for purposes of explanation only. The memory-cell subarrays A1, A2 includes word lines Wa0–Wa2, Wb0–Wb2 and dummy word lines $\overline{DWa0-DWa2}$, $\overline{DWb0-DWb2}$, which extend in parallel with one another. Word lines Wa0–Wa2 and dummy word lines $\overline{Dwa0-DWa2}$ intersect parallel bit lines BL0–BL2 in subarray A2; word lines Wb0–Wb2 and dummy word lines $\overline{DWb0-DWb2}$ intersect parallel bit lines BL3–BL5 in the subarray A1. Memory cells M are arranged selectively at the cross points defined between the bit lines BL0–BL5 and word lines Wa0–Wa2, Wb0–Wb2; memory cells are also arranged at selected ones of the cross points defined between the bit lines BL0–BL5 and dummy word lines $\overline{DWa0-DWa2}$, $\overline{DWb0-DWb2}$ as shown in FIG. 8.

In subarray A2, the bit line BL1 has a first node (the right-side node) connected to the bit line BL0, and a second node (the left-side node) connected to the bit line BL2. In subarray A1, the bit line BL4 has a first node (the right-side node) connected to the bit line BL3, and a second node (the left-side node) connected to the bit line BL5. A sense amplifier SA is provided between subarrays A1, A2 so that it has a first node connected to through switching transistors (MOSFETs) the bit lines BL0, BL3–BL4, and a second node connected to the bit lines connected through MOSFETs to bit lines BL1–BL2 and BL5. The MOSFETs are arranged in bit lines BL0–BL5 respectively as shown in FIG. 8. These MOSFETs have gate electrodes coupled to control clock signals φb0, φb1,2, φbe, φce, φco and φc1,2.

The bit lines BL0–BL2 are provided at their right-side nodes with three MOSFETs, which have gate electrodes coupled to control clock signals φa1, φa0,2 and φae. Other three MOSFETs are arranged on the left-side nodes of bit lines BL3–BL5 in subarray A1; the gates of them are coupled to control clock signals φde, φd0,2 and φd1. Sense amplifiers SA are arranged on the right side of subarray A2 and on the left side of subarray A1 an shown in FIG. 8. Control clock signals φx0,2, φx1, φxe, φy0,2, φy1 and φye are supplied to the gates of MOSFETs, which are connected to further neighboring bit lines (not visible in FIG. 8).

The sense amplifiers SA on the right side of subarray A2 and the shared sense amplifier SA on the left side of subarray A1 are the sense amplifier circuitry that operate in the folded bit-line system. During a read operation, when one is selected from the word lines Wa0–Wa2 in subarray A2, two of the three "unit" bit lines BL0–BL2 has memory cells at the cross points between them and the selected word line. At this time, the MOSFETs responsive to the clock signals φb0, φb1,2 and φbe perform a switching operation, causing one of the two "cell-present" bit lines to form a folded bit-line pair with the remaining "cell-absent" bit line of the three "unit" bit lines BL0–BL2 (as a reference-side bit line), which pair is electrically connected to the first and second nodes of the sense amplifier between subarrays A1, A2. Under such a condition, this sense amplifier may act as a folded bit-line sense amplifier.

During a rewrite operation, the MOSFETs responsive to the clock signals φb0, φb1,2, φbe perform a different switching operation, causing the reference-side bit line of the folded bit-line pair to cut off from the sense amplifier between the subarrays A1, A2, and simultaneously causing the other (i.e., "cell-present" bit line) of the same folded bit-line pair to form an open bit-line pair together with a corresponding one of the three "unit" bit lines BL3–BL5 in the neighboring subarray A1. At this time, the sense amplifier SA between subarrays A1, A2 may serve as an open bit-line sense amplifier.

With such an arrangement, the folded bit-line pair and the open bit-line pair are alternately formed with respect to a presently selected word line in either one of the subarrays A1, A2 in the read and rewrite periods. More specifically, during the read period, two folded bit-line pairs are formed in the subarray A2 including a selected word line with the "cell-absent" bit line being as a c non reference bit line for the two folded bit-line pairs; one of these folded bit-line pairs in subarray A2 is connected to the sense amplifier between subarrays A1, A2, the other of the pairs is connected at the opposite end to the sense amplifier arranged on the right side of subarray A2. During the rewrite period, one of the folded pair of bit lines is rearranged or "disassembled" so that it alternatively form an open bit-line pair together with one of the bit lines BL3–BL5 belonging to the neighboring subarray A1. In case where a word line is selected in the subarray A1, the same goes with it.

With such "alternate folded/open bit-line changeover" control scheme, it becomes possible to eliminate the occurrence of noise inherent to the open bit-line pair, which noise may come by way of the selected word line during the read operation. This may be equivalent to the noise-cancellation effect (that is, canceling out noises coming through non-selected word lines) as attained in the folded bit-line system. The noise-reduction can be improved throughout the read and rewrite operations.

Furthermore, since the data rewrite is carried out under the open bit-line system, the data-restoring and bit-line equalizing operations can be performed by employing an ordinary restoring technique and an ordinary bit-line equalizing technique.

Regarding the "cell distribution" ratio in this embodiment, it is the same as that in the first embodiment as shown in FIG. 1: the ratio of the number of memory cells versus the total number of word/bit cross-points is ⅔, which is greater than "½" which is to be obtained in the case of the conventional DRAMs of the full-folded bit-line type, while it is obviously less than "1" (to obtained in the case of the prior-art DRAMs of full-open bit-line type).

Regarding the sense-amplifier layout pitch, each sense amplifier circuit is allowed to be mounted in an increased substrate-surface area that corresponds to the width of three adjacent bit lines (BL0–BL2). Such three-to-one sense-amplifier distribution feature can relax the circuit design rule on the chip substrate of limited size.

Accordingly, the embodiment of FIG. 8 can solve the three major problems in the prior art DRAM devices: the "increased cell-size" problem in the conventional folded bit-line system, the "decreased sense-amplifier layout-pitch" problem that causes the conventional open bit-line type DRAMs to suffer from the difficulty of sense-amplifier circuit design rule, and the noise problem in the conventional open bit-line system.

The operation of the FIG. 8 embodiment will now be explained with reference to the timing diagrams of FIGS. 9A–9C, which represent three difference cases in accordance with the selection of three word lines Wa0–Wa2 in the cell subarray A2.

Firstly, let's consider the case where the word line Wa0 is selected in the subarray A2. In this case, two "cell-present" bit lines BL0, BL1 of the three "unit" bit lines BL0–BL2 are subjected to a read operation while the remaining, "cell-absent" bit line BL2 acts as a reference bit line. Data-bits are then read onto bit lines BL0, BL1. At this time, the control clock signals φa1, φb1,2 are at the "L" level, whereas the clock signals φae, φa0,2, φb0 are at the "H" level, causing the corresponding MOSFETs to turn on. This enables the bit lines BL0, BL2 to form a folded bit-line pair (the bit line BL2 is a reference data line), which pair is connected at its left-end nodes to the sense amplifier arranged between subarrays A1, A2. The above clock-signal supply also enables the bit lines BL1, BL2 to form another folded bit-line pair (the bit line BL2 is a reference data line), which is connected at its right-end nodes to the sense amplifier arranged on the right side of subarray A2.

After the elapse of a predetermined time during which the data bis are sufficiently read out onto the bit lines BL0, BL1, the clock signals φae, φa0,2, φ be and φ b0 are potentially dropped down at the "L" level, causing all the bit lines BL0–BL2 to be disconnected from the sense amplifiers SA associated therewith. The sense amplifiers SA are then activated to become operative. The difference in potential between the bit lines BL0, BL2 of the folded bit-line pair (as designated by BLb, $\overline{BLb}$ in FIG. 8A) is sensed and amplified by the sense amplifier SA arranged between subarrays A1, A2; the potential difference between the bit lines BL1, BL2 of the other folded bit-line pair (as designated by BLa, $\overline{BLa}$ in FIG. 8B) is sensed and amplified by the sense amplifier SA arranged on the right side of subarray A2.

Thereafter, the DRAM rushes into a rewrite (restore) mode, in which the read data bits are rewritten or restored into the corresponding memory cells. At this time, the control clock signals φ ae, φ a0,2 become at the "H" level again. This permits that the bit lines BL1, BL2 form the folded bit-line pair BLa, $\overline{BLa}$ again, which is connected to the sense amplifier arranged on the right side of subarray A2. The read data held in this sense amplifier is supplied to the once-read memory cell at the cross points between the selected word line Wa0 and the bit line BL1, and is then rewritten into it. Subsequently, the word line Wa0 is forced to drop down in potential. The bit-line equalizing operation is performed by sorting the bit lines BL1, BL2.

During the rewrite period, the read-data rewrite operation for the other folded bit-line pair BLb, $\overline{BLb}$ cannot be performed similarly to the read-data rewrite operation made in the folded bit-line pair BLa, $\overline{BLa}$. This is due to the fact that the bit line BL2 is "busy" in working as the "reference data line" for the folded bit-line pair BLa, $\overline{BLa}$. To cure such an inconvenience, the embodiment is specifically arranged so that the read-data rewrite operation for the other folded bit-line pair BLb, $\overline{BLb}$ is carried out by forcing the bit line BL0 to form an open bit line pair together with a selected one of the three bit lines BL3–BL5 in the neighboring subarray A1, that is, the bit line BL5. To do this, the control clock signals φ be, φ ce go high, causing the corresponding MOSFETs to turn on. This enables the bit line BL0 of subarray A2 and the bit line BL5 of subarray A1 to constitute an open bit-line pair, which incorporates the sense amplifier arranged between subarrays A1, A2. The read data maintained in this sense amplifier is then restored in such a manner that the data of bit line BLb is supplied back to the bit line BL0, and the data of bit line $\overline{BLb}$ is fed to the bit line BL5, thus causing the data to be rewritten into the memory cell at the cross point between the selected word line Wa0 and the bit line BL0. Thereafter, the word line Wa0 potentially drops down; the bit-line equalizing operation is performed by sorting the bit lines BL0, BL5.

As is apparent from the above explanation, by suitably controlling the associated switching MOSFETs using the clock signals φ a1, φ a0,2, φ ae, φ b0, φ b,12 φ be, the twin folded bit-line pairs are formed, during the read period, in such a manner that these folded bit-line pairs uses the bit line BL2 as a common reference data line. During the following rewrite period, the twin folded bit-line pairs are "reformed" into a folded/open combined bit-line pairs in such a manner that, while the bit lines BL1, BL2 are allowed to continuously form the folded bit-line pair (BLa, $\overline{BLa}$) incorporating the sense amplifier arranged on the right side of subarray A2, the bit line BL0 is forced to form a new open bit-line pair (BLb, $\overline{BLb}$) together with the bit line BL5 in the neighboring subarray A1. This means that the read operation is performed under the full folded bit-line system, and the rewrite or restore operation is carried out under the combination of folded/open bit-line pairs. Therefore, it is possible to achieve a successful rewrite and equalize functions, while suppressing the occurrence of noises during the read period to the extent that the resultant noise is as small as in the folded bit-line system.

The timing diagrams shown in FIGS. 9B and 9C indicate respectively the case where a word line Wa1 is selected and the case where a word line Wa2 is selected. These timing diagrams are similar to that of FIG. 9A with the position of a memory cell in subject being different from that in the case of selecting the word line Wa0; due to such cell-position difference, the position of the "folded-to-open changing" bit line (that is, the bit line BL0 in the selection of word line Wa0 as described above) is shifted among the bit lines BL0–BL5 accordingly.

According to the DRAMs embodying the invention, by suitably combining the open bit-line system and the folded bit-line system in the memory cell array section of each DRAM, the memory cell area can be reduced as compared with the full-folded bit-line system, while having the sense-amplifier circuit resign rule relaxed or softened in comparison with the full open bit-line system. This means that the conflicting major requirements can be accomplished simultaneously in one DRAM device.

When the inventive concept of employing a suitably combined open/folded bit-line pairs in a DRAM device is reduced to practice, a three-phase clock signal controller circuitry may be required in order to effectively perform a dummy-cell selection and to control the changeover among the sense amplifiers and the bit lines. This means that any presently available simple binary-number processing/controlling techniques may not be utilized to the embodiments of the invention as described previously; in other words, the well-known binary-based clock-signal control scheme can no longer be used to control the memory cell array embodying the invention. To control it, a specific logic system may be employed which logically converts an input binary number into a corresponding ternary number; a specific 1-bit data corresponding to the most significant digit of such ternary number is used as several control signals for the embodiment devices. The rest of the description will be devoted to the presentation of binary-to-ternary conversion logic circuitry that are preferably adapted to incorporate the embodiments.

In the art of semiconductor devices, any logic circuit has neither been proposed nor developed until today, which circuit performs a binary-to-ternary conversion in such a manner that, when a binary number is input thereto, it divides the binary number by 3 to produce a reminder in the ternary-number format. To achieve such logic circuit, the following considerations are necessary. For example, assume that a binary number of n digits (where n is an integer) is input. A reminder that is obtained by dividing the n-digit binary number by 3 may be represented in the ternary-number format; however, since 2 and 3 is the prime number, an output cannot be determined as far as the signal data sets of all the digits (n). Imagine a four-digit binary number "A3 A2 A1 A0" is input, which corresponds to the decimal number 2. Representing a ternary number {0, 1, 2} by "X0 X1 X2", where one of these Xs becomes 1 at any event, the binary-to-ternary conversion logic is as follows.

TABLE 1

| Binary Number | | | | Ternary Number | | | | Output | | |
|---|---|---|---|---|---|---|---|---|---|---|
| A3 | A2 | A1 | A0 | | | | | X2 | X1 | X0 |
| 0 | 0 | 0 | 0 | 0 | 0 | 0 | 0 | 0 | 0 | 1 |
| 0 | 0 | 0 | 1 | 0 | 0 | 0 | 1 | 0 | 1 | 0 |
| 0 | 0 | 1 | 0 | 0 | 0 | 0 | 2 | 1 | 0 | 0 |
| 0 | 0 | 1 | 1 | 0 | 0 | 1 | 0 | 0 | 0 | 1 |

TABLE 1-continued

| Binary Number | | | | Ternary Number | | | | Output | | |
|---|---|---|---|---|---|---|---|---|---|---|
| A3 | A2 | A1 | A0 | | | | | X2 | X1 | X0 |
| 0 | 1 | 0 | 0 | 0 | 0 | 1 | 1 | 0 | 1 | 0 |
| 0 | 1 | 0 | 1 | 0 | 0 | 1 | 2 | 1 | 0 | 0 |
| 0 | 1 | 1 | 0 | 0 | 0 | 2 | 0 | 0 | 0 | 1 |
| 0 | 1 | 1 | 1 | 0 | 0 | 2 | 1 | 0 | 1 | 0 |
| 1 | 0 | 0 | 0 | 0 | 0 | 2 | 2 | 1 | 0 | 0 |
| 1 | 0 | 0 | 1 | 0 | 1 | 0 | 0 | 0 | 0 | 1 |
| 1 | 0 | 1 | 0 | 0 | 1 | 0 | 1 | 0 | 1 | 0 |
| 1 | 0 | 1 | 1 | 0 | 1 | 0 | 2 | 1 | 0 | 0 |
| 1 | 1 | 0 | 0 | 0 | 1 | 1 | 0 | 0 | 0 | 1 |
| 1 | 1 | 0 | 1 | 0 | 1 | 1 | 1 | 0 | 1 | 0 |
| 1 | 1 | 1 | 0 | 0 | 1 | 1 | 2 | 1 | 0 | 0 |
| 1 | 1 | 1 | 1 | 0 | 1 | 2 | 0 | 0 | 0 | 1 |

As an example, a logic equation wherein X0=1 (that is, a reminder of a quotient obtained by being divided by 3 is 0) is as follows:

$$X0 = (\overline{A3}\,\overline{A2}\,\overline{A1}\,\overline{A0}) + (\overline{A3}\,\overline{A2}\,A1\,A0) + \\ (\overline{A3}\,A2\,A1\,\overline{A0}) + (A3\,\overline{A2}\,\overline{A1}\,A0) + \\ (A3\,A2\,\overline{A1}\,\overline{A0}) + (A3\,A2\,A1\,A0), \quad (1)$$

where, Ai (i=0, 1, 2, 3)={0, 1}.

A corresponding logic circuitry to attain the Formula 1 will be a large-scaled logic circuit, which is very complicated in configuration as it requires an increased number (typically six) of four-input NAND gates having outputs coupled to inputs of a secondary NAND gate having an output whereat an output X0 is generated. A similar large-scaled NAND logic configuration should be required with respect to each of the remaining digits X1, X2 of the ternary number. If the input binary number increases in digit, a resultant logic circuitry will become further complex, thus causing the achievement of it to become difficult on the chip substrate of a limited size as used in highly integrated DRAM devices. Obviously, such a is binary-to-ternary conversion logic circuit has not been required at all among the presently existing semiconductor memory devices.

The embodiments shown in FIGS. 1, 4–5 and 8 are different. These embodiments require such a binary-to-ternary conversion logic circuit. These embodiments further require that the logic circuit is simplified in configuration to attain a miniaturized logic circuitry. Assume that the memory cell array of any one of FIG. 1, 4–5, 8 incorporates an increased number of word lines W0, W1, W2, . . . , W256. It may occur that, when the suffix "i" of a given word line Wi (i=0, 1, 2, . . . , 256) is divided by 3, the reminder is 0 or 1; if this is the case, it should be required that the control clock signal φ0,1 of FIG. 1 (as an example) is at the "H" level. Alternatively, when the reminder is 2, the clock signal φ2 should be required to be at the "H" level. The conventional logic circuits cannot be used to accomplish the above logic function, because the conventional circuit is 8 bits at the inputs thereof (as 256=2⁸), which is too complicated and too large in scale to be used as the logic circuit for producing the reminder in the division by 3.

Figure 10:
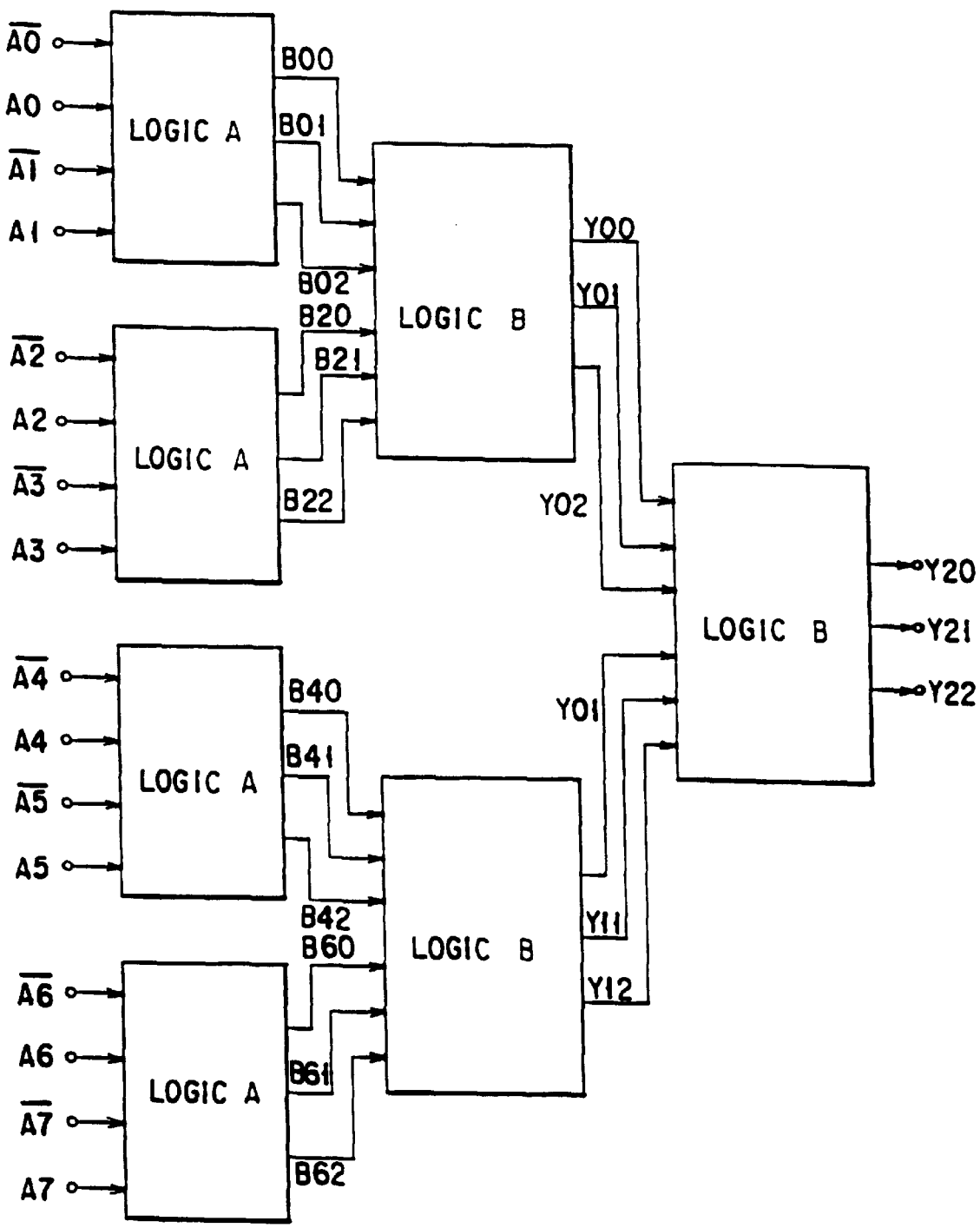
FIG. 10 is a diagram showing a binary to ternary conversion logic circuit which is preferably used in the DRAM devices of the invention.

A binary-to-ternary conversion logic circuit shown in FIG. 10 can overcome the above problems and can thus be preferably applied to any one of the embodiment DRAMs of FIGS. 1–9. The significance of the logic circuit of FIG. 10 is as follows: When a binary number of a plurality of digits (bits) is input, the binary bits are subdivided into sections each having two bits. The bit subdivision is made sequentially from the least significant bit toward the most significant bit of the input binary number. Each of the "bit sections" is supplied to a logic unit (say, logic A), which divides it by 3 to generate at its output a reminder in the ternary number format. The output ternary number is fed to another logic unit (logic B), in which the ternary-number outputs of logic A units are added together in the ternary number format. The least significant bit of a resulting ternary number is then output from the final-stage logic B unit.

More specifically, the logic circuit of FIG. 10 includes a plurality of logic A units in the first stage. Four logic A units are provided under an assumption that the logic circuit deals with a 8-bit (8-digit) binary number "A7 A6 A5 A4 A3 A2 A1 A0" input thereto. Each of the logic A units is arranged to receive an input data corresponding to a 2-digit binary-component of the 8-digit binary number, and to divide the 2-digit data by 3 so that a reminder is produced at the output thereof. The reminder is represented in the ternary number format.

For example, the first logic A unit divides the is 2-digit binary number "A1 A0" by 3 to output a ternary number B0 (="B02 B01 B00") as a reminder. The second logic A unit divides another 2-digit binary number "A3 A2" by 3 to generate a ternary number B2 (="B22 B21 B20") as a reminder. Similarly, the third logic A unit divides a still another 2-digit binary number "A5 A4" by 3 to produce a ternary number B4 (="B42 B41 B40") as a reminder. The fourth logic A unit divides the last 2-digit binary number "A7 A6" by 3 to output a ternary number B6 (="B62 B61 B60") as a reminder.

The ternary-number outputs B0, B2 of the first and second logic A units are supplied to a logic B unit, which adds them together to provide a first sum in the ternary number format. The ternary-number outputs B4, B6 of the third and fourth logic A units are fed to another logic B unit, which adds them together to generate a second sum in the ternary number format. These first and second sums are further supplied to the last-stage logic B unit. This logic unit adds them together to provide the grand total of B0+B2+B4+B6, only the least significant digit of which is then sent forth from the output as the least significant bit Y2 (="Y22 Y21 Y20") as shown in FIG. 10.

As a result of such logic operations, the output data Y2 of the final-stage logic B unit is equivalent to the reminder that is produced when the input 8-digit binary-number is divided by 3. This can be true on the basis of the following analysis. The input binary number "A7 A6 A5 A4 A3 A2 A1 A0" is converted into a corresponding decimal number, which is then subdivided into four sections each consisting of two digits or bits. This may be described quite well by the equation as follows:

$$A7\,A6\,A5\,A4\,A3\,A2\,A1\,A0 \text{ (binary)} = \quad (2)$$

$$A7 \cdot 2^7 + A6 \cdot 2^6 + A5 \cdot 2^5 + A4 \cdot 2^4 +$$

$$A3 \cdot 2^3 + A2 \cdot 2^2 + A1 \cdot 2^1 + A0 \cdot 2^0 \text{ (decimal)} =$$

$$(A7 \cdot 2 + A6) \cdot 2^6 + (A5 \cdot 2 + A4) \cdot 2^4 +$$

$$(A3 \cdot 2 + A2) \cdot 2^2 + (A1 \cdot 2 + A0) \cdot 2^0 \text{ (decimal)}.$$

By converting the binary-number value of each section, we obtain:

$$A7\,A6\,A5\,A4\,A3\,A2\,A1\,A0 \text{ (binary)} = \quad (3)$$

$$(B7 \cdot 3 + B6) \cdot 4^3 + (B5 \cdot 3 + B4) \cdot 4^2 +$$

$$(B3 \cdot 3 + B2) \cdot 4^1 + (B1 \cdot 3 + B0) \cdot 4^0.$$

The relation in the binary-to-ternary conversion in each 2-bit section is as follows:

$$\begin{cases} A7 \cdot 2 + A6 = B7 \cdot 3 + B6, \\ A5 \cdot 2 + A4 = B5 \cdot 3 + B4, \\ A3 \cdot 2 + A2 = B3 \cdot 3 + B2, \\ A1 \cdot 2 + A0 = B1 \cdot 3 + B0, \end{cases} \quad (4)$$

where Bi (i=0, 1, 2)={0, 1, 2}.
Therefore, the binary number may be represented by:

A7 A6 A5 A4 A3 A2 A1 A0 (binary) = (5)

$(B7 \cdot 3 + B6)(3 + 1)^3 + (B5 \cdot 3 + B4)(3 + 1)^2 +$ $(B3 \cdot 3 + B2)(3 + 1)^1 + (B1 \cdot 3 + B0)(3 + 1)^0.$ Obviously, $$(3+1)^n = 3^n + {}_nC_{n-1}3^n + \ldots + {}_nC_1 3^n + 1 = 3K+1, \quad (6)$$

where K is an integer. The relation of Formula 6 is modified by:

$$(3+1)^n = 3K' + (B6+B4+B2+B0). \quad (7)$$

It is apparent from Formula 7 that the reminder to be occurred when the input binary number is divided by 3 is equal to the least significant bit of the second term of Formula 7. Finally, the reminder generated when the 8-digit binary number "A7 A6 A5 A4 A3 A2 A1 A0" is divided by 3 is same in value as a reminder to be generated when the ternary-number sum B6+B4+B2+B0 is divided by 3.

In Formula 4, the relation of A1+A0=B1·3+B0 is represented by Table 2 that follows.

TABLE 2

| A1 | A2 | B1 | B2 | B02 | B01 | B00 |
|----|----|----|----|-----|-----|-----|
| 0  | 0  | 0  | 0  | 0   | 0   | 1   |
| 0  | 1  | 0  | 1  | 0   | 1   | 0   |
| 1  | 0  | 0  | 2  | 1   | 0   | 0   |
| 1  | 1  | 1  | 0  | 0   | 0   | 1   |

The bits B00, B01, B02 are represented by:

$$\begin{cases} B00 = \overline{(A1\,A0)} + (A1\,A0) = \overline{(A1\,A0)} \cdot \overline{(A1\,A0)}, \\ B01 = \overline{A1}\,A0 = \overline{A1 + \overline{A0}}, \\ B02 = A1\,\overline{A0} = \overline{\overline{A1} + A0}. \end{cases} \quad (8)$$

Therefore, the logic relations as defined in Formula 4 may be accomplished by a logic circuitry shown in FIG. 11, which corresponds to the logic A unit of FIG. 10. This is the logic circuit that determines the least significant digit (bit) to be generated when on input binary number is converted into a ternary number.

The logic function of generating the least significant digit (bit) of the ternary-number reminder "B6+B4+B2+B0" as defined in Formula 7 is accomplished by the three logic B units of FIG. 10, wherein the last-stage logic B unit adds the sum results of the pre-stage Logic 3 units in the ternary number format as follows: (B6+B4)+(B2+B0). Each of these logic B unit may be internally arranged as shown in FIG. 13.

In the circuit for outputting the least significant digit value of a finally calculated add result of ternary number, when the addition of B2+B0 is considered (B2 is a ternary number as represented by "B22 B21 B20", B0 is also a ternary number "B02 B01 B00"), the truth table of an output Y0 (=Y02 Y01 Y00) is as follows.

TABLE 2

| B2 | B0 | Y0 | Y02 | Y01 | Y00 |
|----|----|----|-----|-----|-----|
| 0  | 0  | 0  | 1   | 0   | 0   |
| 0  | 1  | 1  | 0   | 1   | 0   |
| 0  | 2  | 2  | 0   | 0   | 1   |
| 1  | 0  | 1  | 0   | 1   | 0   |
| 1  | 1  | 2  | 0   | 0   | 1   |
| 1  | 2  | 0  | 1   | 0   | 0   |
| 2  | 0  | 2  | 0   | 0   | 1   |
| 2  | 1  | 0  | 1   | 0   | 0   |
| 2  | 2  | 1  | 0   | 1   | 0   |

The output of the last-stage logic B unit is represented by:

$$\begin{cases} Y02 = B20 \cdot B00 + B21 \cdot B02 + B22 \cdot B01, \\ Y01 = B20 \cdot B01 + B21 \cdot B00 + B22 \cdot B02, \\ Y00 = B20 \cdot B02 + B21 \cdot B01 + B22 \cdot B00. \end{cases} \quad (9)$$

In case where the input binary number is odd its digit number, a logic circuitry shown in FIG. 13 may preferably used to produce a reminder when the upper three digits of such an odd binary number is divided by 3. The truth table indicating the relation between "A8 A7 A6" and "B60 B61 B60" is shown in Table 4 as presented below.

TABLE 4

| A8 | A7 | A6 | B7 | B6 | B62 | B61 | B60 |
|----|----|----|----|----|-----|-----|-----|
| 0  | 0  | 0  | 0  | 0  | 0   | 0   | 1   |
| 0  | 0  | 1  | 0  | 1  | 0   | 1   | 0   |
| 0  | 1  | 0  | 0  | 2  | 1   | 0   | 0   |
| 0  | 1  | 1  | 1  | 0  | 0   | 0   | 1   |
| 1  | 0  | 0  | 1  | 1  | 0   | 1   | 0   |
| 1  | 0  | 1  | 1  | 2  | 1   | 0   | 0   |
| 1  | 1  | 0  | 2  | 0  | 0   | 0   | 1   |
| 1  | 1  | 1  | 2  | 1  | 0   | 1   | 0   |

The calculation equation for B60 B61 B60 is as follows.

$$\begin{cases} B60 = \overline{A8}\,\overline{A7}\,\overline{A6} + \overline{A8}\,A7\,A6 + A8\,A7\,\overline{A6}, \\ B61 = \overline{A8}\,\overline{A7}\,A6 + A8\,\overline{A7}\,\overline{A6} + A8\,A7\,A6, \\ B62 = \overline{A8}\,A7\,\overline{A6} + A8\,\overline{A7}\,A6. \end{cases} \quad (10)$$

Assume that the binary number is a 9-digit binary number. In this case, a logic circuit may be arranged as shown in FIG. 14. This logic circuit is similar to that of FIG. 10 with one of the logic A units, which has inputs $\overline{A6}$, A6, $\overline{A7}$, A7 and outputs B60, B61, B62, being replaced with the logic circuit of FIG. 13 as a logic C unit. Alternatively, the logic circuit may be arranged as shown in FIG. 15, which employs only the logic A circuits and the logic B circuits of FIG. 10 by utilizing a dummy-digit(s).

FIG. 16 shows an exemplary case where the above binary-to-ternary conversion logic circuit, which provides a reminder when an input binary number is divided by 3, is applied to the open/folded bit-line type DRAM device in accordance with the embodiment of FIG. 1, as a clock signal generator circuit for producing the control clock signals φ0,1 and φ2. The clock signal generator circuit of FIG. 16 receives the Output (that is the least significant bit Y0 of a ternary-number remainder, where Y0 Y22 Y21 Y20) of the binary-to-ternary conversion logic circuit as shown in FIG. 10, 14 or 15; the circuit supplies the clock signals φ0,1 and φ2 to the clock signal transmission lines in the memory cell array of FIG. 1, thereby to control the turn-on/off operations of corresponding ones of the switching MOSFETs. A signal BLOCKi of FIG. 16, which is supplied to one input of a NAND gate, is a signal which can become different in potential with respect to each of the clock signals φ0,1 and φ2. With such a logic configuration, the control clock signal generator incorporating the embodiment DRAM of FIG. 1 can be provided while having the generator more compact in size. Obviously, the clock signal generator circuit of FIG. 16 may also be applied to the others of the aforementioned embodiments as described previously with reference to FIGS. 4, 5 and 8. The above logic circuit may also be employed to the selection of a dummy word line.

Note here that, although the binary number input to the binary-to-ternary conversion logic circuit is subdivided into sections each consisting of two digits in the above embodiments, it may alternatively be arranged so that the input binary number is subdivided into sections each consisting of four digits. One preferred embodiment of such a logic circuit is shown in FIG. 17. The logic circuit may also be accomplished by making use of smaller circuits in such a manner that, in stead of a circuit configuration using ordinary CMOS transistors, a specific circuit is employed which forces X0, X1, X2 to be fed back to other circuits respectively (for example, X0 is fed back to X1, X2 of another circuit) and to latched therein. In this case, the circuit configuration can be further miniaturized.

Figure 18A:
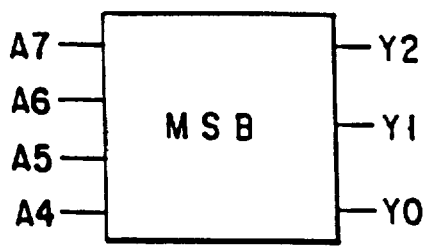
FIGS. 18A–18D illustrate four possible logic-circuit configurations which may be applied to the logic circuit of FIG. 17, each of which is arranged to generate the lower one-digit of an arithmetic sum of the outputs of the FIG. 17 circuit.
Figure 18B:
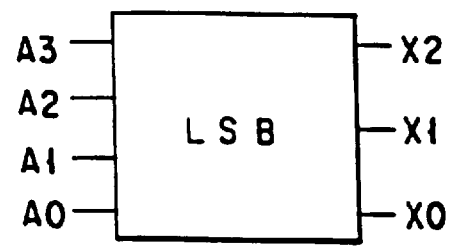
Figure 18C:
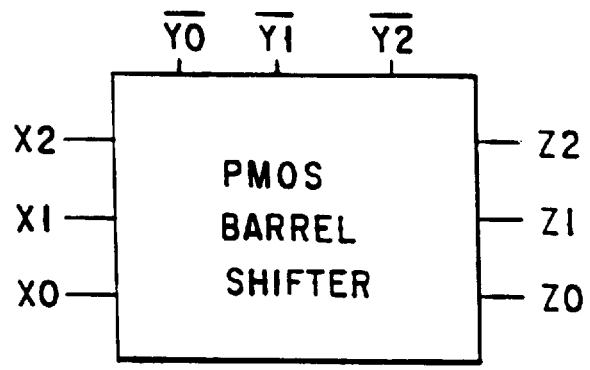
Figure 18D:
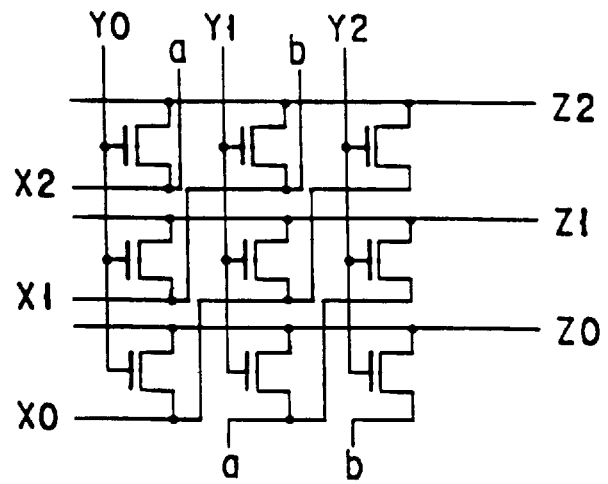

Four possible exemplary circuits are illustrated in FIGS. 18A–18D, each of which is a circuit section for outputting the least significant digit (bit) of a sum of the outputs of the circuit of FIG. 17, and which is arranged using a shifter rather than the logic B circuit of FIG. 12. The circuits of FIGS. 18A and 18B are similar to that of FIG. 17. The circuit of FIG. 18C is a PMOS barrel shifter circuit, the internal configuration of which is shown in FIG. 18D. The truth table of the circuit of FIGS. 18C–18D is as follows:

TABLE 5

| Yi | Xi | Ternary Number | Z2 | Z1 | Z0 |
|----|----|----|----|----|----|
| 0 | 0 | 0 | 0 | 0 | 1 |
| 0 | 1 | 1 | 0 | 1 | 0 |
| 0 | 2 | 2 | 1 | 0 | 0 |
| 1 | 0 | 1 | 0 | 1 | 0 |
| 1 | 1 | 2 | 1 | 0 | 0 |
| 1 | 2 | 0 | 0 | 0 | 1 |
| 2 | 0 | 2 | 1 | 0 | 0 |
| 2 | 1 | 0 | 0 | 0 | 1 |
| 2 | 2 | 1 | 0 | 1 | 0 |

The above arrangement of subdividing the input binary number into 2-digit sections may be modified as follows. Now the input binary number is assumed to be 5-digit number for purposes of explanation. Letting the 5-digit binary number be represented by "A4 A3 A2 A1 A0", the number is specifically subdivided into sections as follows:

$$A4\,A3\,A2\,A1\,A0 = \quad (11)$$

$$A4 \cdot 2^4 + A3 \cdot 2^3 + A2 \cdot 2^2 + A1 \cdot 2^1 + A0 \cdot 2^0 =$$

$$(A4 \cdot 2 + A3) \cdot 2^3 + A2 \cdot 2^2 + A1 \cdot 2^1 + A0 =$$

$$2(A4 \cdot 2 + A3)(3+1) + A2 \cdot 2^2 + A1 \cdot 2^1 + A0 =$$

$$2(B4 \cdot 3 + B3)(3+1) + B2 \cdot 9 + B1 \cdot 3 + B0 =$$

$$3K' + (B3 + B3 + B0).$$

If the resultant least significant digit (bit) of each section is $2^{2n-2}$ (n is an integer), an output ternary number is subjected to an adding process in the ternary number format. If the least significant digit is $2^{2n-1}$, an output is doubled in the ternary number format; alternatively, the output may be subjected to the adding process twice in the ternary number format to generate an added result that is a ternary number having the least significant digit, which is then sent forth as an output.

As is apparent from the above explanation, with the binary-to-ternary conversion logic circuit embodying the invention, it becomes possible to provide a reminder of an input binary number being divided by 3 while the required circuit for attaining the logic function can be simplified in configuration. This means that the applicability can be expanded. In particular, such a binary-to-ternary conversion logic circuit can preferably be applied to the highly integrated open/folded bit-line type DRAMs as described previously with reference to FIGS. 1–9, as a control clock signal generator circuit. Conventionally, in case where a remainder is calculated when a multiple-digit binary number is divided by 3, each of a number of inputs is subjected to a logical sum (AND) process with the result of a corresponding logic circuit being complicated in configuration, thus requiring the necessary chip area to increase. In contrast, with the embodiment, a ternary number is calculated by (1) subdividing an input binary number into unit section of predetermined digits with respect to the entire digits between the least significant digit and the most significant digit, (2) dividing each section by 3, (3) calculating a resultant reminder for each section, and (4) adding the outputs together in the ternary number format. The least significant digit (bit) of such ternary number is specifically used in the generation of control clock signals φ0,1 and φ2. This can make a corresponding logic circuit more simple in configuration even if the total digit number of an input binary number is increased.

Next, the embodiments relating to various structures of DRAM of the above-described open bit line and folded bit line configuration are explained with reference to FIGS. 19 to 72B.

FIG. 19 shows a plane structure of the pattern arrangement of the DRAM. According to this arrangement, a plurality of word lines 111 and bit lines 112 are arranged to intersect each other and a plurality of active regions 114 are arranged such that the adjacent regions thereof in the word line direction are deviated from each other in the bit line direction. The plurality of active regions 114 are separated from one another by element isolation trenches 113. In each of the active regions 114, a MOS transistor whose gate is formed of the word line 111 and whose source or drain is connected to the bit line 112 and a trench capacitor are formed.

In the arrangement of the word lines 111, one through word line is laid for every two cells. That is, a through word line is arranged between the word lines connected to the two cells which are adjacent to each other in the bit line direction. The through word line passes over the element isolation region. Capacitor trenches 115 are deviated in the same direction of the word line direction in relation to the active region 114 and deviated from the word line 111 in a direction towards the adjacent through word lines. A strap 116 is formed on each trench 115 and connected to one of the source and drain and a storage electrode inside the trench 115 and the other of the source and drain is connected to the bit line 112 via a bit line contact 117.

FIGS. 20A and 20B show cross sections taken along the A–A' and B–B' lines of FIG. 19. A p-type well 122 is formed on an n-type well (or substrate) 121, the n-type well 121 is used as a substrate plate electrode, and a storage electrode 24 is filled in the trench 115 with a capacitor insulative film 123 disposed therebetween so as to form a trench capacitor.

Further, an insulative material is filled in the element isolation trench 113 and source and drain diffusion layers 125 of the MOS transistor are formed in the surface of the p-type well 122.

Figure 21:
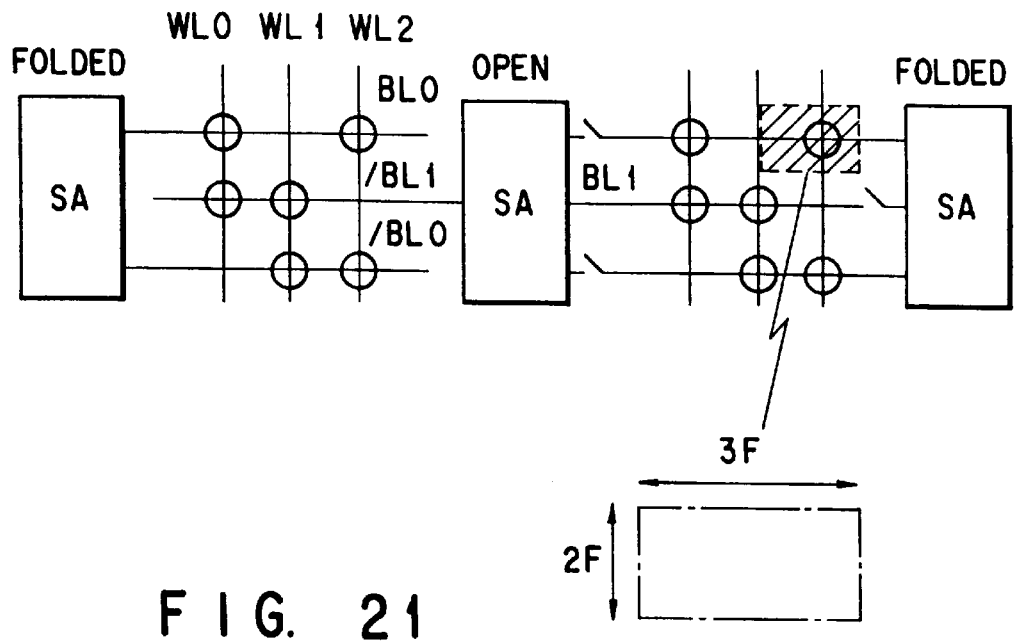
FIG. 21 is a diagram showing the connection relation between cell arrays and sense amplifiers in the embodiment of FIG. 19.

FIG. 21 shows the connection between sense amplifiers SA and cell arrays in this embodiment. Memory cells are indicated by ○ marks. Part of a plurality of bit lines BL are connected to a first sense amplifier (Open SA) and construct a sense system of open bit line configuration in cooperation with bit lines of a different cell array connected to the first sense amplifier and arranged on the opposite side with respect to the first sense amplifier, and the remaining part of the bit lines are connected to a second sense amplifier (Folded SA) arranged on the opposite side of the first sense amplifier to make bit line pairs so as to realize a sense scheme of folded bit line configuration.

With the above construction, a DRAM of cell size of 2F×3F=6F² in which random access can be made and noise is small and which has trench capacitor type memory cells can be realized. Further, the bad influence of the trench 115 on the transfer gate can be prevented without increasing the cell size by deviating the capacitor trench 115 in a direction towards the through word line, that is, by setting the trenches 115 adjacent in the bit line direction closer to each other.

Figure 22:
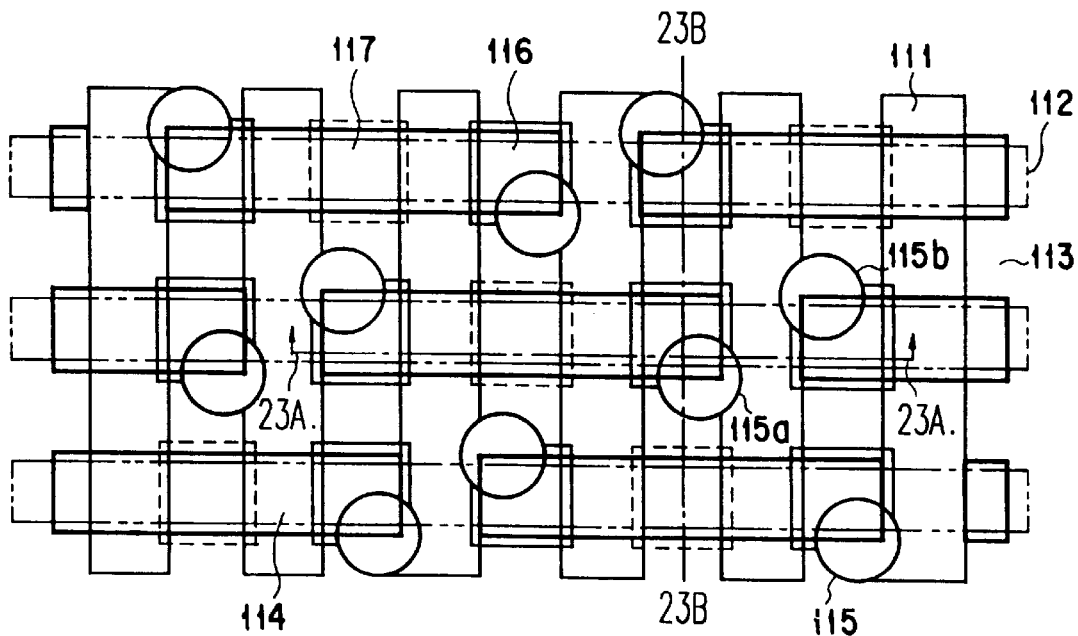
FIG. 22 is a plan view showing the pattern arrangement of a DRAM according to another embodiment of this invention.

FIG. 22 shows a plane structure of the pattern arrangement of a DRAM according to another embodiment, and FIGS. 23A and 23B show cross sections taken along the A–A' and B–B' lines of FIG. 22. Portions which are the same as those of FIGS. 19 and 20 are denoted by the same reference numerals and the detail explanation therefor is omitted.

The basic structure is the same as that of the embodiment of FIG. 19, but in this embodiment, capacitor trenches 115 are deviated not in the same direction but in the opposite directions with respect to the active region in the cells adjacent to each other in the bit line direction, that is, in the opposite direction with respect to the word line direction. That is, in the embodiment of FIG. 19, the adjacent capacitor trenches 115 are linearly arranged in the direction along the bit line 112. In contrast, in the embodiment of FIG. 22, capacitor trenches 115a and 115b adjacent to each other are arranged in positions deviated in the direction of the word line 111 with respect to the direction of the bit line 112. That is, as shown in the cross sectional view of FIG. 23A, the trench 115b is disposed on the farther side of the trench 115a. The trenches 115 adjacent to each other in the direction of the word line are arranged with a constant distance therebetween, but the trenches 115 adjacent to each other in the word line direction are slightly deviated in the bit line direction.

FIGS. 24A to 27B are cross sectional views respectively indicating the steps of a method of manufacturing the semiconductor memory device according to the second embodiment of FIG. 22, for illustrating the manufacturing method. In the above drawings, FIGS. 24A, 25A, 26A and 27A are cross sections taken along the A–A' line of FIG. 20, and FIGS. 24B, 25B, 26B and 27B are cross sections taken along the B–B' line of FIG. 20.

In FIGS. 24A and 24B, a semiconductor structure formed by forming an n-type well 121 to be used as a plate, forming capacitor trenches 115 by RIE (reactive ion etching), forming capacitor insulative films 123 (each of which is a composite film of a silicon nitride film and an oxide film, for example), filling storage electrodes 124 (each of which is formed of polysilicon for example) into the respective trenches by CDE (chemical dry etching) or polishing is shown.

In FIGS. 25A and 25B, a semiconductor structure formed by forming shallow element isolation trenches 113 by RIE, filling an insulative film into the trenches by CDE or polishing, forming a gate oxide film, forming gate electrodes (word lines 111), and forming source/drain diffusion layers 125 by ion injection is shown.

In FIGS. 26A and 263, a semiconductor structure formed by depositing an inter-level insulation film (PSG (Phosphor-Silicate Glass) or BPSG (Boron doped Phosphor-Silicate Glass)), planarizing the structure by melting or polishing, and forming contact holes for the strap electrodes by RIE is shown.

FIGS. 27A and 27B show a semiconductor structure formed by forming the strap electrodes 116 (each of which is formed of polysilicon, for example) by CDE or polishing, forming the bit line contacts 117 by RIE, and forming the bit lines 112.

With the above structure, the same effect as that of the embodiment of FIG. 19 can be attained and the distance between the adjacent trenches 115 can be made longer than in the case of the embodiment of FIG. 19, thereby making it possible to stably isolate the trenches from each other.

Figure 28:
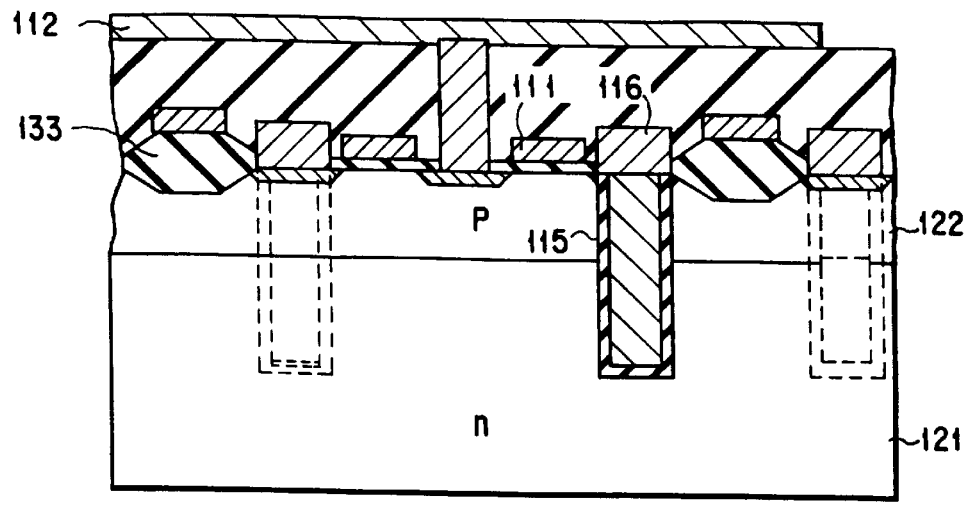
FIG. 28 is a cross sectional view showing the element structure of a DRAM according to another embodiment.

FIG. 28 is a cross sectional view taken along the bit line direction and showing the element structure of a DRAM according to another embodiment. Portions which are the same as those of FIG. 20 are denoted by the same reference numerals and the detail explanation therefor is omitted.

The basic structure is the same as that of the embodiment of FIG. 19, but in this embodiment, the element isolation is attained not by the trenches, but by field oxide films 133 formed by the LOCOS (LOCal Oxidation of Silicon) method. With this structure, the same effect as that of the embodiment of FIG. 19 can be attained.

Figure 29:
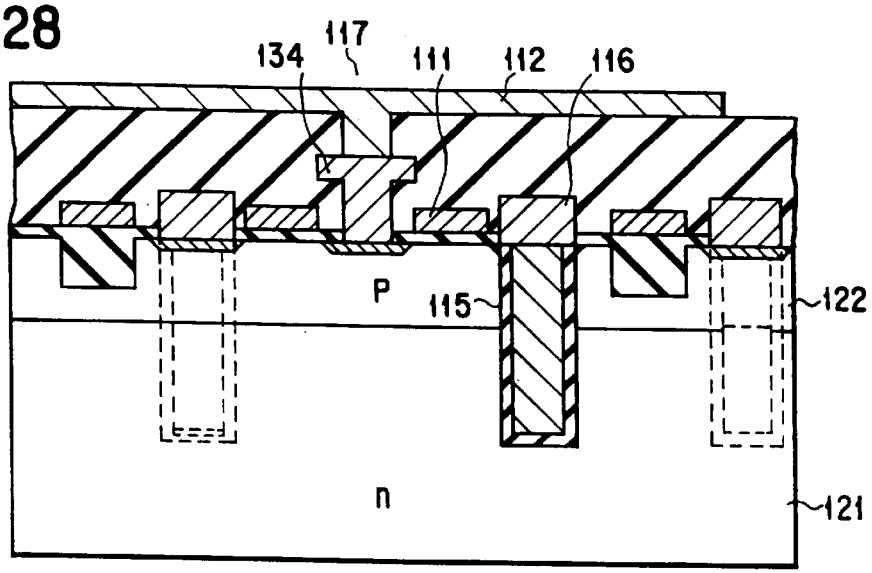
FIG. 29 is a cross sectional view showing the element structure of a DRAM according to another embodiment.

FIG. 29 is a cross sectional view taken along the bit line direction and showing the element structure of another embodiment. This embodiment is an example in which the contact of the strap 116 is also formed below the bit line contact 117 and a pad electrode 134 is formed only under the bit line contact 117.

In this embodiment, the strap electrode 116 on the trench 115 can be formed at the same time that the pad electrode 134 is processed. In this embodiment, a material which is difficult to increase junction leak can be used for a portion under the bit line contact 117 and strap portion.

Figure 30:
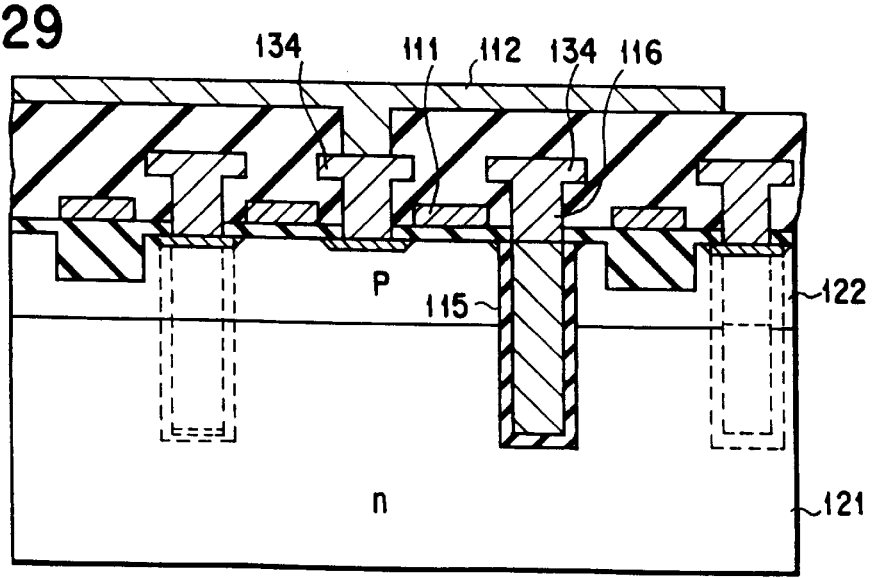
FIG. 30 is a cross sectional view showing the element structure of a DRAM according to another embodiment.

FIG. 30 is a cross sectional view taken along the bit line direction and showing the element structure of another embodiment. This embodiment is an example in which pad electrodes 134 are also formed on the trenches 115. With this structure, the strap electrode 134 can be stably formed by RIE even if stepped portions of the gate electrode are left behind on the cells and circuit portion.

FIG. 31 is a cross sectional view taken along the bit line direction and showing the element structure of another embodiment. This embodiment is an example in which strap electrodes 136 are formed by selective deposition (silicon film or silicide film). With this structure, the pattern of the strap electrodes 116 in FIGS. 19 and 22 can be omitted and the step can be simplified.

FIG. 32 is a cross sectional view taken along the bit line direction and showing the element structure of another embodiment. This embodiment is an example in which the device is formed on an SOI substrate (Silicon On Insulating substrate), and a silicon substrate 140, insulative film 141 and silicon crystal layer 142 are sequentially stacked.

This embodiment has advantages that the cut-off characteristic of the transfer gate is enhanced, the soft error is improved, and the pause characteristic is enhanced.

FIG. 33 is a cross sectional view taken along the bit line direction and showing the element structure of another embodiment. In this embodiment, trench capacitors are formed in the SOI substrate, storage electrodes 124 and silicon layers 143 are connected by is whole-surface epitaxial, and the active regions are formed by the processing such as LOCOS method or RIE.

In this embodiment, the pattern of the strap electrodes 116 can be omitted and the manufacturing process can be simplified. Further, even if impurity is diffused from the storage electrodes into the epitaxial layer, the influence on the transfer gate can be prevented by deviating the trenches 115 in the direction of the word line 111 as in the pattern of FIGS. 19 and 22.

FIG. 34 is a cross sectional view taken along the bit line direction and showing the element structure of another embodiment. In this embodiment, a method of forming an epitaxial layer 143 on the silicon substrate 140 to connect storage electrodes 124 to the substrate 140 is used and this embodiment has an advantage that a substrate which is less expensive than the SOI substrate can be used.

FIG. 35 is a plan view showing the pattern arrangement of a DRAM according to another embodiment. FIGS. 36A and 362 are cross sectional views taken along the A–A' and B–B' lines of FIG. 35. Portions which are the same as those of FIGS. 19 and 20 are denoted by the same reference numerals and the detail explanation therefor is omitted.

In the arrangement of the word lines 111, one through word line is laid for every two cells and the through word line passes over the element isolation region. Capacitor trenches 115 are deviated in the word line direction with respect to the active regions 114 and arranged to be set in contact with bit line contacts 117 of the adjacent cells. Further, the trenches 115 adjacent to each other with the through word line disposed therebetween are arranged to be set closer to each other.

Straps (connection electrodes) 116 are formed on the trenches 115, the connection electrode 116 connects one of the source and drain to a storage electrode 124 in the trench 115, and the other of the source and drain is connected to a bit line 112 via a bit line contact 117.

The manufacturing method of this embodiment is explained with reference to FIGS. 37A to 45C.

FIG. 37A is a plan view of the DRAM, FIG. 37B is a cross sectional view taken along the line A–A' (bit line direction) of FIG. 37A, FIG. 37C is a cross sectional view taken along the line B–B' (word line direction) of FIG. 37A, and an n-type well 121 to be used as a plate is formed, trenches 115 are formed by RIE, capacitor insulative films (not shown) are formed, and storage electrodes 124 (each of which is formed of polysilicon , for example) are filled therein and formed by CDE or polishing. In FIGS. 37A and 37B, a mask 151 used for formation of the trenches and oxide films 152 for preventing inversion are shown.

Figure 38:
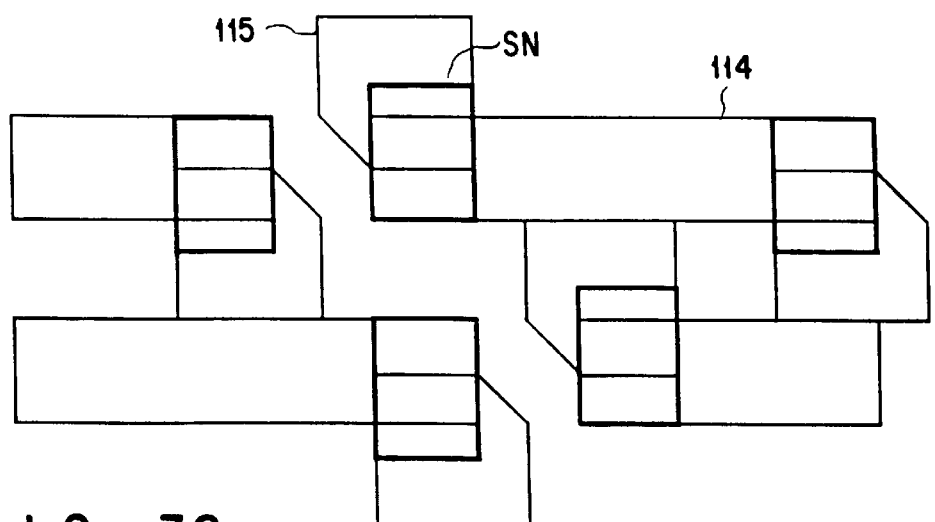
FIG. 38 is a plan view of the DRAM structure obtained in the DRAM manufacturing step in the embodiment of FIG. 35.
Figures 39A, 39B:
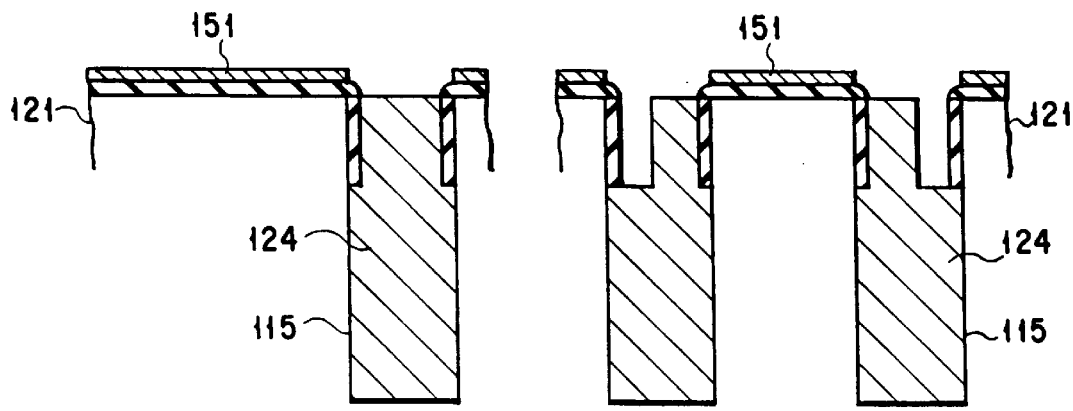
FIGS. 39A, 39B, 40A and 40B are cross sectional views of the DRAMs taken along the A–A' and B–B' lines of FIG. 37A.
Figures 40A, 40B:
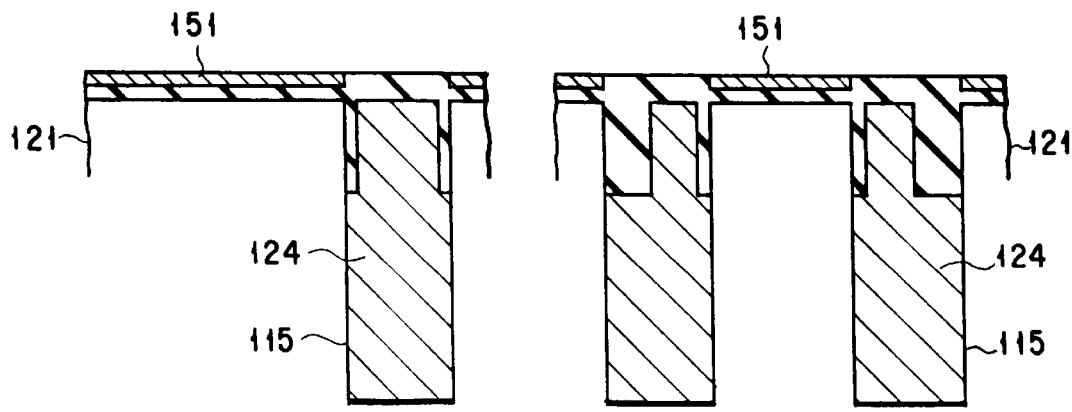

FIG. 38 is a plan view, FIGS. 39A and 40A are cross sectional views taken along the bit line direction, FIGS. 39B and 40B are cross sectional views taken along the word line direction. FIGS. 39A and 39B show a step of digging the storage electrodes in the trenches 115 with a pattern of SN poly-etching mask (resist) shown in FIG. 38 and FIGS. 40 and 40B show a step of filling insulative films into the dug portions of the storage electrodes (RIE, CDE, polishing process).

FIG. 41 is a plan view, FIGS. 42A and 43A are cross sectional views taken along the bit line direction, FIGS. 42B and 43B are cross sectional views taken along the word line direction. FIGS. 42A and 42B show a step of forming shallow element isolation trenches 113 by RIE and filling and forming insulative films in the trenches by RIE, CDE or polishing and FIGS. 43A and 435 show a stop of removing the mask material 151 used for formation of the trenches (silicon nitride film).

Figure 44A:
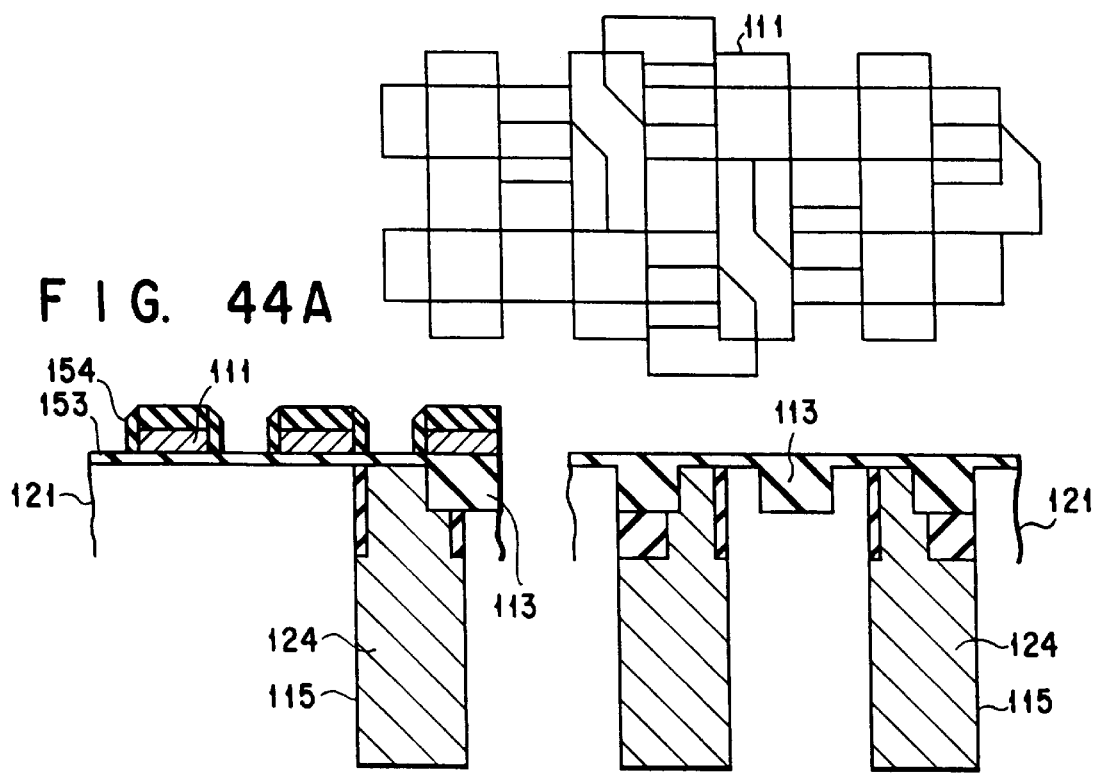
FIGS. 44A to 44C are a plan view, lateral cross sectional view and longitudinal cross sectional view of a semiconductor structure obtained in another DRAM manufacturing step in the embodiment of FIG. 35.
Figures 44B, 44C:
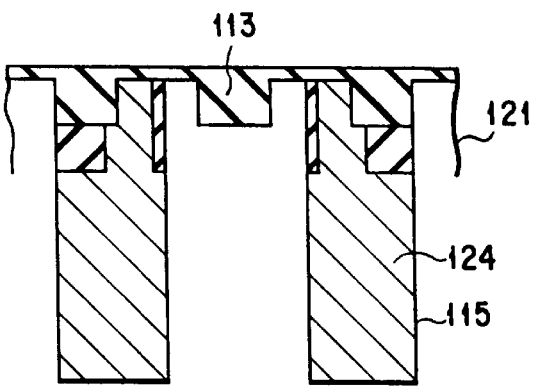

FIG. 44A is a plan view, FIG. 44B is a cross sectional view taken along the bit line direction, FIG. 44C is a cross sectional view taken along the word line direction, and a step of forming a gate oxide film, forming gate electrodes (word lines 111), and forming sources and drains by ion injection is shown. In FIG. 44B, an insulative film 154 covers the side walls and upper surface of the word line on the gate oxide film 153.

Figure 45A:
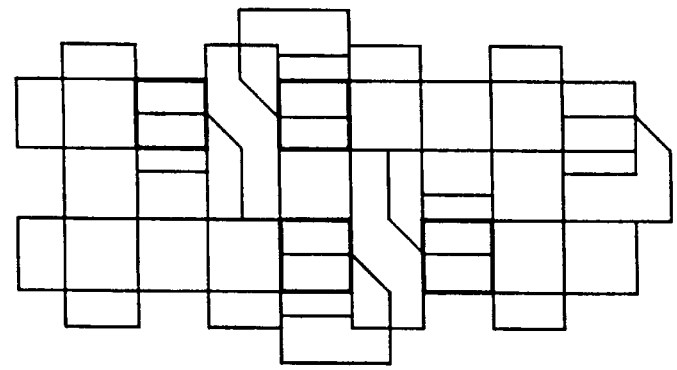
FIGS. 45A to 45C are a plan view, lateral cross sectional view and longitudinal cross sectional view of a semiconductor structure obtained in another DRAM manufacturing step in the embodiment of FIG. 35.
Figures 45B, 45C:
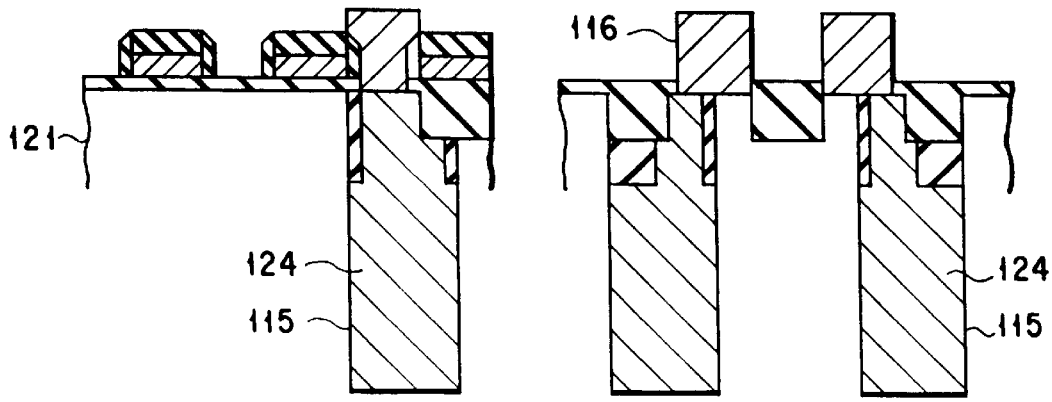

FIG. 45A is a plan view of a DRAM, FIG. 45B is a cross sectional view taken along the bit line direction, and FIG. 45C is a cross sectional view taken along the word line direction. FIGS. 45A, 45B and 45C show a semiconductor structure formed by deposition of an inter-level insulative film (PSG or BPSG), planarization thereof by melting or polishing, formation of contacts for straps by RIE, filling and formation of strap electrodes 16 (for example, polysilicon) by CDE or polishing.

After this, the memory cells shown in FIGS. 35 and 36 are completed by forming bit line contacts 117 by RIE and forming bit lines 112.

With the above structure, it is, of course, possible to attain the same effect as that of the embodiment of FIG. 19 and the following effect can be attained. That is, the short circuit between the bit line 112 and the storage electrode 124 can be prevented by digging those portions of the storage electrode 124 filled in the trench 115 which lie adjacent to the bit line contacts of the adjacent cells. Therefore, the size of the trench 115 can be increased without increasing the cell size.

FIGS. 46A and 46B are plan views showing the pattern arrangement of a DRAM according to another embodiment, FIG. 46A shows the state set before SN polysilicon layers are formed and FIG. 46B shows the state set after the SN polysilicon layers are formed. Embodiments explained after this are examples in which stack capacitors are used instead of the trench capacitors.

A plurality of word lines 161 and bit lines 162 are arranged to intersect each other at right angles and a plurality of active regions 164 are formed by element isolation trenches 163. In each of the active regions 164, a MOS transistor in which one of the source and drain is connected to the bit line 162 via the bit line contact 167 and a capacitor are formed.

In the word line arrangement, one through word line is laid for every to cells and the through word line passes over the element isolation region. Lead electrodes 166 are formed on the storage node contact side on the active regions 164 and the lead electrode 166 are deviated in one direction of the word line direction (in the downward direction in the drawing) with respect to the memory cell. The bit lines 162 are deviated in a direction (in the upward direction in the drawing) opposite to the deviation direction of the lead electrodes 166 with respect to the memory cell, and therefore, the lead electrodes 166 are arranged between the bit lines. Storage node contacts 165 are formed on the lead electrodes 166 and storage electrodes (storage node (SN) polysilicon layers) 168 are formed on the storage node contacts 165.

FIGS. 47A and 47B are diagrams corresponding to cross sections taken along the lines A–A' and B–B' of FIGS. 46A and 46B. In this example, contact holes are formed in a layer in contact portions between the lead electrodes 166 and the sources or drains under the bit line contacts 167 and electrode material 166a (for example, polysilicon) is filled therein at the same time of formation of the lead electrodes 166.

FIGS. 48A to 55B are cross sectional views respectively indicating the steps of the manufacturing method according to this embodiment, for illustrating the manufacturing method, and the left-hand portions in FIGS. 48A to 55A correspond to cross sections taken along the A–A' line of FIG. 46A and the right-hand portions thereof correspond to cross sections taken along the B–B' line of FIG. 46A.

Figure 48A:
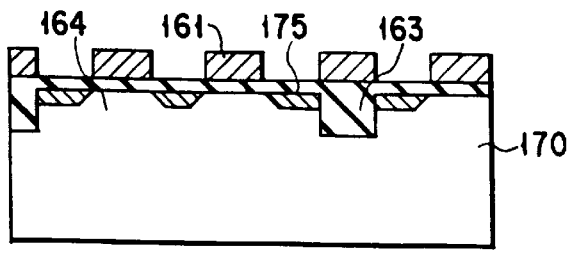
FIGS. 48A to 52B are cross sectional views of semiconductor structures obtained in different steps of the first half of the process for manufacturing the DRAM of FIGS. 46A and 46B.
Figure 48B:
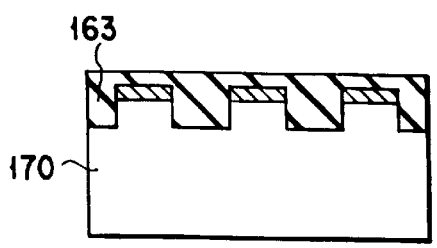

First, as shown in FIGS. 48A and 48B, trench isolation regions (or element isolation regions by LOCOS method) 163 are formed on a substrate 170 to form active regions 164 in an island form. Then, source and drain diffusion layers 175 and gate electrodes (word lines) 161 are formed in each of the active regions 164 to form MOS transistors.

Figure 49A:
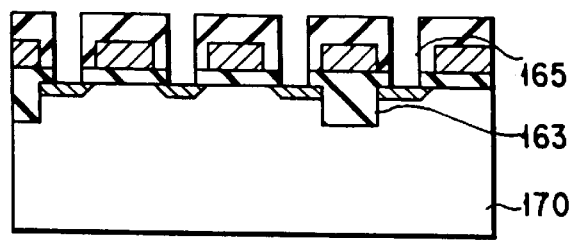
Figure 49B:
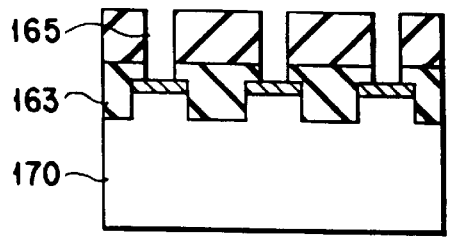
Figure 50A:
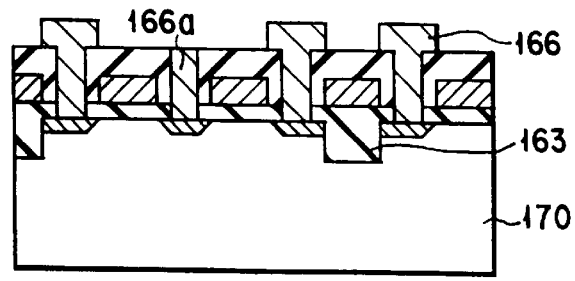
Figure 50B:
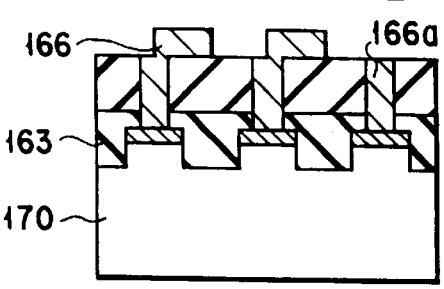
Figure 51A:
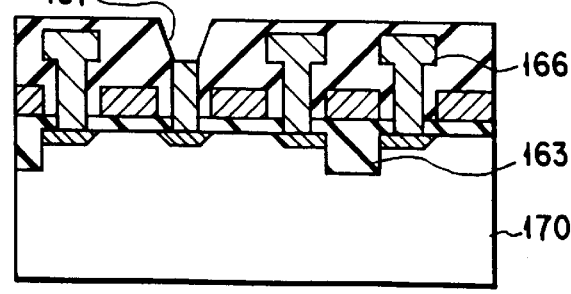
Figure 51B:
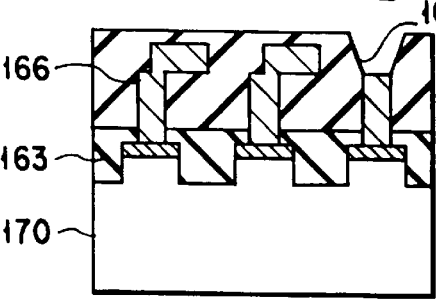
Figure 52A:
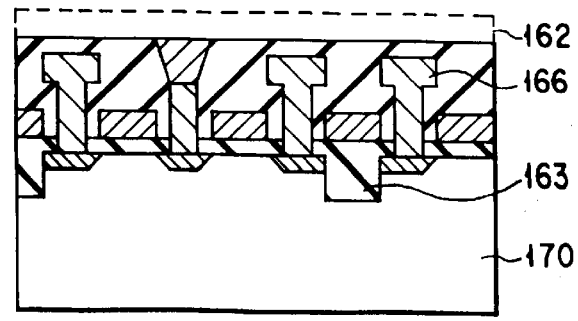
Figure 52B:
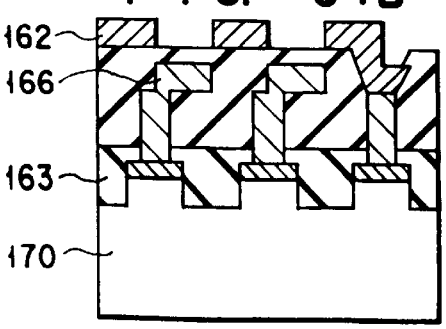

Next, as shown in FIGS. 49A and 49B, first SN contact holes 165 are formed on the source and drain regions, and as shown in FIGS. 50A and 50B, lead electrodes (for example, polysilicon) 166 are deposited and processed by RIE, and at the same time, electrode materials 166a are buried under the bit line contacts. Then, as shown in FIG. 51A, bit line contact holes 167 are formed, and as shown in FIGS. 52A and 52B, bit lines (for example, tungsten or tungsten polycide) 162 are deposited and processed by RIE.

Figure 53A:
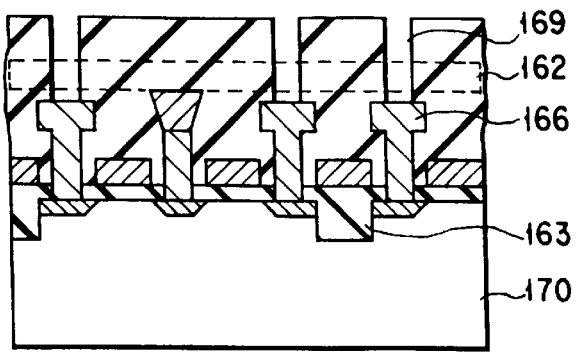
FIGS. 53A to 55B are cross sectional views of semiconductor structures obtained in different steps of the latter half of the process for manufacturing the DRAM of FIGS. 46A and 46B.
Figure 53B:
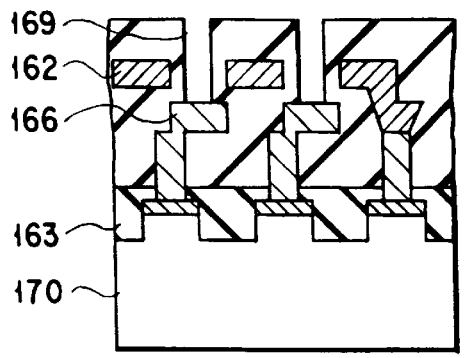
Figure 54A:
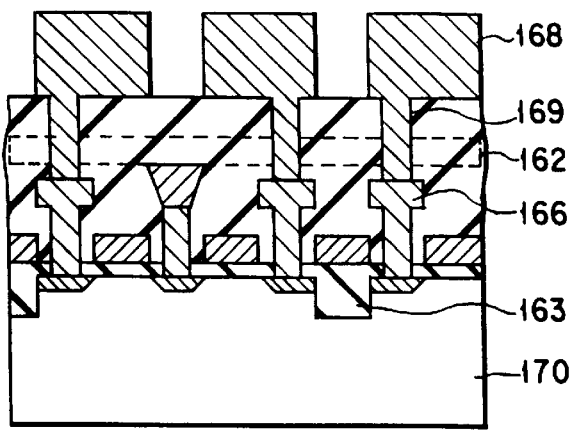
Figure 54B:
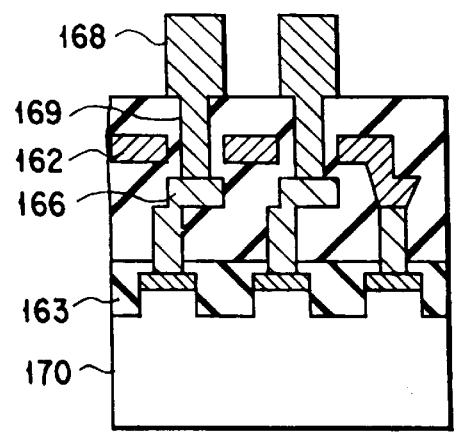
Figure 55A:
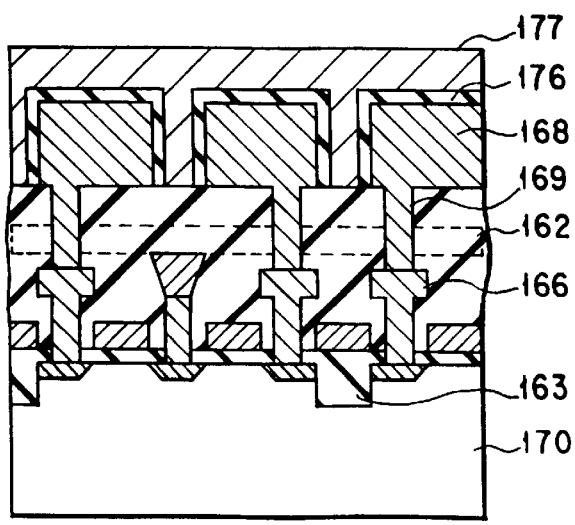
Figure 55B:
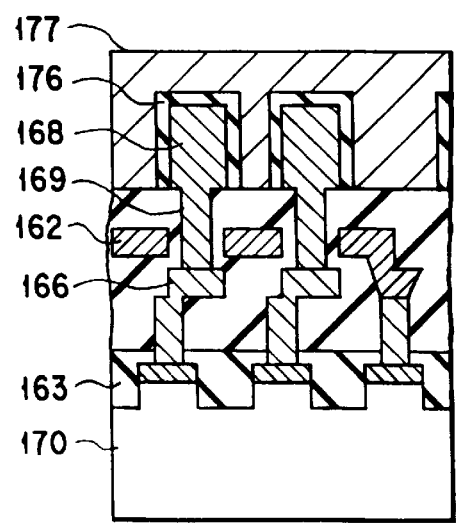

After this, as shown in FIGS. 53A and 53B, second storage node contact holes 169 are formed, and as shown in FIGS. 54A and 54B, storage electrodes (for example, polysilicon or platinum) 168 are deposited and processed by RIE. Then, as shown in FIGS. 55A and 55B, capacitor insulative films 176 are deposited and a plate electrode (for example, polysilicon or titanium nitride film) 177 is deposited and processed by RIE or CDE.

Thus, according to this embodiment, a stack type memory cell of bit line pre-forming type in which the bit lines are formed in a single-layered form can be realized by deviating the lead electrodes 166 in one direction of the word line direction with respect to the active regions 164, deviating the bit lines 162 in a direction opposite to the deviating direction of the lead electrodes 166, and connecting the storage node contacts 169 to the lead electrodes 166 via portions between the bit lines.

FIGS. 56A and 56B are cross sectional views showing the element structure according to another embodiment, FIG. 56A shows the cross section in the bit line direction, and FIG. 56B shows the cross section in the word line direction. Portions which are the same as those of FIGS. 47A and 47B are denoted by the same reference numerals and the detail explanation therefor is omitted.

This embodiment is an example in which the buried electrodes 166a formed under the bit line contacts 167 in the embodiment of FIGS. 46A and 46B are omitted. Even with this structure, the same effect as that of the embodiment of FIGS. 46A and 46B can be attained.

FIGS. 57A and 57B are cross sectional views showing the element structure according to another embodiment, FIG. 57A shows the cross section in the bit line direction, and FIG. 57B shows the cross section in the word line direction. Portions which are the same as those of FIGS. 47A and 47B are denoted by the same reference numerals and the detail explanation therefor is omitted.

This embodiment is an example in which a side wall 178 of insulative film (for example, silicon nitride film) is formed on the side wall of the bit line contact 167. With this structure, the same effect as that of the embodiment of FIGS. 46A and 46B can be attained and the effect that the short circuit between the lead electrode 166 and the bit line 162 can be stably prevented can be attained.

FIGS. 58A and 58B are cross sectional views showing the element structure according to another embodiment, FIG. 58A shows the cross section in the bit line direction, and FIG. 58B shows the cross section in the word line direction. Portions which are the same as those of FIGS. 47A and 47B are denoted by the same reference numerals and the detail explanation therefor is omitted.

This embodiment is an example in which electrode materials 179 (for example, polysilicon films) are buried in the storage node contacts. In this example, even if material for the storage electrodes 168 can be deposited only by sputtering when a film of ferro-electric material (for example, strontium titanate) is used to form capacitor insulative films, breakage of the electrode at the stepped portion can be prevented by use of the electrode material in the contact hole.

FIGS. 59A and 59D are cross sectional views showing the element structure according to another embodiment, FIG. 59A shows the cross section in the bit line direction, and FIG. 59B shows the cross section in the word line direction. Portions which are the same as those of FIGS. 47A and 47B are denoted by the same reference numerals and the detail explanation therefor is omitted.

This embodiment is an example in which a device is formed on a thin film SOI and shows a silicon substrate 170, an insulative film 171 formed on the substrate, and silicon crystal layers 172. In this example, the cut-off characteristic of the transistor can be improved, the soft error can be reduced, and the pause characteristic can be improved.

FIGS. 60A and 60B are plan views showing the pattern arrangement of another embodiment, FIG. 60A shows the state set before SN polysilicon is formed and FIG. 60B shows the state set after SN polysilicon is formed. Portions which are the same as those of FIGS. 46A and 46B are denoted by the same reference numerals and the detail explanation therefor is omitted.

This embodiment is an example in which the bit lines 162 are not deviated and only the lead electrodes 166 are deviated towards the bit line contact 167 side of the adjacent cells.

FIGS. 61A and 61B are cross sectional views taken along the A–A' and B–B' lines of FIGS. 60A and 60B. Each of the lead electrode 166 is lead out in the bit line contact direction of the adjacent cell to extend to a portion between the bit lines. Each storage node electrode 169 passes through between the bit lines and is connected to a corresponding lead electrode 166. With this structure, the same effect as that of the embodiment of FIGS. 46A and 463 can be attained.

FIGS. 62A and 62D are cross sectional views showing the element structure according to another embodiment, FIG. 62A shows the cross section in the bit line direction, and FIG. 62B shows the cross section in the word line direction. Portions which are the same as those of FIGS. 61A and 61B are denoted by the same reference numerals and the detail explanation therefor is omitted.

This embodiment is an example in which a side wall 174 of insulative film (for example, silicon nitride film) is formed in the bit line contact portion. In this case, the effect that the short circuit between the lead electrode 166 and the bit line 162 can be stably prevented can be attained.

FIGS. 63A and 63B are cross sectional views showing the element structure according to another embodiment, FIG. 63A shows the cross section in the bit line direction, and FIG. 63B shows the cross section in the word line direction. Portions which are the same as those of FIGS. 61A and 61B are denoted by the same reference numerals and the detail explanation therefor is omitted.

This embodiment is an example in which the lead electrode 166 is formed in the contact portion by the filling process and the number of steps is reduced by is the step of formation of the lead electrode 166.

Figure 64A:
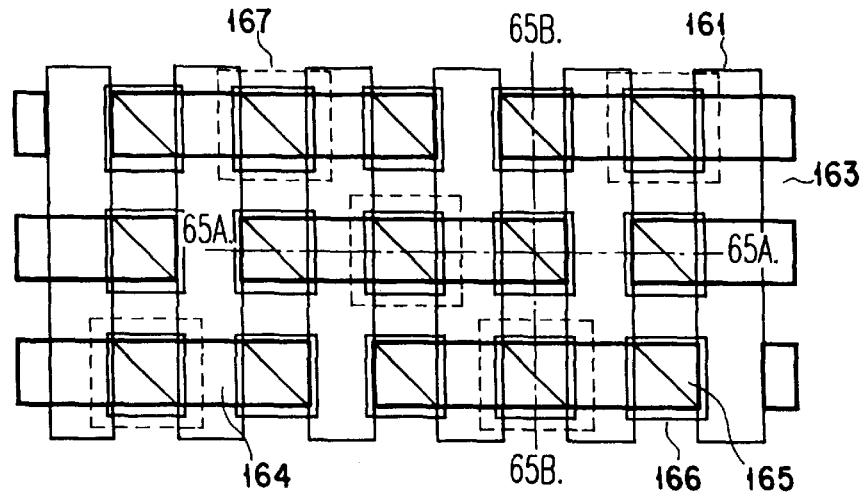
FIGS. 64A and 64B are plan views showing the pattern arrangement of a DRAM according to another embodiment.
Figure 64B:
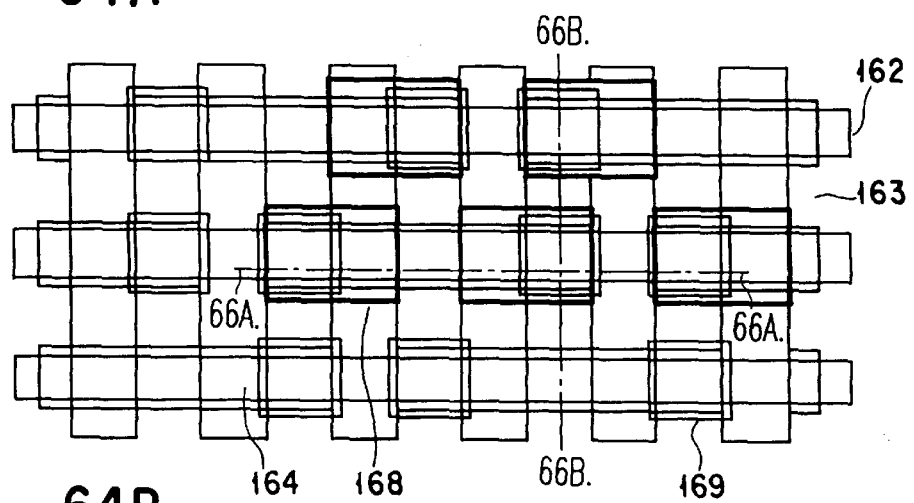

FIGS. 64A and 64B are plan views showing the pattern arrangement of a DRAM according to another embodiment, FIG. 64A shows the state set before SN polysilicon layers are formed and FIG. 64B shows the state set after the SN polysilicon layers are formed. Portions which are the same as those of FIGS. 46A and 46B are denoted by the same reference numerals and the detail explanation therefor is omitted.

Contacts for filling and forming lead electrodes 166 in source and drain portions of transistors are formed, a contact pattern for removing the insulative film on the lead electrode portion is formed on the bit line contact portion, and a pattern of storage node contact is formed on the other lead electrode.

Figures 65A, 65B:
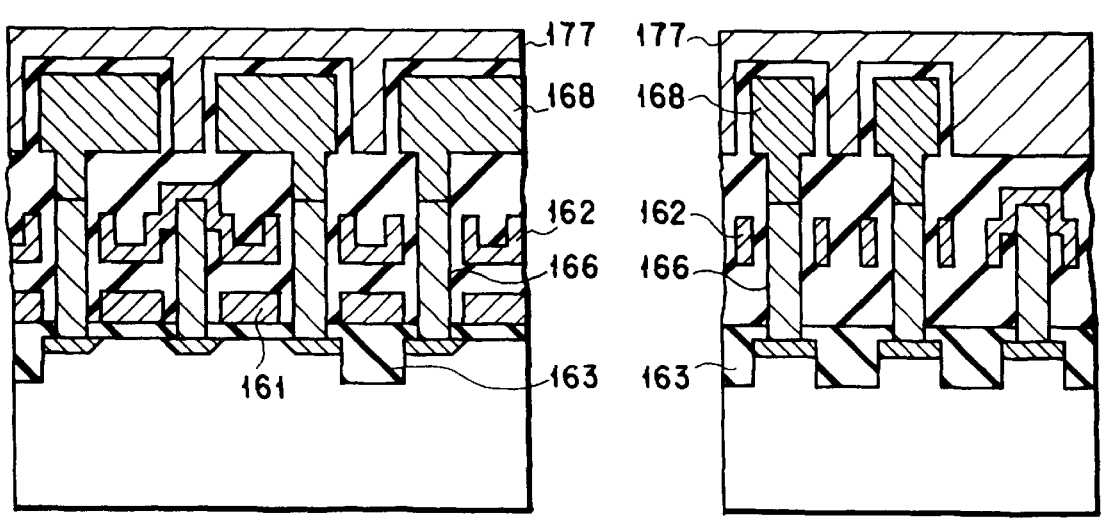
FIGS. 65A and 65B are cross sectional views of the DRAM of FIGS. 64A and 64B taken along the A–A' and B–B' lines.

FIGS. 65A and 65B are cross sectional views taken along the A–A' and B–B' lines of the DRAM of FIGS. 64A and 64B. The lead electrodes 166 are formed to protrude to a position higher than gate electrodes 161 and bit line contacts 167 are formed in contact with the top portions of the lead electrodes 166. In the storage node electrode 169, the bit line 162 is left on the side wall of the lead electrode 166 with an insulative film disposed therebetween and the lead electrode 166 protrudes to a position above the bit line 162, and the storage electrode 168 is connected to the top portion of the lead electrode 166.

FIGS. 66A to 72B are cross sectional views respectively indicating the steps of the manufacturing process, for illustrating the manufacturing method according to this embodiment, and the left-hand portions in FIGS. 66A to 72A show cross sections taken along the A–A' line and the right-hand portions thereof show cross sections taken along the B–B' line.

First, as shown in FIGS. 66A and 66B, contact holes for the lead electrodes 166 are formed after formation of the transistor, then, an electrode material (for example, polysilicon) is deposited, and the electrode material is filled into the contact holes and processed by CDE, RIE or polishing to form the lead electrodes 166. Then, as shown in FIGS. 67A and 67B, the inter-level insulative film is etched back by RIE or $NH_4$ etching, and as shown in FIGS. 68A and 68B, an insulative film 181 is formed by a deposition method such as thermal oxidation or low pressure CVD which is excellent in the step coverage and only those portions of the insulative film which correspond to portions to be connected to the bit lines are removed.

Next, as shown in FIGS. 69A and 69B, a bit line material (for example, tungsten or tungsten polycide film) is deposited and an insulative film is deposited thereon and etched back until the bit line material is exposed to the lead electrode. After this, the buried insulative film is processed by RIE with a bit line pattern to cover the bit line material of the bit line contact with a resist 182, and the bit line 162 is processed by RIE. Then, the bit line material is left on the side wall of the lead electrode 166 in portions other than the bit line contact portion, and thus the bit line 162 connected in a direction to be inter-connected can be formed.

Next, as shown in FIGS. 70A and 70B, storage node contacts 169 are formed after an inter-level insulation film is formed, and then, as shown in FIGS. 71A and 71B, storage electrodes 168 are formed. After this, as shown in FIGS. 72A and 72B, a capacitor insulative film 169 is deposited on the resultant structure and a plate electrode 177 is formed to form a structure shown in FIGS. 64A, 64B, 65A and 65B.

With the above structure, a stack type memory cell of bit line pre-forming type in which the bit lines are formed in a single-layered form like the embodiment of FIGS. 46A and 46B can be realized by forming the bit line 162 as the side wall on the lead electrode 166 with the insulative film disposed therebetween, forming the upper portion of the lead electrode 166 to protrude to a position above the bit line 162, and connecting the storage node contact to the upper portion of lead electrode.

As described above, according to the DRAM structure of this invention, a DRAM having memory cells in which random access can be made and noise is small can be realized with a cell size of $6F^2$ by deviating trenches in the word line direction and bit line direction in the substrate plate type trench cells having the plate formed on the substrate side. Further, the bad influence of the trench on the transfer gate can be prevented without increasing the cell size by deviating the trenches in the through word line.

Further, according to another DRAM structure of this invention, a stack type DRAM memory cell of bit line pre-forming type in which the bit lines are formed in a single-layered form, random access can be made and noise is small can be realized with a cell size of $6F^2$ by deviating the lead electrodes in one direction of the word line direction with respect to the active region, deviating the bit lines in a direction opposite to the deviating direction of the lead electrodes, or forming the lead electrodes to extend in the bit line direction of cells adjacent to each other in the word line direction, or connecting the bit line to the upper portion of the lead electrode in a portion to be connected to the bit line, forming the bit line around the lead electrode as the side wall thereof with an insulative film disposed therebetween in a portion acting as a storage node contact, and forming the lead electrode to protrude to a position above the bit line.

The present invention is not limited to the above-described specific embodiments and may be practiced or embodied in still other ways without departing from the spirit or essential character thereof.

What is claimed is:

1. A semiconductor memory device comprising:

a semiconductor substrate, at least one memory cell region formed on the semiconductor substrate, the memory cell region including a trench capacitor and a MOS transistor having a source and a drain;

at least one bit line formed on the memory cell region;

at least one contact region in contact with the bit line to connect one of the source and drain of the MOS transistor to the bit line;

at least one word line transverse to the bit line;

at least one trench for the trench capacitor formed on the semiconductor substrate, a center of the trench being deviated from a longitudinal center axis of the memory cell region.

2. A semiconductor memory device comprising;

a semiconductor substrate;

a plurality of bit lines formed on the semiconductor substrate;

a plurality of word lines transverse to the bit lines;

a plurality of memory cell regions formed on the semiconductor substrate, the memory cell regions including an array of memory cells each fabricated by a trench capacitor and a MOS transistor having a source and a drain, the memory cell regions selectively being arranged at a plurality of cross points defined between the word lines and the bit lines, every two of the memory cell regions being arranged respectively at two of every adjacent three of the cross points in each of row and column directions along the bit lines and word lines;

a plurality of contact regions each in contact with a respective of the bit lines to connect one of the source and drain of a respective MOS transistor to a corresponding respective of the bit lines;

a plurality of trenches formed on the semiconductor substrate in correspondence with the memory cell regions, each of the trenches for a respective trench capacitor being deviated from a central axis of a corresponding respective of the bit lines.

3. The semiconductor memory device according to claim 2, wherein every two of the trenches which are adjacent in a direction of the bit lines face each other.

4. The semiconductor memory device according to claim 2, wherein every two of the trenches which are adjacent in a direction of the bit lines are deviated from the central axis of the bit line in an opposite direction.

5. The semiconductor memory device according to claim 2, wherein the semiconductor substrate has separation regions for separating the memory cell regions from one another.

6. The semiconductor memory device according to claim 5, wherein the separation regions are formed of field oxidation layers formed by a local oxidation of silicon.

7. The semiconductor memory device according to claim 2, wherein the word lines include through word lines formed over the separation regions between every two of the memory cells.

8. The semiconductor memory device according to claim 2, wherein the memory cell regions are shifted from one another in a direction in which the word lines extend.

9. A semiconductor memory device comprising:

a semiconductor substrate;

a plurality of bit lines formed on the semiconductor substrate;

a plurality of word lines transverse to the bit lines;

a plurality of memory cell regions formed on the semiconductor substrate, the memory cell regions including an array of memory cells each fabricated by a stack capacitor and a MOS transistor having a source and a drain, the memory cell regions selectively being arranged at a plurality of cross points defined between the word lines and the bit lines, every two of the memory cell regions being arranged respectively at two of every adjacent three of the cross points in each of row and column directions along the bit lines arid word lines;

a plurality of contact regions each in contact with a respective of the bit lines to connect one of the source and drain of a respective MOS transistor to a corresponding respective of the bit lines;

a plurality of stack capacitors formed over the semiconductor substrate in correspondence with the memory cell regions, each of the stack capacitors having a lead electrode connected to one of the source and drain of the MOS transistor deviated from a central axis of a corresponding respective of the memory cell regions so that it is arranged between the bit lines, and a storage electrode connected to the lead electrode and extending from between the bit lines.

10. The semiconductor memory device according to claim 9, wherein every two of the stack capacitors adjacent in a direction of the bit lines face to each other.

11. The semiconductor memory device according to claim 9, wherein every two of the stack capacitors adjacent in a direction of the bit lines are deviated from the central axis of the bit line in an opposite direction.

12. The semiconductor memory device according to claim 9, wherein the semiconductor substrate has a separation region for separating the memory cell regions from one another.

13. The semiconductor memory device according to claim 12, wherein the separation region is formed of a field oxidation layer formed by a local oxidation of silicon.

14. The semiconductor memory device according to claim 9, wherein the memory cell regions are shifted from one another in a direction in which the word lines extend.

* * * * *